(12) United States Patent
Watanabe

(10) Patent No.: US 8,563,359 B2
(45) Date of Patent: Oct. 22, 2013

(54) METHOD FOR MANUFACTURING SEMICONDUCTOR DEVICE, AND SEMICONDUCTOR SUBSTRATE

(75) Inventor: Naoyuki Watanabe, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 188 days.

(21) Appl. No.: 13/051,014

(22) Filed: Mar. 18, 2011

(65) Prior Publication Data

US 2011/0304007 A1     Dec. 15, 2011

(30) Foreign Application Priority Data

Jun. 10, 2010   (JP) ................................ 2010-133239

(51) Int. Cl.
*H01L 21/00*     (2006.01)
(52) U.S. Cl.
USPC ............ 438/110; 438/113; 438/114; 257/620
(58) Field of Classification Search
USPC ........................... 438/110, 113, 114; 257/620
See application file for complete search history.

(56) References Cited

U.S. PATENT DOCUMENTS

| | | | |
|---|---|---|---|
| 5,739,546 A * | 4/1998 | Saitou et al. ................... 257/48 |
| 5,817,569 A * | 10/1998 | Brenner et al. ............... 438/460 |
| 6,881,597 B2 * | 4/2005 | Asayama et al. .............. 438/18 |
| 7,265,032 B2 * | 9/2007 | Sharan et al. ................. 438/460 |
| 7,399,682 B2 * | 7/2008 | Yoshikawa et al. .......... 438/463 |
| 7,939,913 B2 * | 5/2011 | Watanabe et al. ............. 257/620 |
| 8,053,337 B2 * | 11/2011 | Noda .............................. 438/462 |
| 8,088,325 B2 * | 1/2012 | Toyota et al. .................. 264/544 |
| 2003/0145940 A1 * | 8/2003 | Chaudhury et al. ......... 156/272.6 |
| 2004/0112880 A1 | 6/2004 | Sekiya |
| 2004/0137702 A1 | 7/2004 | Iijima et al. |
| 2006/0105544 A1 * | 5/2006 | Takanashi et al. ............ 438/460 |
| 2007/0241766 A1 * | 10/2007 | Kamitai et al. ............... 324/763 |
| 2009/0079073 A1 * | 3/2009 | Mizusawa et al. ............ 257/738 |

FOREIGN PATENT DOCUMENTS

| | | |
|---|---|---|
| JP | 9-059765 A | 3/1997 |
| JP | 2004-188475 A | 7/2004 |
| JP | 2004-221286 A | 8/2004 |
| JP | 2005-101181 A | 4/2005 |
| JP | 2005-116844 A | 4/2005 |
| JP | 2006-140311 A | 6/2006 |
| JP | 2008-305551 A | 12/2008 |

OTHER PUBLICATIONS

Satoshi Shibuichi et al.; "Super Water-repellant Surfaces Resulting from Fractal Structure;" http://www.asahi-net.or.jp/~gt6s-sbic/chem/conference/colloid95/index.html.

(Continued)

*Primary Examiner* — Jarrett Stark
*Assistant Examiner* — Nicholas Tobergte
(74) *Attorney, Agent, or Firm* — Westerman, Hattori, Daniels & Adrian, LLP

(57) ABSTRACT

A method for manufacturing a semiconductor device includes forming at least one stripe-shaped protection film over a multilayer film in a scribe region of a semiconductor substrate having a plurality of semiconductor element regions formed therein, the protection film having a thickness larger in a center portion thereof than at an end surface thereof and being made of a member which transmits a laser beam, and removing the multilayer film in the scribe region by irradiating the protection film with a laser beam.

14 Claims, 75 Drawing Sheets

(56) References Cited

OTHER PUBLICATIONS

Eiji Hosono et al.; "To super water repellant surface from the hydrophilic surface by nanostructure control," http://www.aist.go.jp/aist_j_aistinfo/aist_today/vol06_01/pg.26.htmll. W/ English abstract.

Hiroyuki Ueyama; "Plasma System 'TAIKAI'," http://www.jcu-i.com/technical/vol84_01.html. W/ English abstract.

* cited by examiner

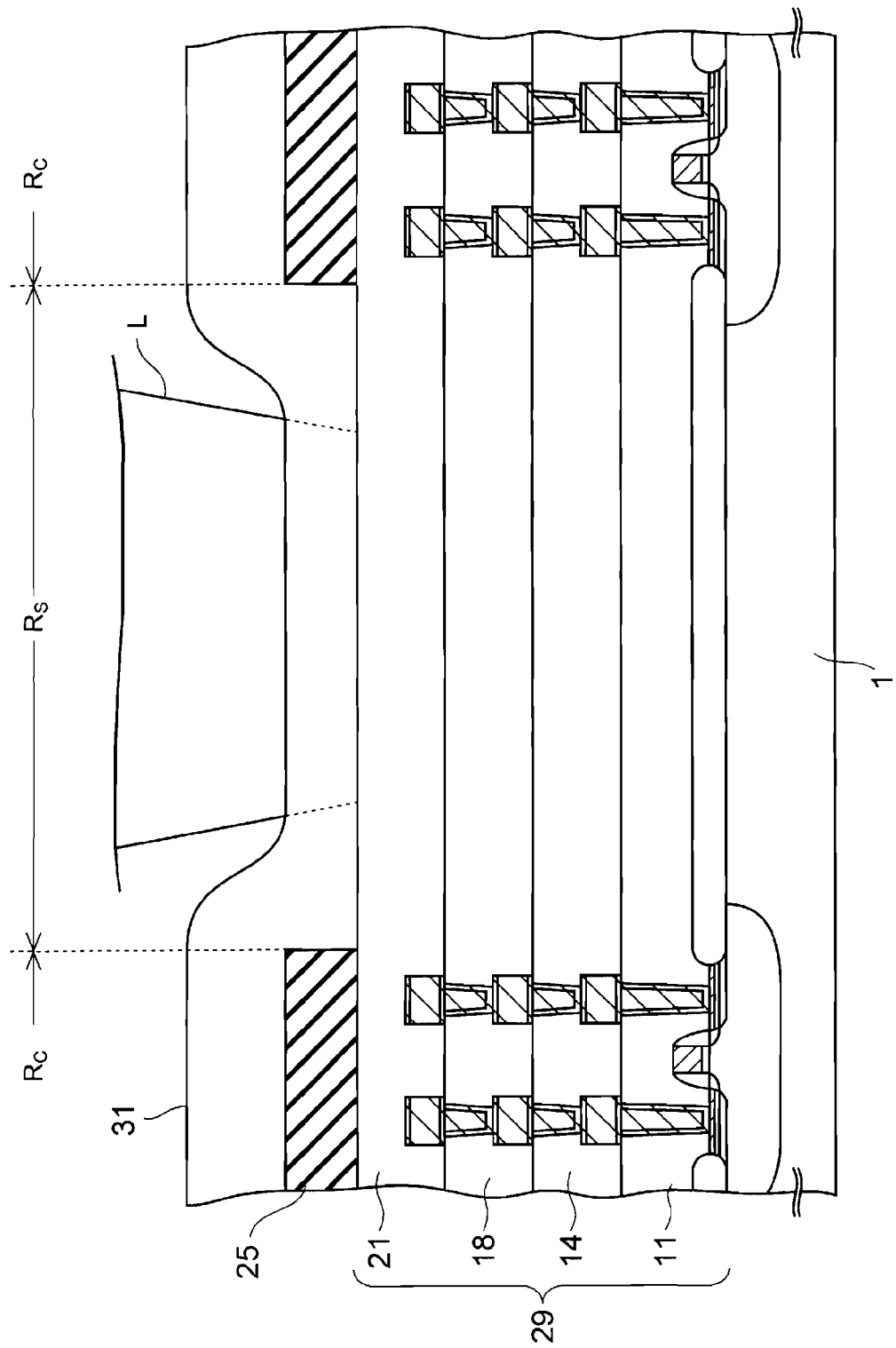

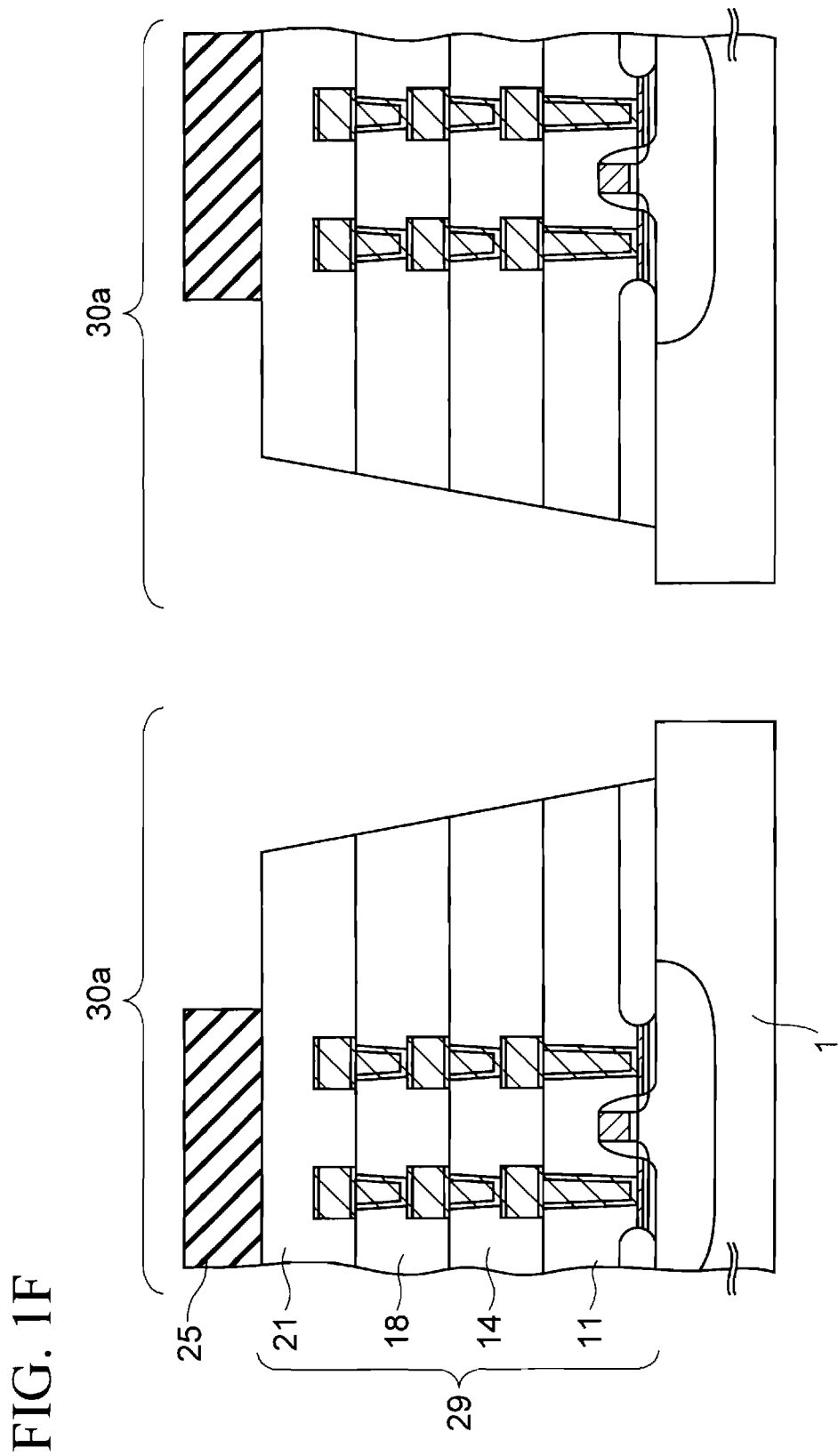

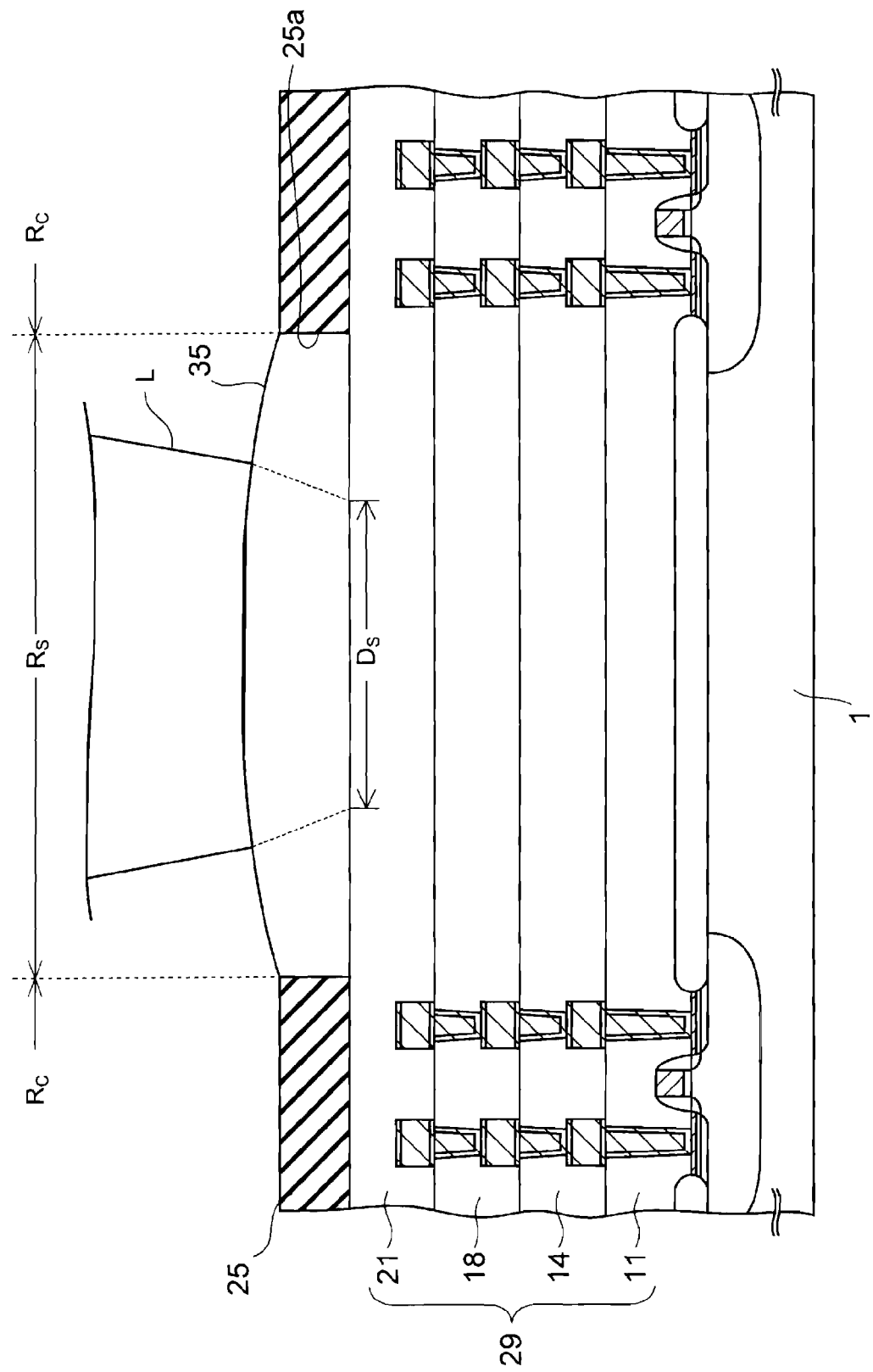

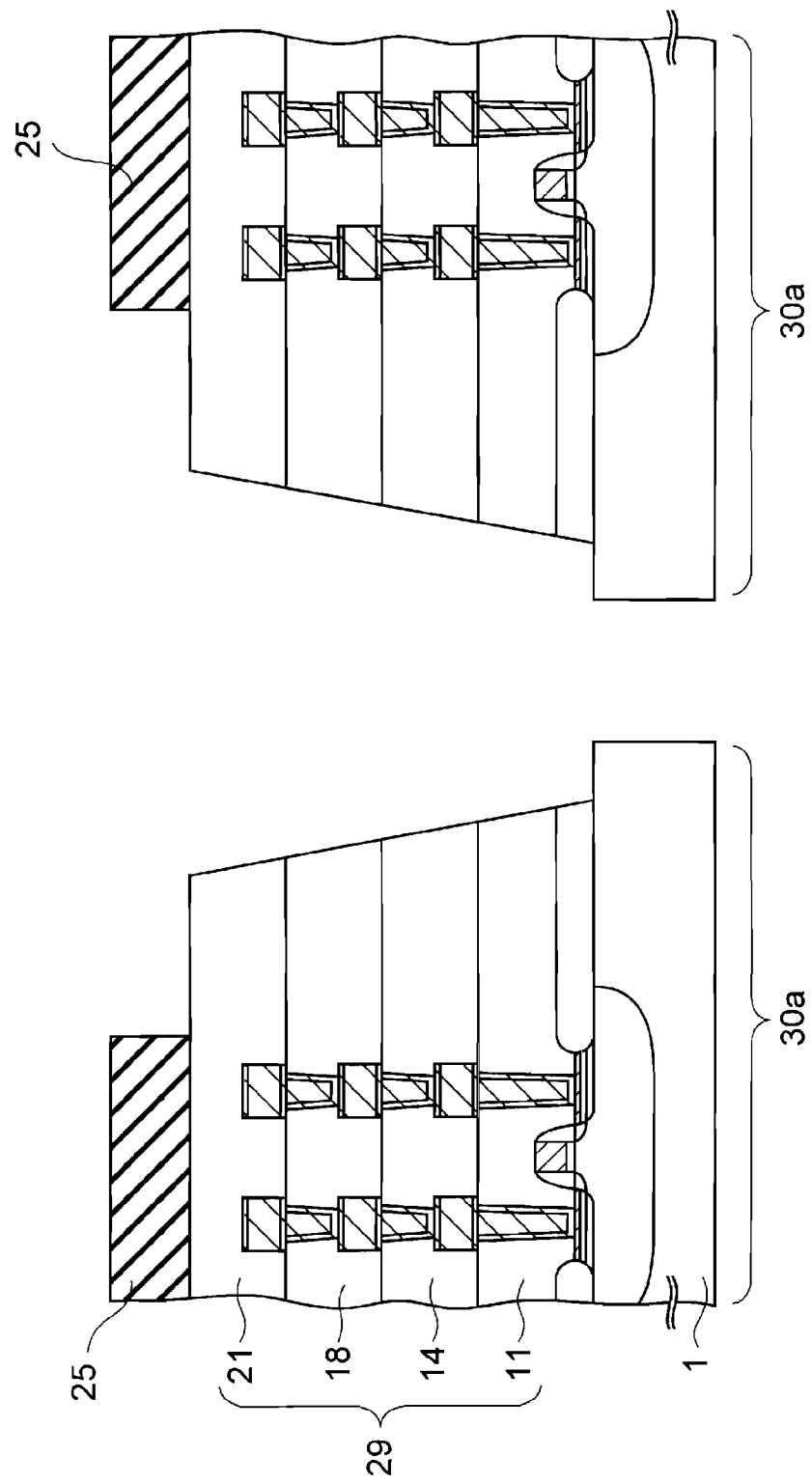

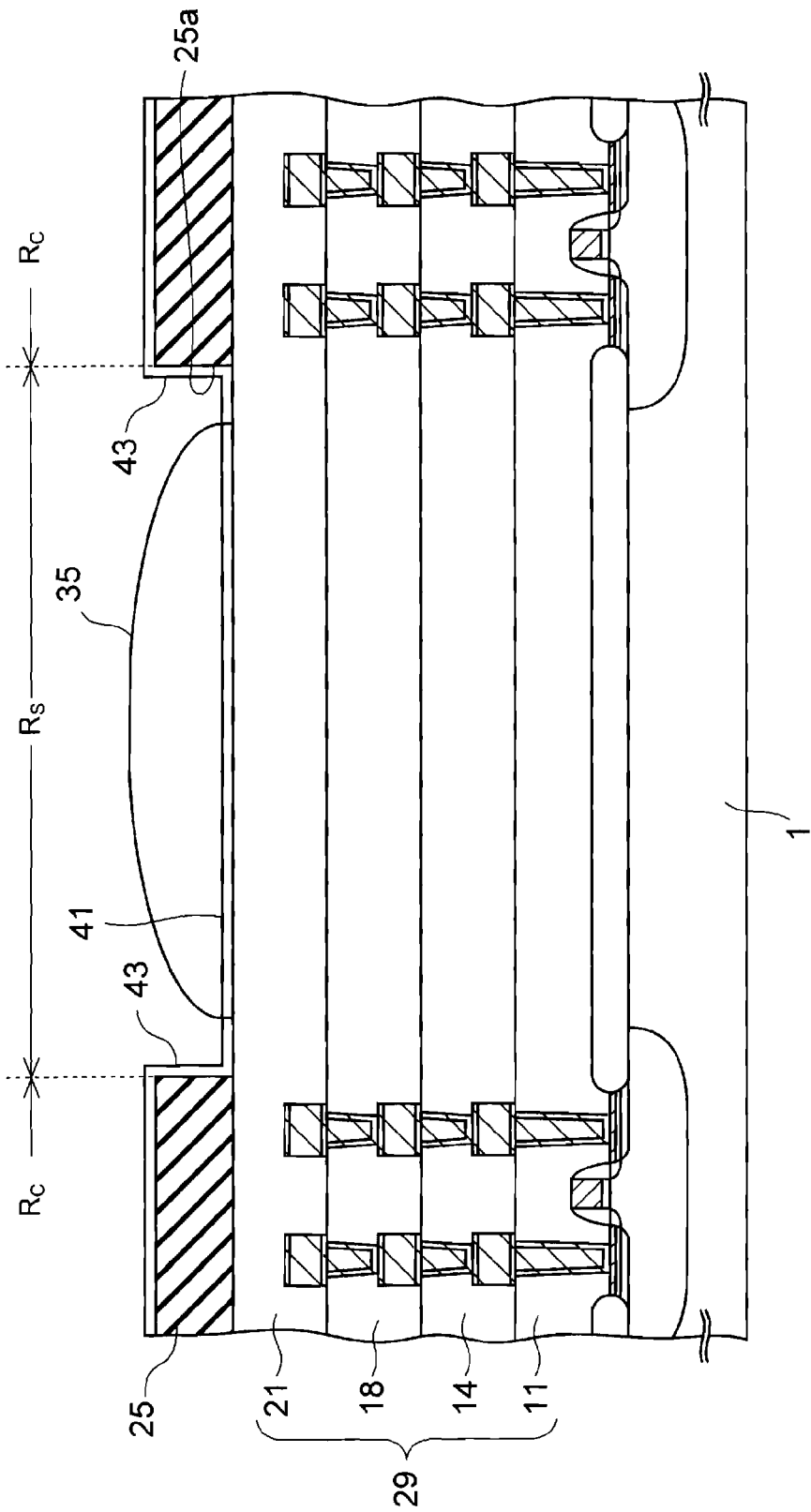

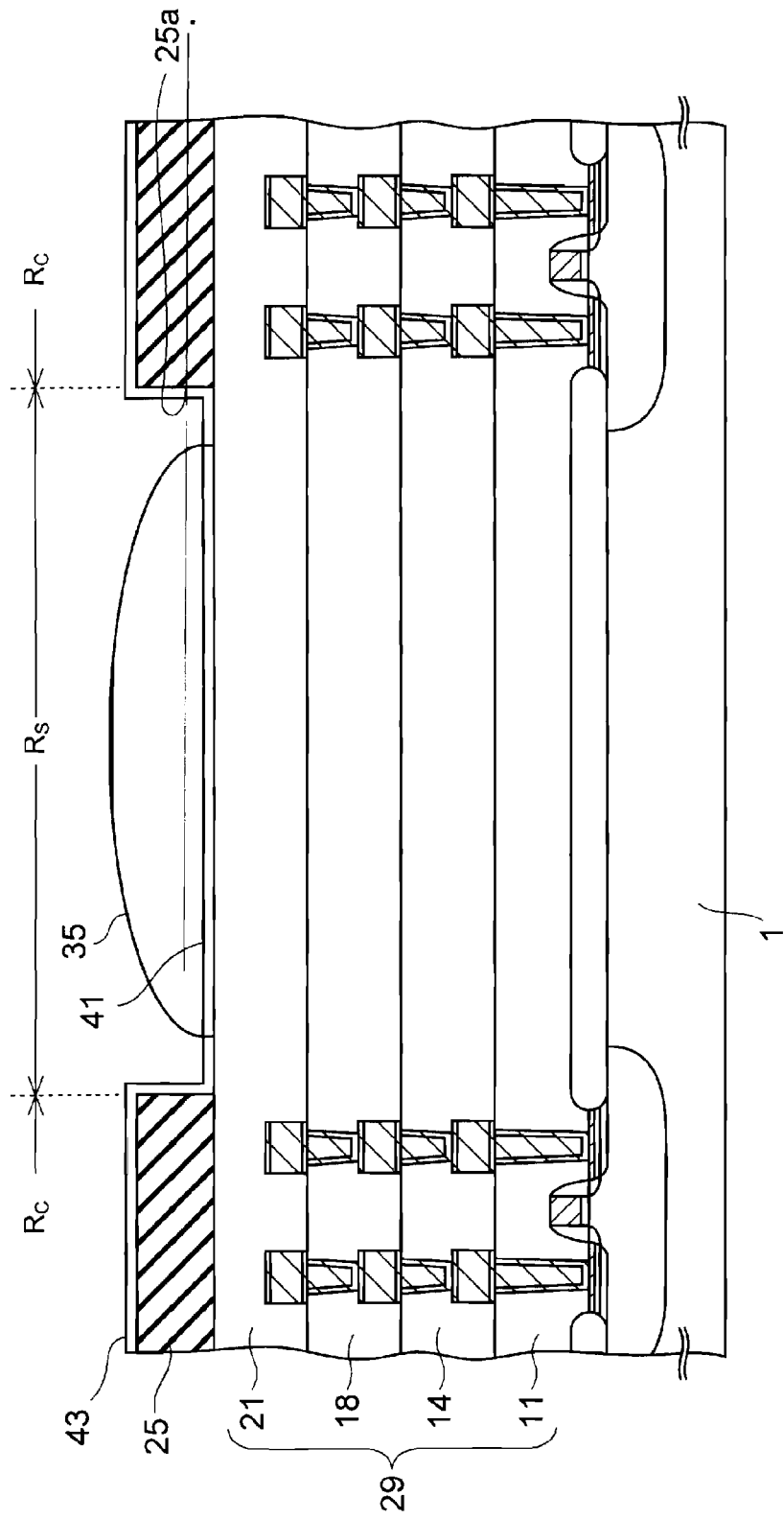

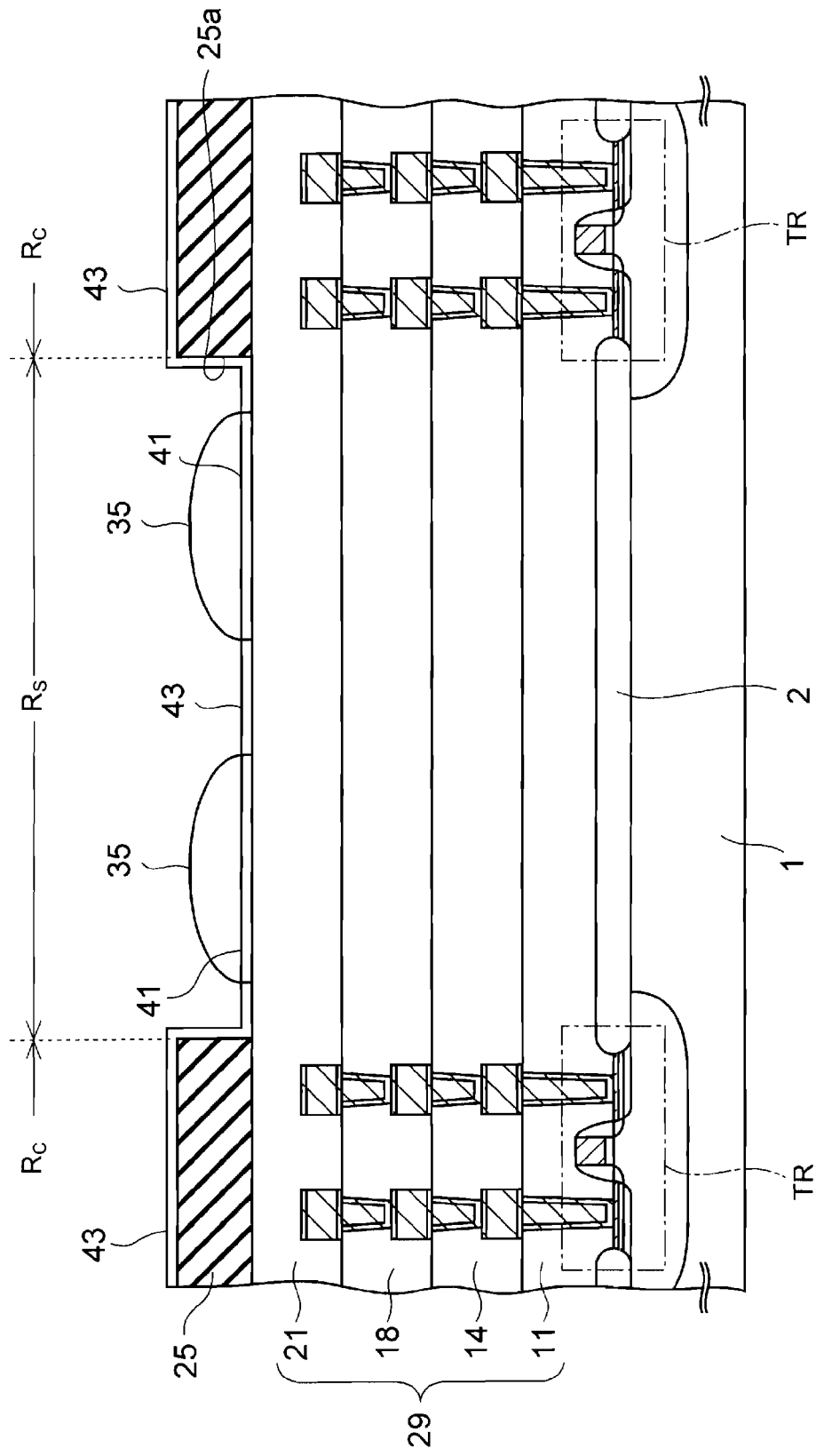

METHOD FOR MANUFACTURING SEMICONDUCTOR DEVICE, AND SEMICONDUCTOR SUBSTRATE

CROSS-REFERENCE TO RELATED APPLICATION

This application is based upon and claims the benefit of priority of the prior Japanese Patent Application No. 2010-133239, filed on Jun. 10, 2010, the entire contents of which are incorporated herein by reference.

FIELD

The embodiments discussed herein are related to a method for manufacturing a semiconductor device, and to a semiconductor substrate.

BACKGROUND

In processes for manufacturing semiconductor devices such as LSIs, a plurality of semiconductor elements are formed in a semiconductor substrate, and then the semiconductor substrate is cut by dicing to thereby divide the semiconductor substrate into individual semiconductor elements.

In conventional methods, the dicing has been carried out by pressing a dicing blade onto the semiconductor substrate along a scribe region thereof. In recent years, a method has been employed in which the dicing is carried out by use of a laser beam.

In either case where the dicing blade or the laser beam is used, it is preferable to reduce failures occurring in the semiconductor elements after the cutting.

Meanwhile, techniques related to the present application are disclosed in Japanese Laid-open Patent Publication Nos. 2004-188475, 2006-140311, 2004-221286, 2005-101181, 2005-116844, 09-59765, and 2008-305551.

Moreover, techniques related to the present application are disclosed in Satoshi Shibuichi, and two others, "Super Water-repellent Surfaces Resulting from Fractal Structure (2)," "To super water repellent surface from the hydrophilic surface by nanostructure control," and "Plasma System" "TAIKAI," as well.

SUMMARY

According to an aspect of the following disclosure, there is provided a method for manufacturing a semiconductor device, including forming a belt-shaped protection film over a multilayer film in a scribe region of a semiconductor substrate having a plurality of semiconductor element regions formed therein, the protection film having a thickness larger in a center portion thereof than at an end surface thereof and being made of a member which transmits a laser beam, and removing the multilayer film in the scribe region by irradiating the protection film with a laser beam.

Further, according to another aspect of the disclosure, there is provided a semiconductor substrate including a plurality of semiconductor element regions formed therein, and a belt-shaped protection film formed over a multilayer film in a scribe region, the protection film having a thickness larger in a center portion thereof than at an end surface thereof and being made of a member which transmits a laser beam.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 1A to 1F are cross-sectional views of semiconductor devices in the course of manufacturing thereof according to a prelude;

FIGS. 6A to 6F are cross-sectional views of semiconductor devices in the course of manufacturing thereof according to a first embodiment;

FIGS. 10A to 10F are cross-sectional views of semiconductor devices in the course of manufacturing thereof according to a third embodiment;

FIGS. 12A to 12D are cross-sectional views of semiconductor devices in the course of manufacturing thereof according to a fifth embodiment;

FIG. 20 is a cross-sectional view of the semiconductor device in the course of manufacturing thereof according to the eighth embodiment, in which hydrophilic thin films and hydrophobic thin films are formed;

DESCRIPTION OF EMBODIMENTS

Before describing embodiments, description will be given of preliminary matters as the base of the embodiments.

A method in which a semiconductor substrate is mechanically cut with a dicing blade has been used for dicing a semiconductor substrate.

However, because an interlayer insulating film appearing on the cut surface is mechanically brittle, the interlayer insulating film is likely to be subject to chipping during the dicing, through which water enters the semiconductor substrate to cause failures of circuits in the semiconductor substrate.

Particularly, the risk of the chipping during dicing is increased in case of a low-dielectric insulating film having a dielectric constant lower than that (approximately 4.2) of a silicon oxide film, because the low-dielectric insulating film is more brittle than the silicon oxide film.

In this respect, a method is conceivable in which the dicing is carried out by using a laser and a dicing blade in combination as follows.

FIGS. 1A to 1F are cross-sectional views of semiconductor devices in the course of manufacturing thereof according to a prelude.

Figure 1A:
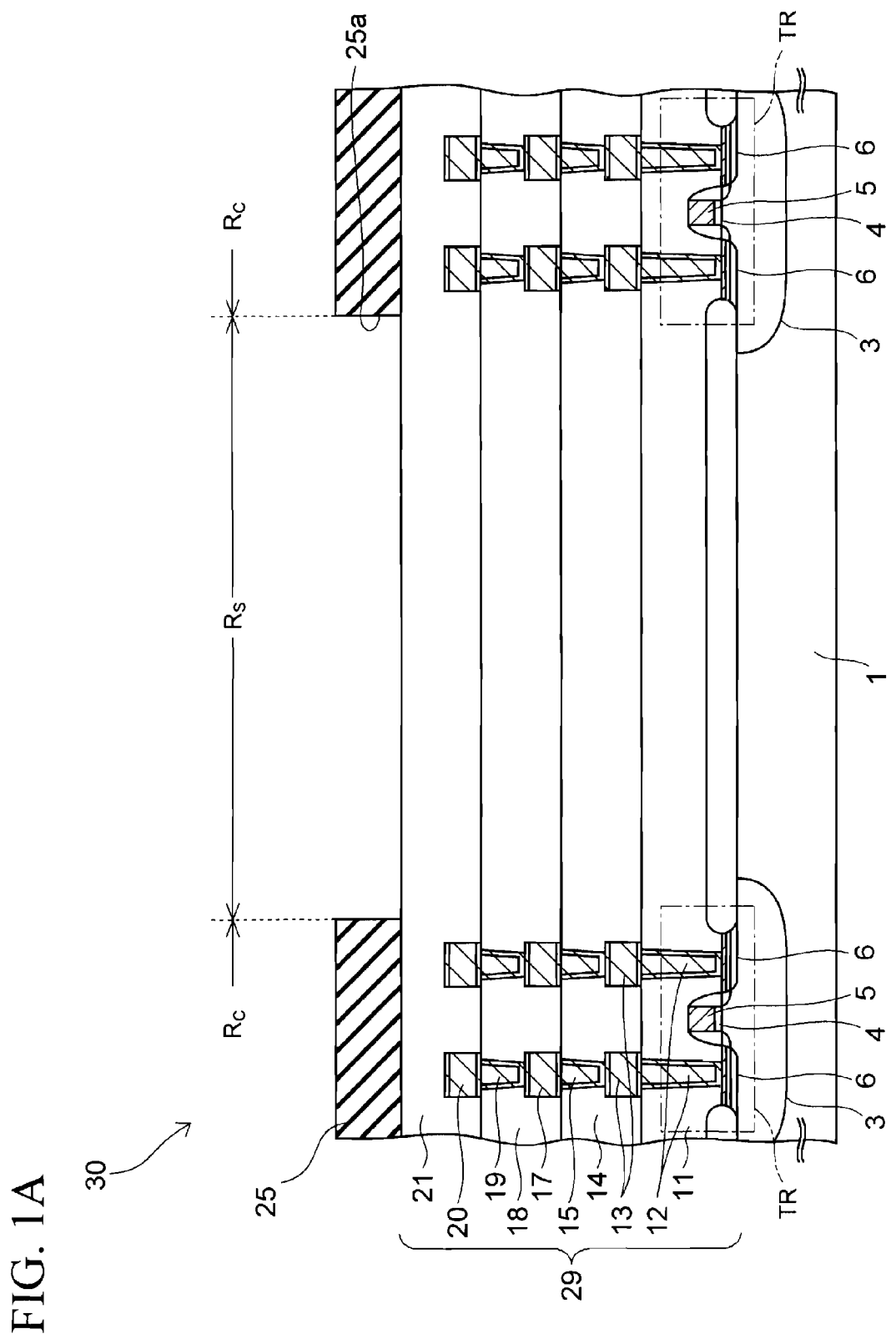

First, a semiconductor substrate 30 to be diced is prepared as illustrated in FIG. 1A.

The semiconductor substrate 30 includes a scribe region $R_s$ and a plurality of semiconductor element regions $R_c$ where semiconductor elements are to be formed.

For fabricating the semiconductor substrate 30, first, a silicon oxide film is formed as an element isolation insulating film 2 on a silicon substrate 1 by the local oxidation of silicon (LOCOS) method. Then, p wells 3 are formed in active regions defined by the element isolation insulating films 2.

Then, a MOS transistor TR including a gate insulating film 4, a gate electrode 5, and n-type source/drain regions 6 is formed in each active region of the silicon substrate 1.

Thereafter, a first interlayer insulating film 11 is formed to cover the MOS transistor TR, and then the first interlayer insulating film 11 is patterned to form contact holes therein. In each contact hole, a first conductive plug 12 made mainly of tungsten is formed.

Next, on both the first interlayer insulating film 11 and the first conductive plugs 12, a first metal wiring 13, a second interlayer insulating film 14, a second metal wiring 17, a third interlayer insulating film 18, a third metal wiring 20, and a fourth interlayer insulating film 21 are formed in this order.

Among them, each of the metal wirings 13, 17, 20 includes an aluminum film, and the upper and lower metal wirings are electrically connected to each other with a second conductive plug 15 or a third conductive plug 19 made mainly of tungsten.

As for the materials of the respective interlayer insulating films 11, 14, 18, and 21, silicon oxide film and low-dielectric insulating film are available. Among them, as for the material of the low-dielectric insulating film, SiOF film, porous silicon oxide film, polyaryl ether film, and the like are available.

Through these steps, a multilayer film 29 including the interlayer insulating films 11, 14, 18, and 21, and the metal wirings 13, 17, and 20 is formed over the silicon substrate 1.

It is followed by forming a polyimide coating film on the multilayer film 29. Then, the polyimide coating film is patterned to form a passivation film 25 having a window 25a in the scribe region $R_s$.

Note that, instead of the polyimide coating film, a silicon oxide film or a silicon nitride film may be formed as the passivation film 25.

Figure 1B:
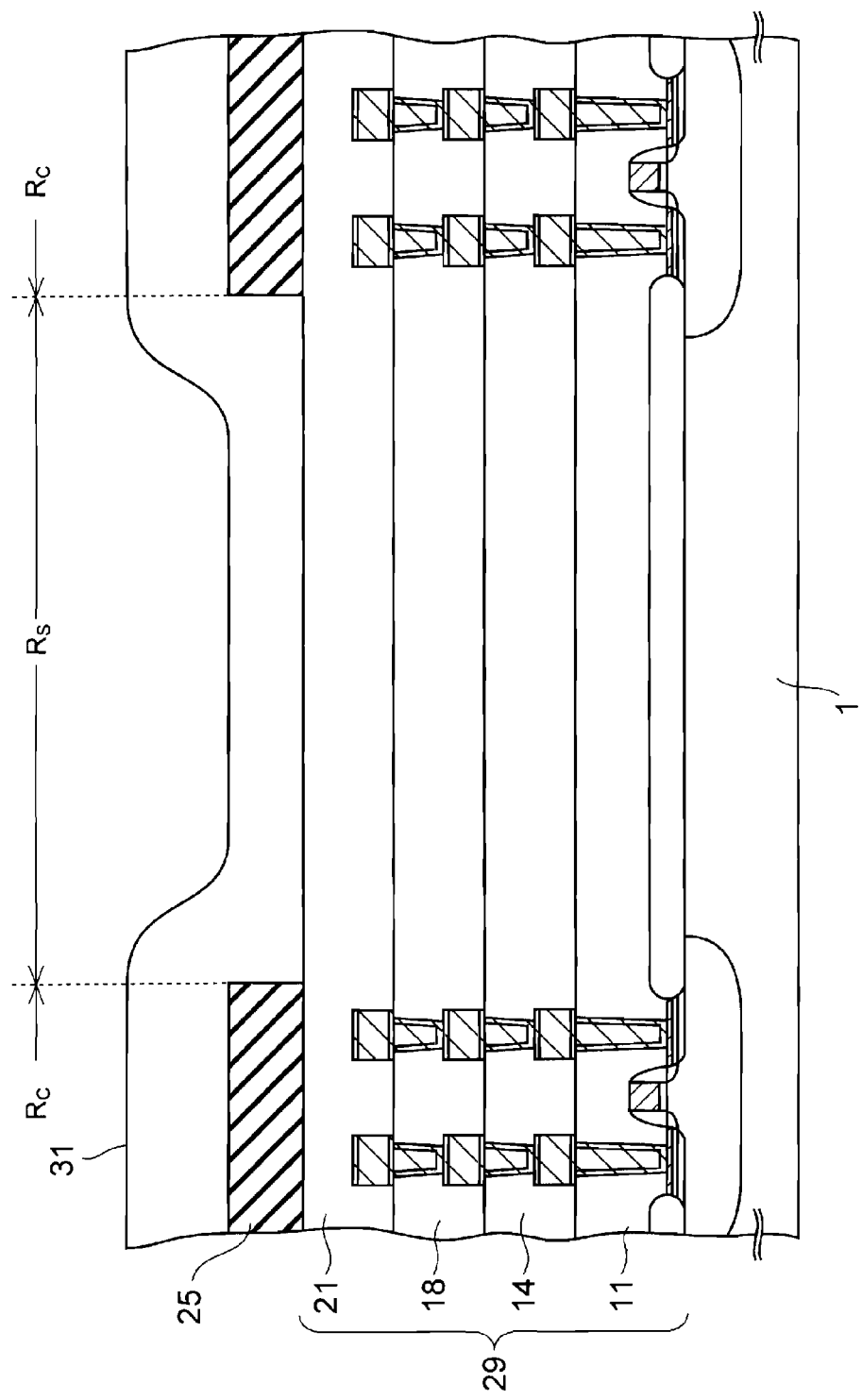

Next, as illustrated in FIG. 1B, a polyvinyl alcohol (PVA) coating film is formed as a protection film 31 on the entire upper surface of the semiconductor substrate 30, and then the protection film 31 is thermally cured.

The protection film 31 has a function to prevent the materials of the multilayer film 29 vaporized due to the heat of the laser from attaching onto the passivation film 25 when the multilayer film 29 is irradiated with laser in a later step.

Then, as illustrated in FIG. 1C, the semiconductor substrate 30 is irradiated with a laser beam L through the protection film 31.

Figure 1D:
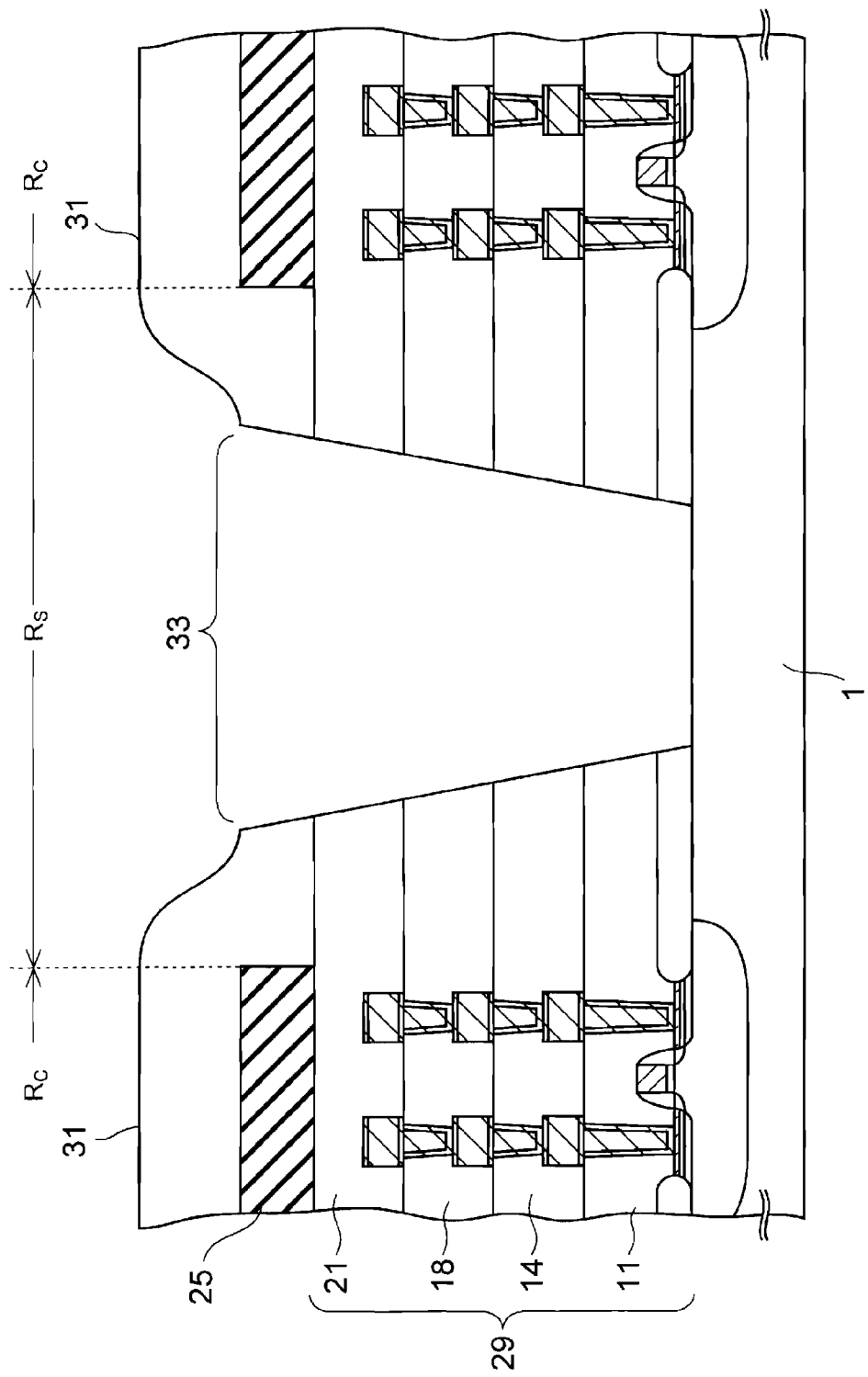

As a result, as illustrated in FIG. 1D, the protection film 31, the multilayer film 29, and the element isolation insulating film 2 are vaporized by the heat of the laser beam L to form a groove 33 through these films. In addition, a surface of the silicone substrate 1 is exposed at the bottom portion of the groove 33.

The step of vaporizing the multilayer film 29 by the laser beam L as described above is also referred to as laser ablation below.

Since the protection film 31 is formed on the semiconductor substrate 30 prior to the laser ablation, it is possible to prevent the decrease of reliability of the passivation film 25, which would be caused when the vaporized material of the multilayer film 29 is attached onto the passivation film 25.

Figure 1E:
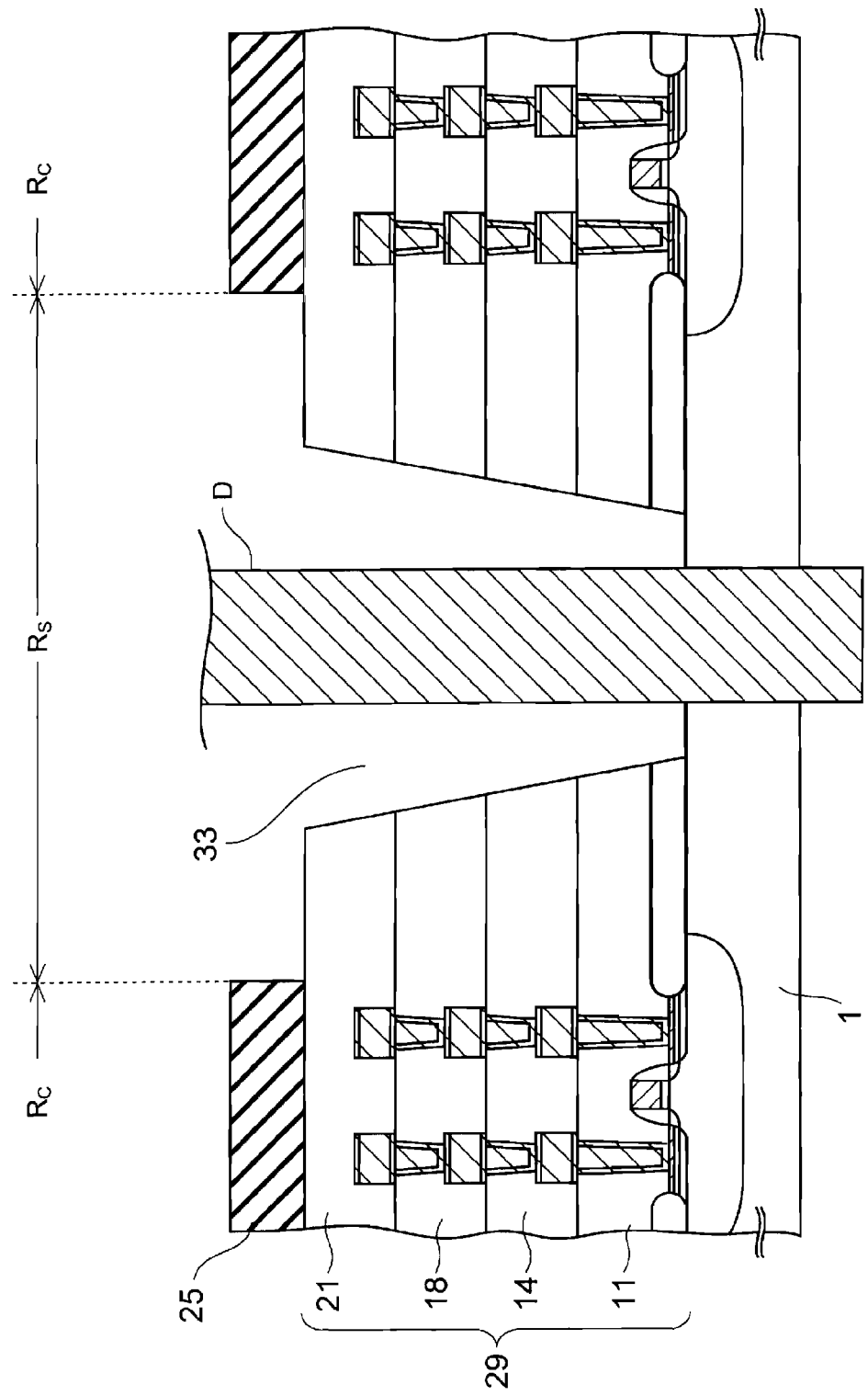

Next, as illustrated in FIG. 1E, a dicing blade D is pressed onto the silicon substrate 1 exposed in the scribe region $R_s$ by the laser dicing, and the silicon substrate 1 in the scribe region $R_s$ is mechanically cut.

As described above, since the multilayer film 29 in the scribe region $R_s$ is removed in advance by the laser ablation, it is possible in this step to prevent the dicing blade D from coming into contact with the multilayer film 29. This makes it possible to reduce the risk of the chipping of the multilayer film 29 due to its contact with the dicing blade D.

As the dicing as described above is completed, the semiconductor substrate 30 is divided into individual semiconductor elements 30a as illustrated in FIG. 1F. This is the end of fundamental steps of this example.

In the example described above, since the multilayer film 29 in the scribe region $R_s$ is removed by the laser ablation (FIG. 1D) prior to the dicing (FIG. 1E) using the dicing blade D, it is possible to reduce the occurrence of the chipping in the multilayer film 29 due to the contact with the dicing blade D.

This method, however, has the following problem.

Figure 2:
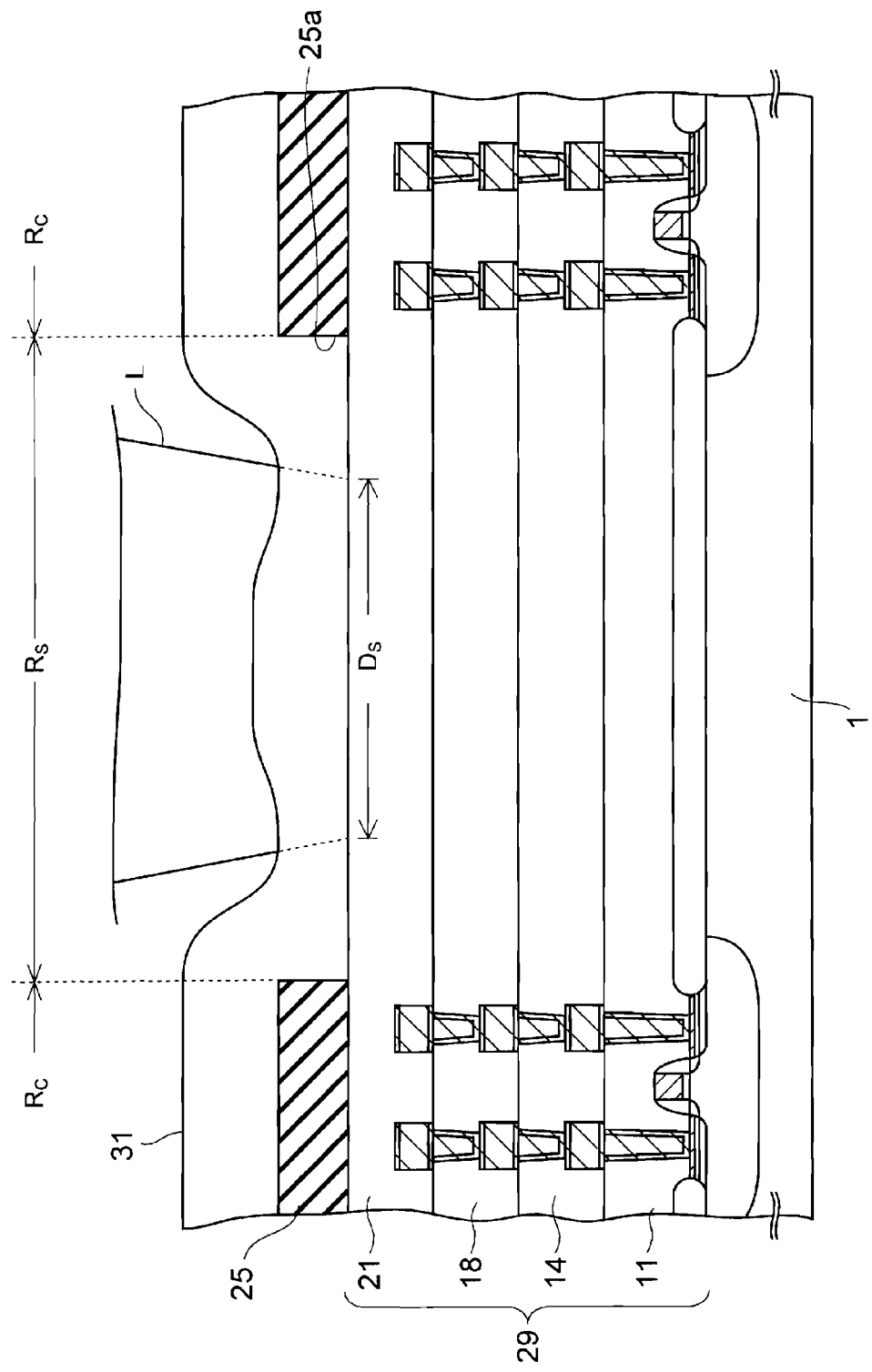
FIG. 2 is a cross-sectional view for describing a problem of a method for manufacturing a semiconductor device according to the prelude.

FIG. 2 is a cross-sectional view for describing the problem.

As described above, the protection film 31 has the function to prevent the materials vaporized by the laser beam L from reattaching onto the passivation film 25. Since the top surface of the protection film 31 has a shape conforming to underlying concavities and convexities, undulations as illustrated in FIG. 2 may occur therein.

When the protection film 31 in this state is irradiated with the laser beam L, the undulations of the top surface of the protection film 31 function like lenses, so that a spot diameter $D_s$ of the laser beam L varies depending on the position on the surface of the multilayer film 29.

Figure 3:
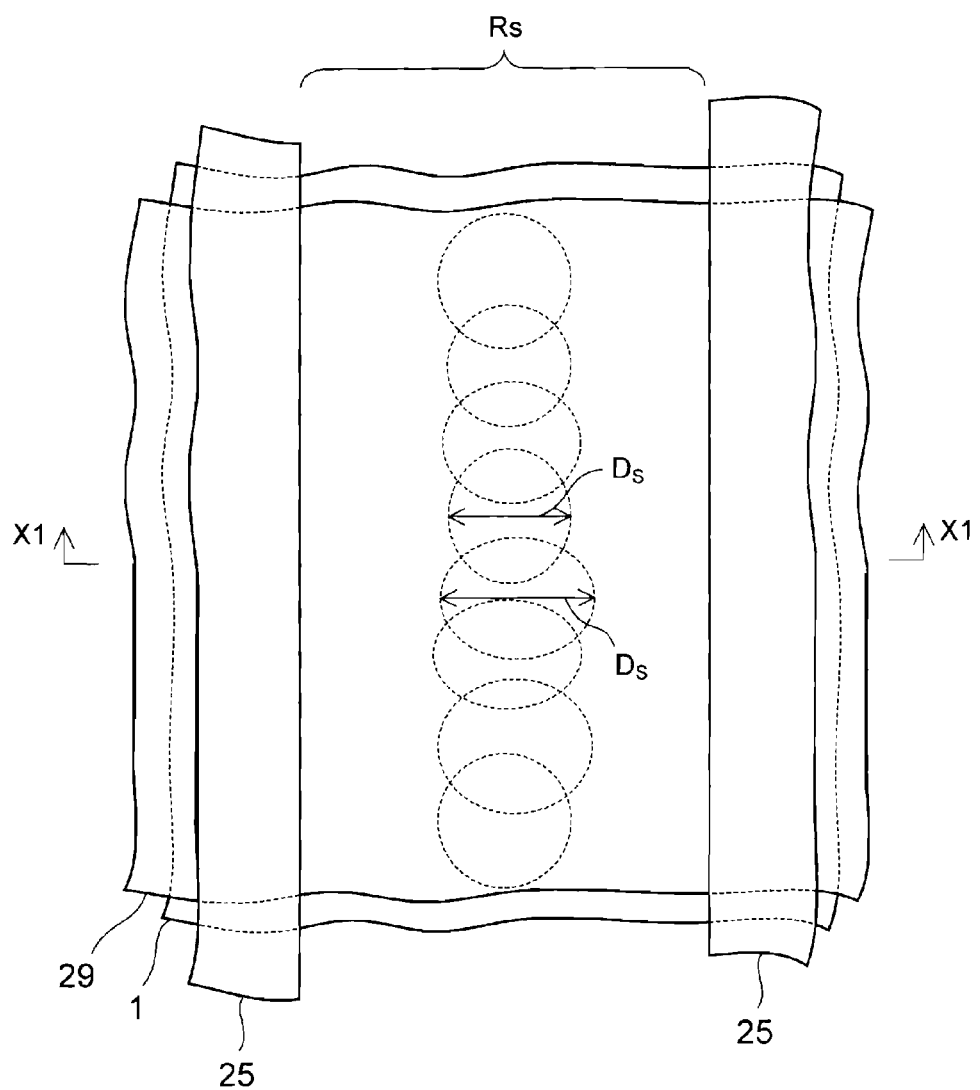
FIG. 3 is a plan view illustrating the fact that the spot diameter of laser varies in the method for manufacturing a semiconductor device according to the prelude.

FIG. 3 is a plan view illustrating such variation in the spot diameter $D_s$, and FIG. 2 mentioned above corresponds to a cross-section taken along the line X1-X1 of FIG. 3.

As illustrated in FIG. 3, during the laser dicing in which the scribe region $R_s$ is irradiated with the spot-shaped laser beam L, the spot diameter $D_s$ of the laser beam L varies depending on the position in the scribe region $R_s$.

Figure 4:
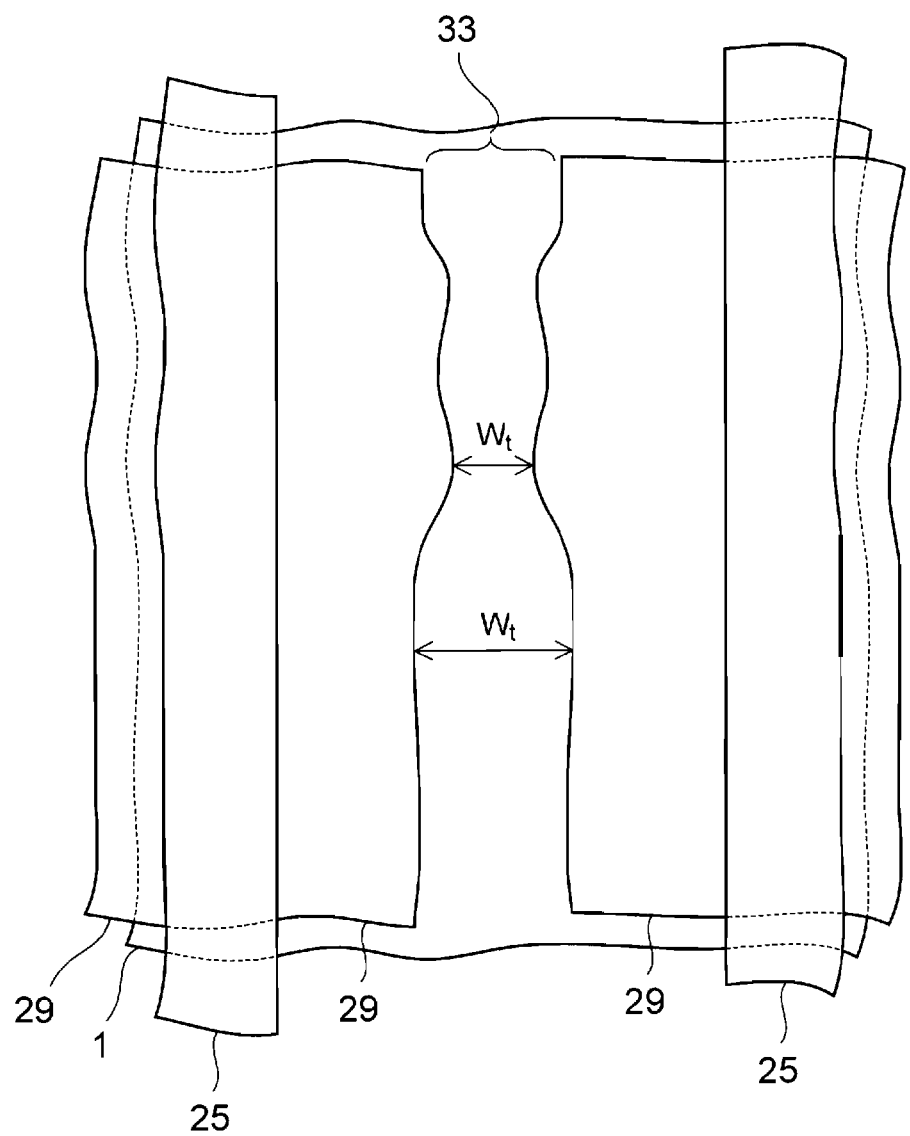
FIG. 4 is a cross-sectional view when forming a groove in a multilayer film by laser in the method for manufacturing a semiconductor device according to the prelude.

FIG. 4 is a plan view after the multilayer film 29 is vaporized by the irradiation with the laser beam L as illustrated in FIG. 3.

When the spot diameter $D_s$ varies as described above, a width $W_t$ of the groove 33 formed through the interlayer insulating films by the irradiation with the laser beam L also varies depending on the position.

Figure 5:
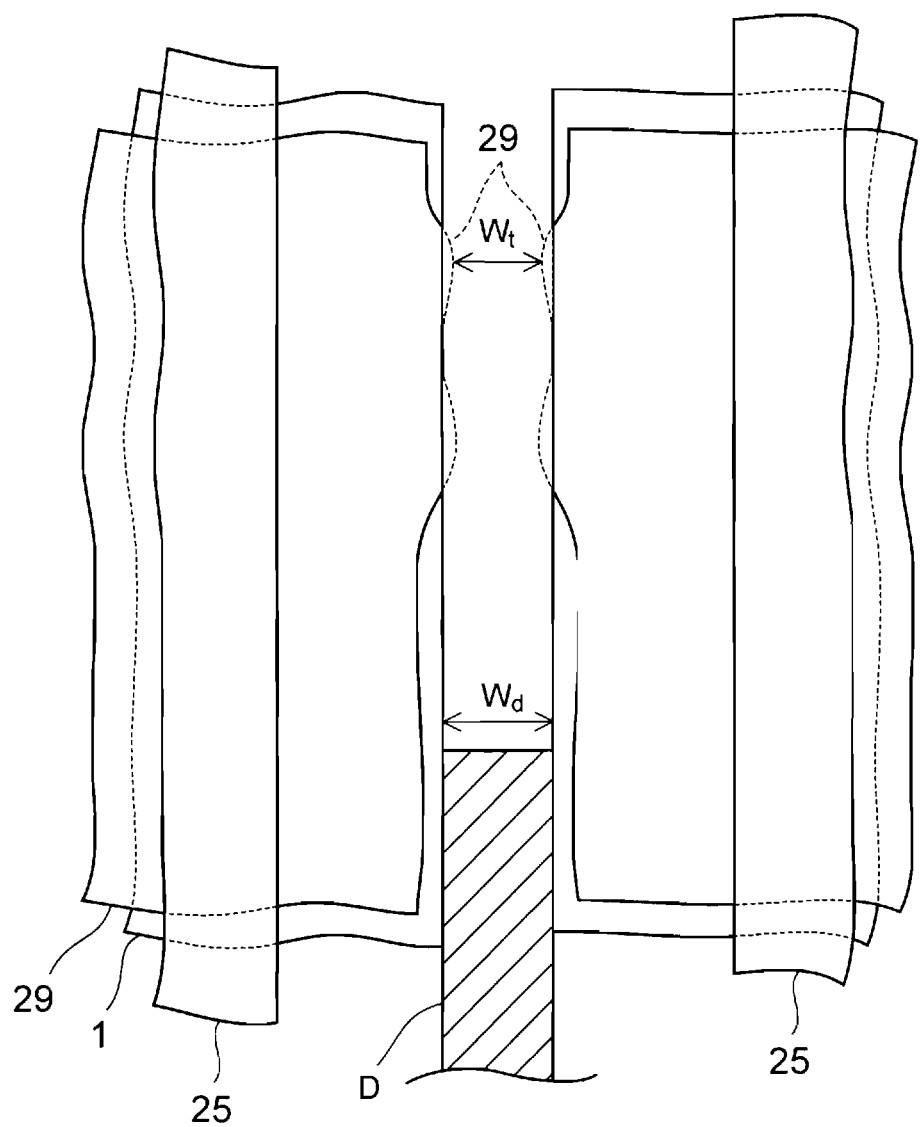
FIG. 5 is a plan view for describing dicing using a dicing blade in the method for manufacturing a semiconductor device according to the prelude.

FIG. 5 is a plan view illustrating the dicing carried out by use of the dicing blade D after the formation of the groove 33.

Since the width $W_t$ of the groove 33 varies, the width $W_t$ can be smaller at some positions in the scribe region $R_s$ than the width $W_d$ of the dicing blade D. At these positions, the dicing blade D come into contact with the multilayer film 29.

This causes chipping in the multilayer film at the positions where the dicing blade D contacts the multilayer film 29. This leads to the risk that the interlayer insulating films 11, 14, 18, 21 of the multilayer film 29 may be peeled off.

Note that it is conceivable to increase the spot diameter $D_s$ in order to prevent the contact between the dicing blade D and the multilayer film 29.

However, if the spot diameter $D_s$ is made larger than the width of the scribe region $R_s$, the passivation film 25 may be damaged by the laser beam L. For this reason, there is some limitation in the increase of the spot diameter $D_s$.

In view of such finding, the inventors of the present application have reached the embodiments to be described below.

First Embodiment

FIG. 6A to 6F are cross-sectional views of semiconductor devices in the course of manufacturing thereof according to the embodiment. FIGS. 7A to 7E are plan views of the semiconductor device.

Note that, in these drawings, elements which are the same as those described in the prelude are denoted by the same reference numerals as those in the prelude, and description thereof is omitted below.

Figure 6A:
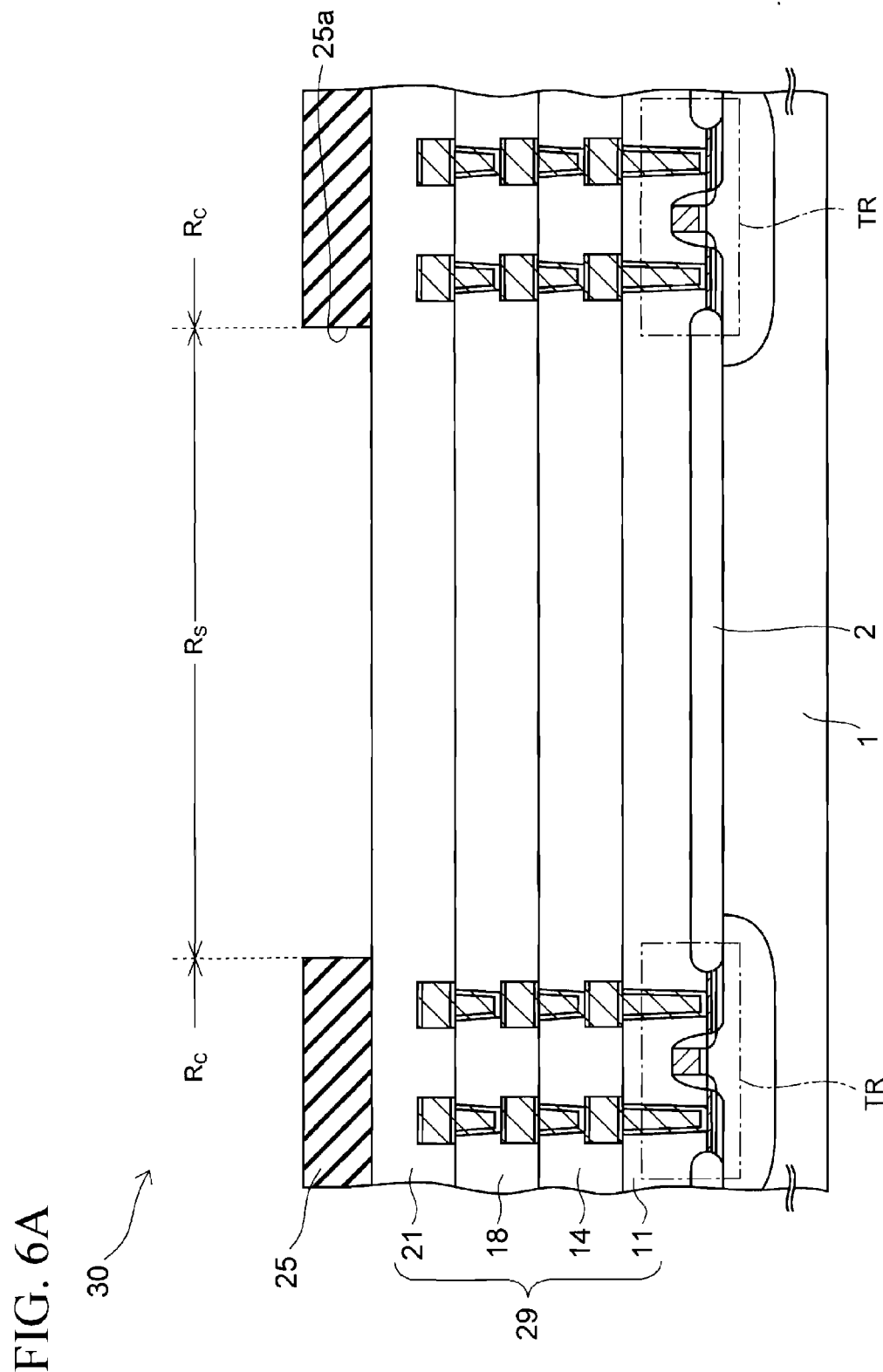

First, as illustrated in FIG. 6A, the semiconductor substrate 30 is prepared in which has the passivation film 25 formed at the uppermost layer. The passivation film 25 includes the window 25a in the scribe region $R_s$, through which the multilayer film 29 is exposed.

Figure 7A:
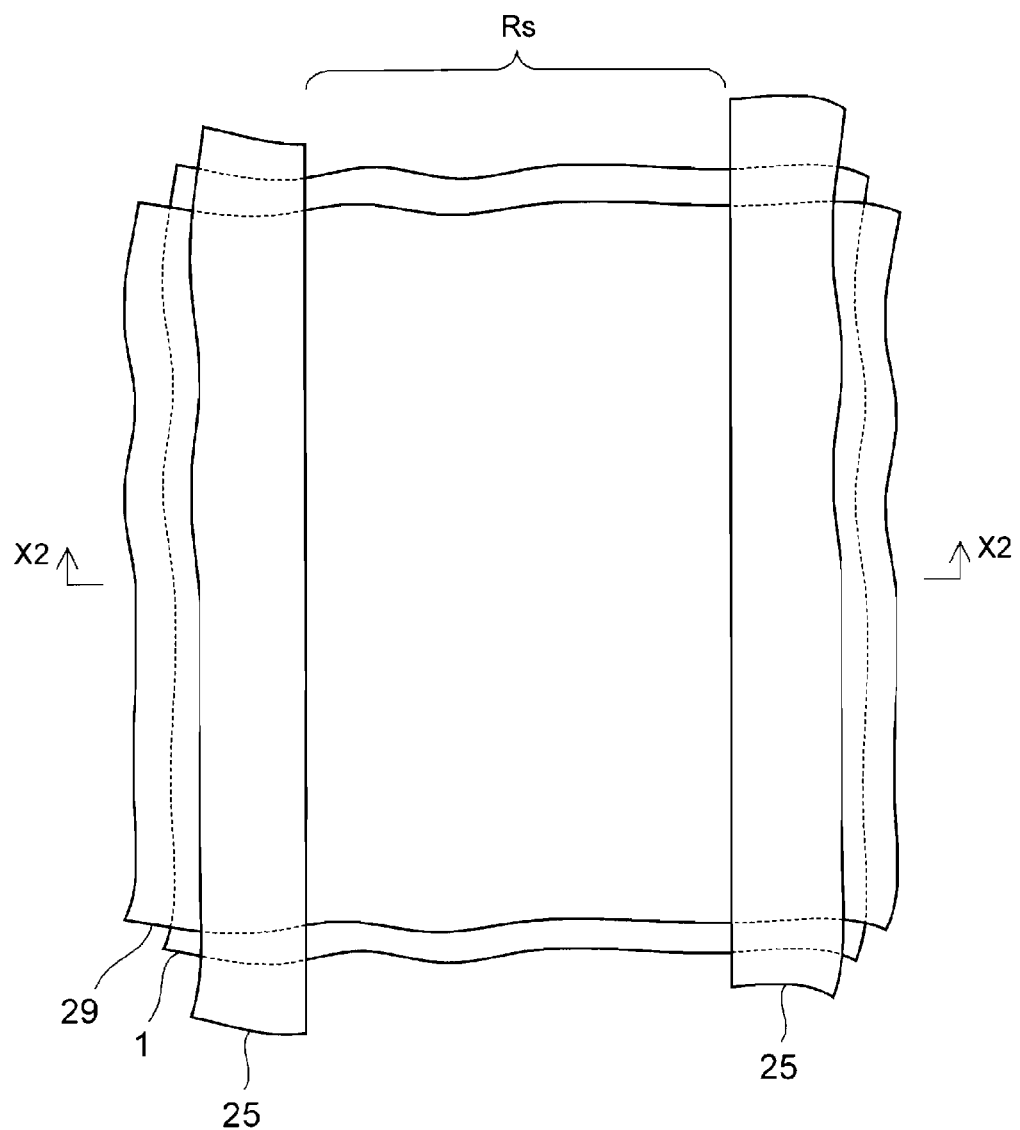
FIGS. 7A to 7E are plan views of the semiconductor devices in the course of manufacturing thereof according to the first embodiment.

FIG. 7A is a plan view of the semiconductor substrate 30, and FIG. 6A mentioned above corresponds to a cross section taken along the line X2-X2 of FIG. 7A.

Figure 6B:
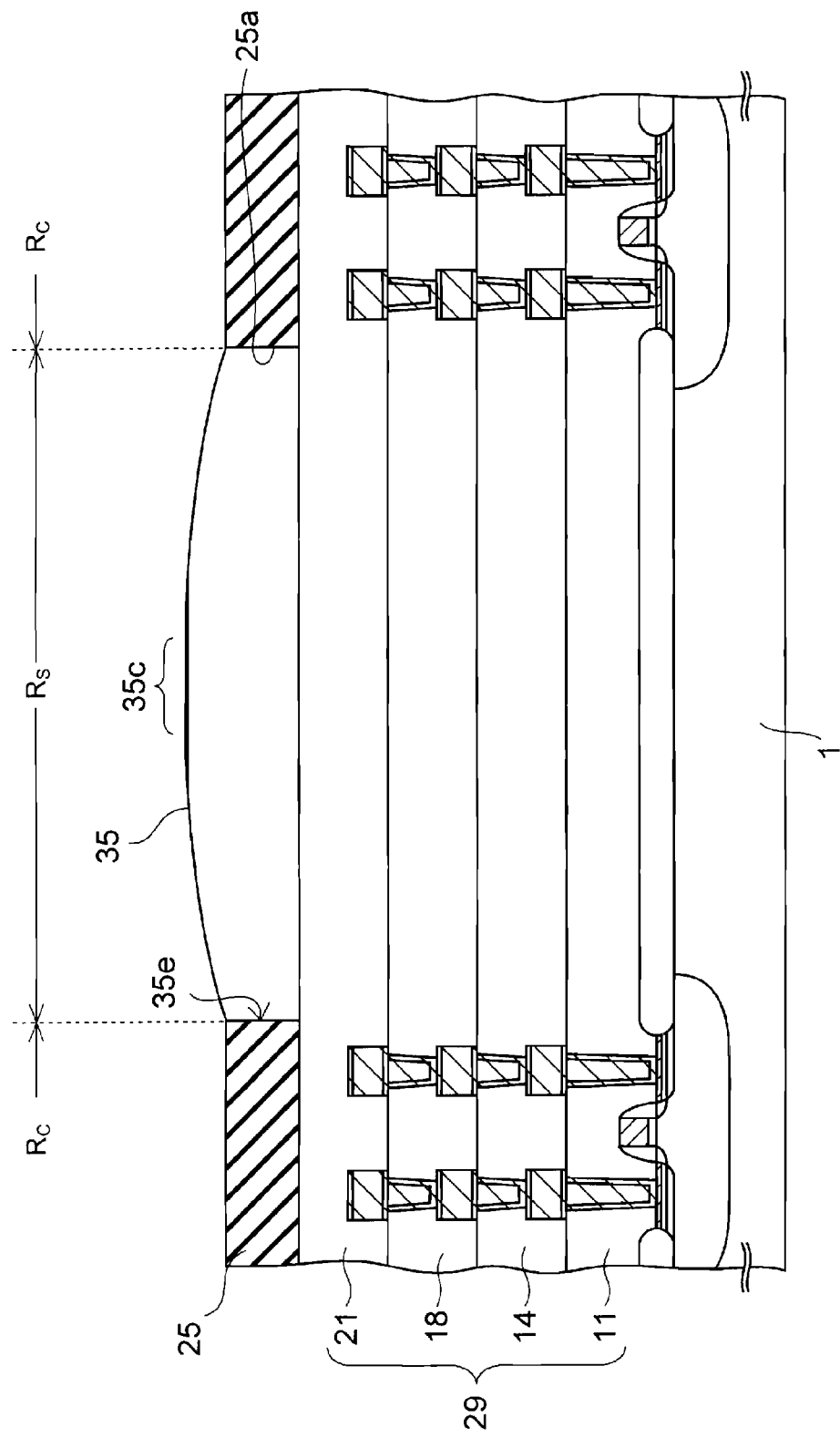

Next, as illustrated in FIG. 6B, PVA is applied into the window 25a by use of an unillustrated dispenser, and thermally cured at a temperature of approximately 150 to 160° C. to thereby form a protection film 35. Because of the surface tension of the PVA, the protection film 35 is shaped like a convex lens whose thickness is larger in a center portion 35c than at end surfaces 35e.

Incidentally, PVA is a material capable of transmitting the laser used for laser grooving, and is suitable as a material for the protection film 35.

Note that, to prevent foreign materials from being drawn in the protection film 35, it is preferable to carry out the application of the PVA in a clean environment, for example, in a cleanroom or the like. This also is the same as in embodiments to be described later.

Figure 7B:
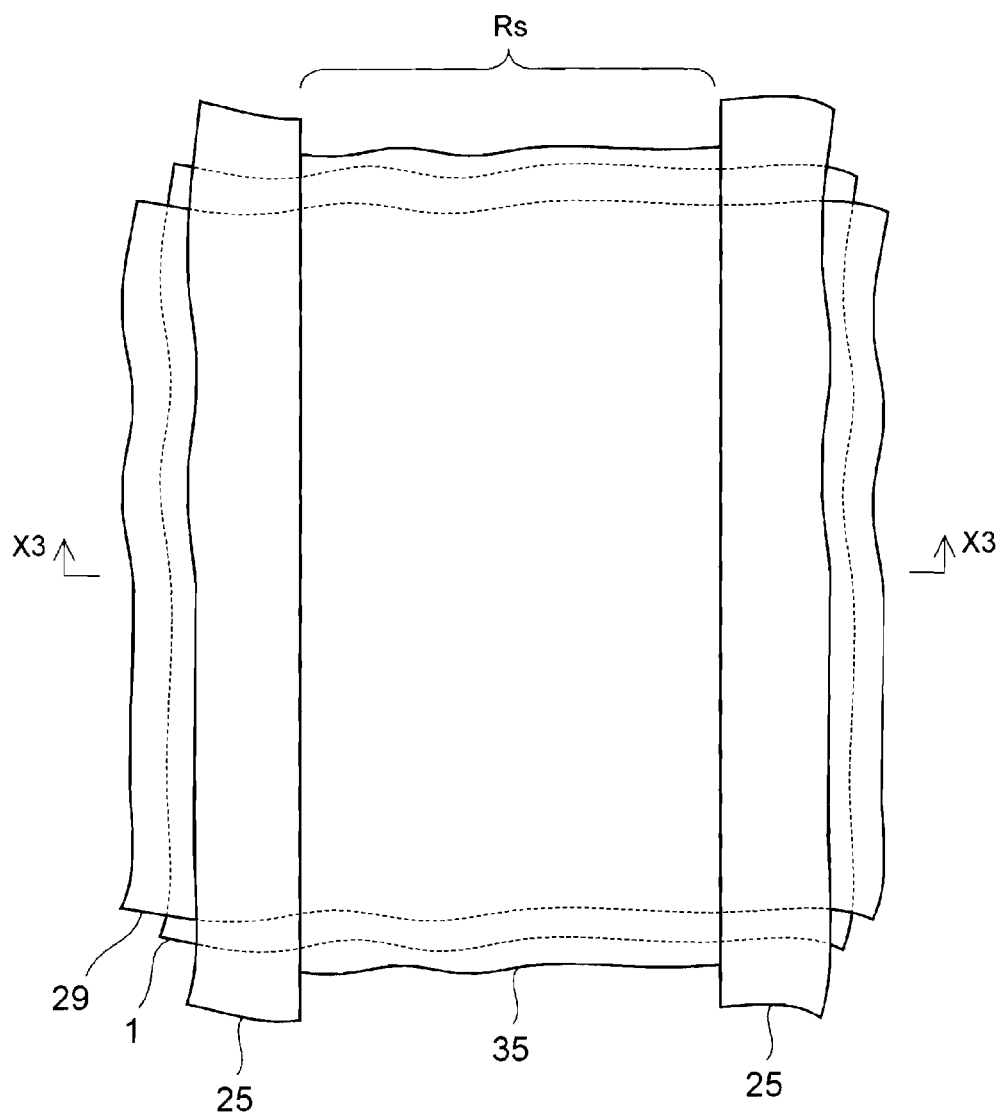

FIG. 7B is a plan view of the semiconductor substrate 30, and FIG. 6B mentioned above corresponds to a cross section taken along the line X3-X3 of FIG. 7B.

Figure 8:
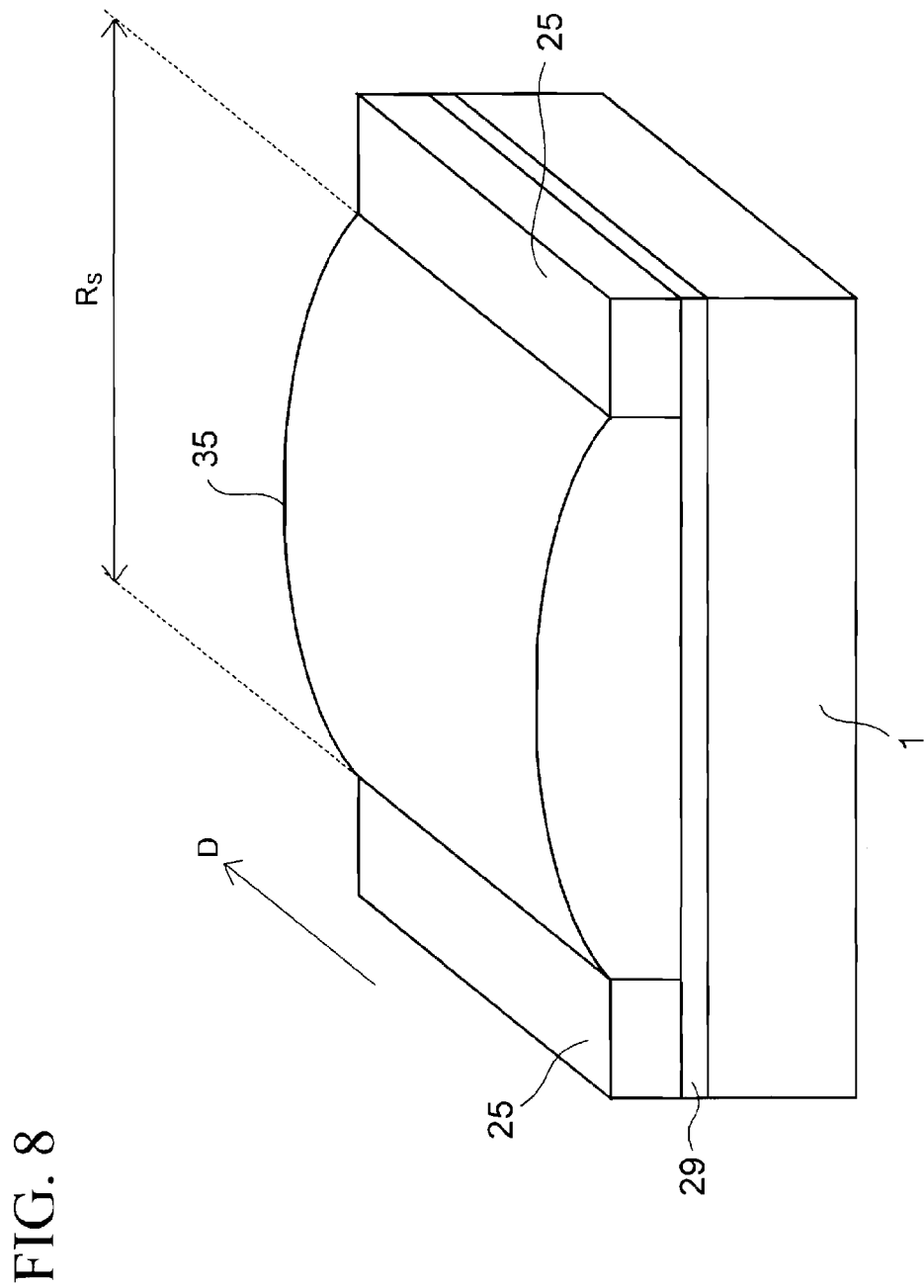
FIG. 8 is a perspective view of the semiconductor device in the course of manufacturing thereof according to the first embodiment.

Meanwhile, FIG. 8 is a perspective view after completion of this step.

As illustrated in FIG. 8, the protection film 35 has a belt-like shape in a plan view, elongated in an extending direction D of the scribe region $R_s$.

Next, as illustrated in FIG. 6C, the multilayer film 29 is irradiated with the laser beam L through the protection film 35 to start the laser grooving on the multilayer film 29.

Although the kind of the laser beam L is not particularly limited, a pulse laser with a wavelength of approximately 300 nm to 400 nm and a power of 3.0 to 4.0 W is used in the embodiment. The irradiation interval of the pulse laser is set to be several nanoseconds to several femtoseconds.

In this event, since the multilayer film 29 in the portions where are irradiated with the laser beam L is covered with the protection film 35, the materials of the multilayer film 29 vaporized due to heat of the laser beam L becomes less likely to be scattered in the lateral directions of the substrate. As a result, the materials become less likely to be attached again onto the passivation film 25.

Moreover, in this step, since the protection film 35 is shaped like a convex lens, the laser beam L is efficiently concentrated on a surface of the multilayer film 29, so that the variation in the spot diameter $D_s$ of the laser beam L on the surface of the multilayer film 29 is reduced.

For example, suppose a case where the laser beam L is parallel light, the protection film 35 has a refractive index of 1.5, and the radius of curvature of the surface thereof is 2.5 μm. In such a case, the protection film 35 functions as a convex lens having a focal length f of approximately 5 μm, and the spot diameter $D_s$ on the surface of the multilayer film 29 is stabilized to a value of about 1 μm.

Note that, by using the refractive index n and the radius of curvature r of the protection film 35, the focal length f of the protection film 35 can be approximated by the equation: $f=(n-1)/r$.

Figure 7C:
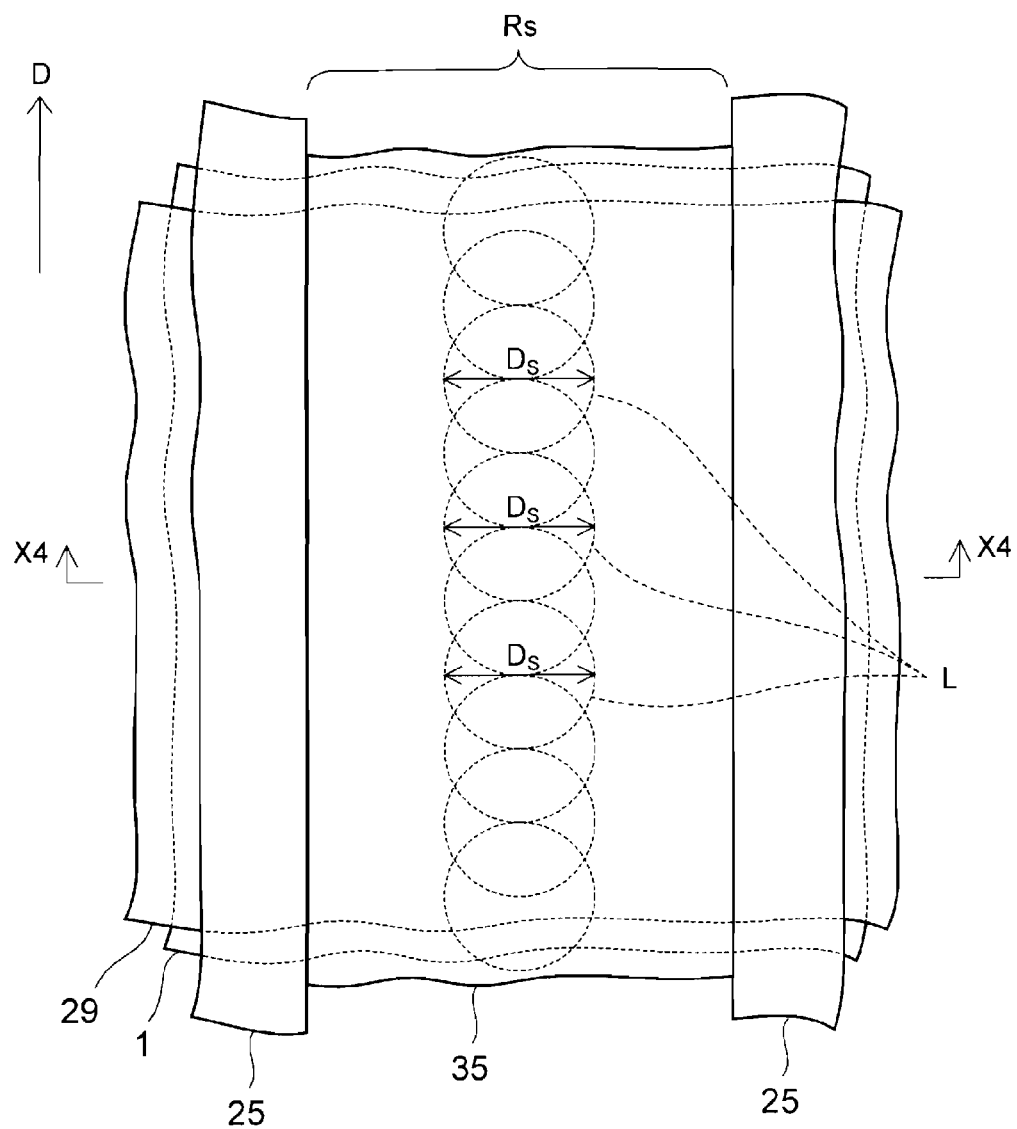

FIG. 7C is a plan view for describing the position of the irradiation with the laser beam L, and FIG. 6C mentioned above corresponds to a cross-sectional view taken along the line X4-X4 of FIG. 7C.

As illustrated in FIG. 7C, the laser beam L is applied in a spot shape and at predetermined intervals along an extending direction of the protection film 35 which is in parallel to the extending direction D of the scribe region $R_s$. The spot diameter $D_s$ of the laser beam L is stabilized because of the effect of the protection film 35 acting as a lens, so that the variation in the spot diameter $D_s$ depending on the position is reduced.

Figure 6D:
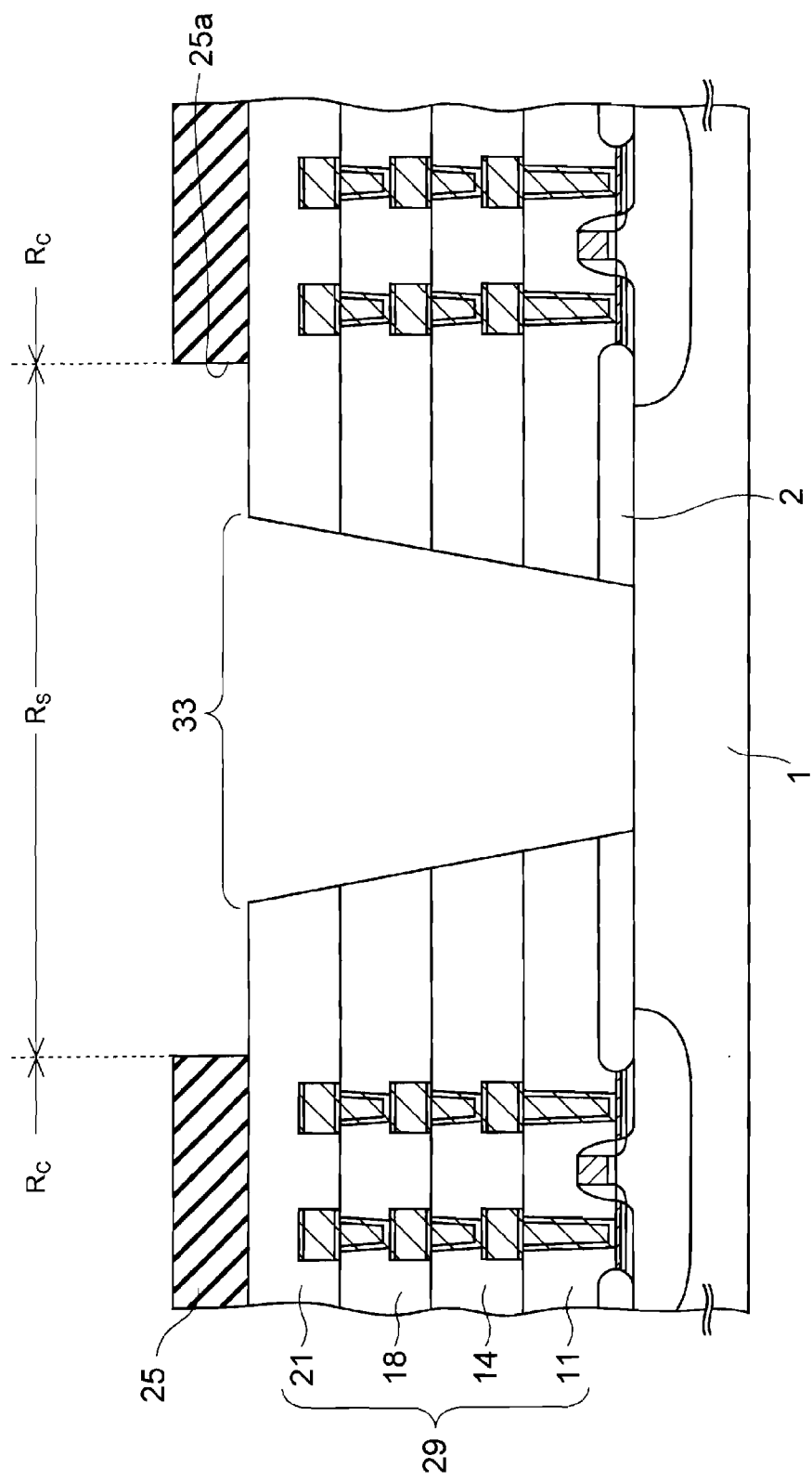

By such laser grooving, the groove 33 is formed in the multilayer film 29 and the underlying element isolation insulating film 2 as illustrated in FIG. 6D.

Note that, since PVA, which is the material of the protection film 35, is water soluble, the protection film 35 can easily be removed by washing with water. The washing with water may be conducted after the groove 33 is formed, or may be conducted by use of water supplied during dicing to be described later.

Figure 7D:
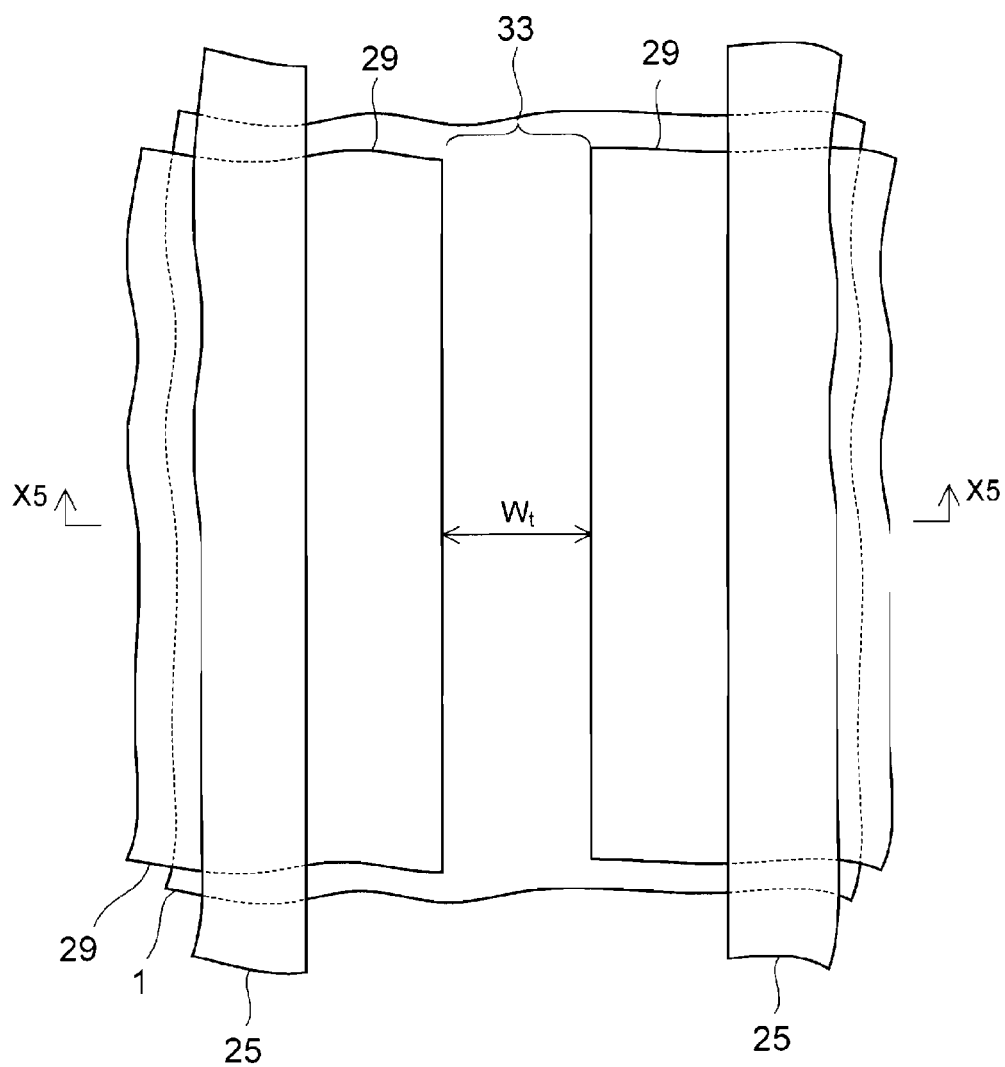

FIG. 7D is a plan view after finishing this step, and FIG. 6D mentioned above corresponds to a cross-sectional view taken along the line X5-X5 of FIG. 7D.

As illustrated in FIG. 7D, since the spot diameter $D_s$ of the laser beam L is stabilized, the width $W_t$ of the groove 33 formed in the multilayer film 29 by the laser beam L is also stabilized, so that it is possible to reduce the variation in the width $W_t$ depending on the position on the semiconductor substrate 30.

Figure 6E:
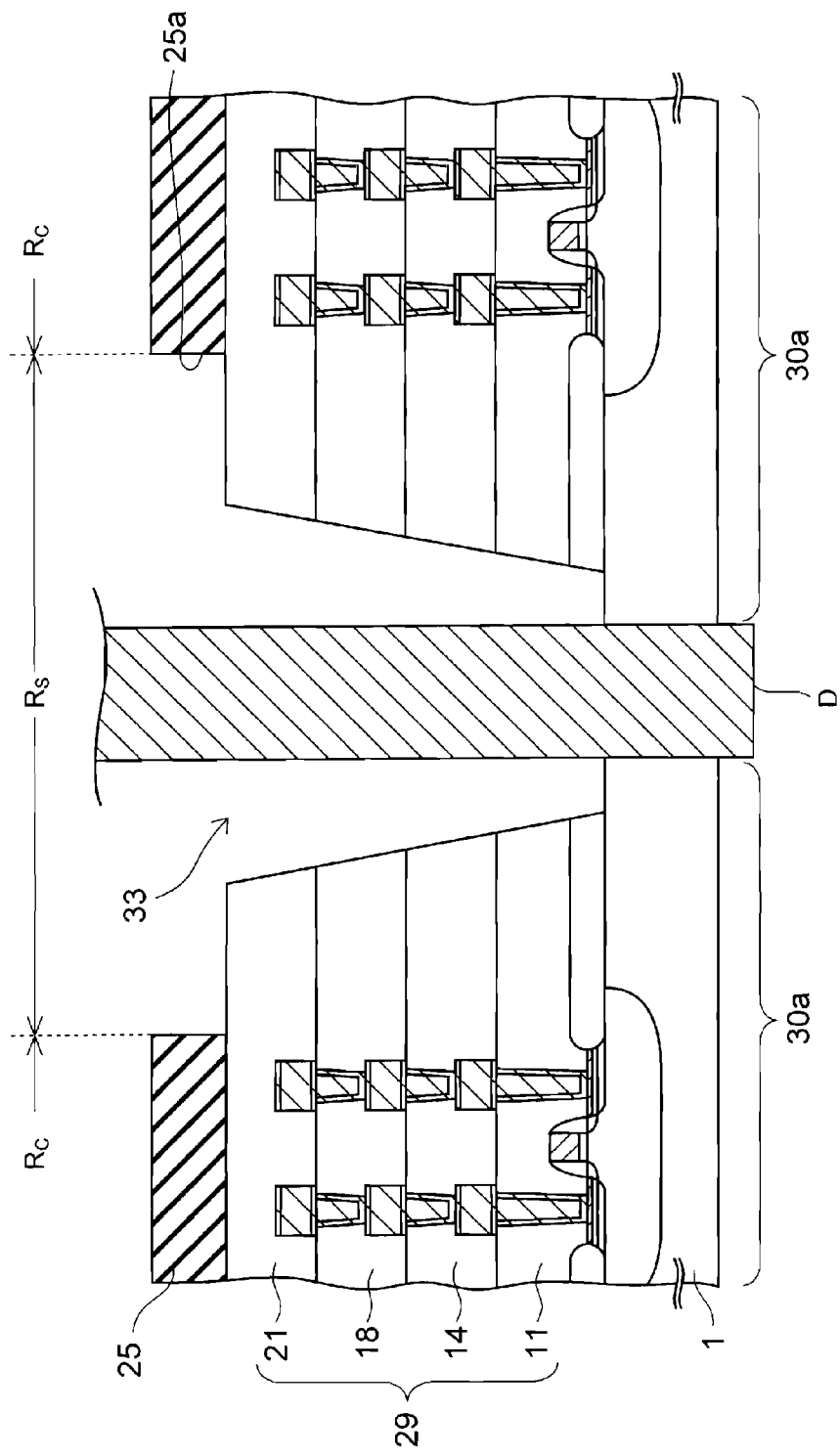

Next, as illustrated in FIG. 6E, a dicing blade D is pressed onto the silicon substrate 1 exposed on the bottom surface of the groove 33 to divide the silicon substrate 1 into individual semiconductor elements 30a.

At this time, since the variation in the width $W_t$ of the groove 33 is reduced as described above, it is possible to reduce the risk such that the dicing blade D comes into contact with the multilayer film 29 on the lateral surfaces of the groove 33. Accordingly, the chipping due to the contact with the dicing blade D can be prevented from occurring in the multilayer film 29.

Low-dielectric insulating films such as porous silicon oxide films are more brittle than silicon oxide films, and hence more susceptible to the chipping. Hence, the first embodiment is particularly useful when low-dielectric insulating films are formed as the insulating films 11, 14, 18, and 21 in the multilayer film 29.

Figure 7E:
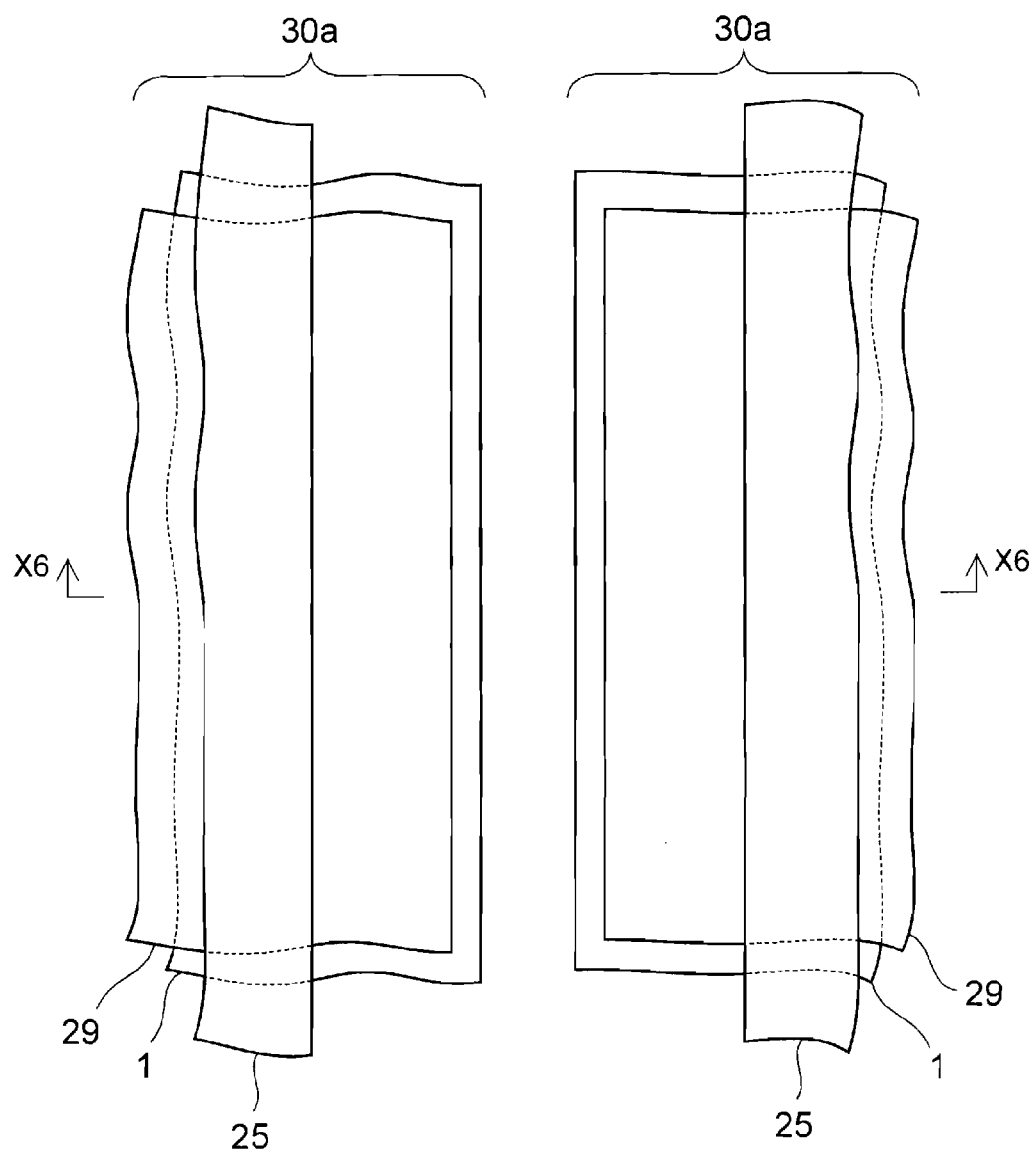

FIG. 6F is a cross-sectional view of the semiconductor substrate 30 thus divided into the individual pieces. Meanwhile, FIG. 7E is a plan view of the semiconductor substrate 30 divided into individual pieces, and FIG. 6F mentioned above corresponds to a cross-sectional view taken along the line X6-X6 of FIG. 7E.

Thus, fundamental steps of the manufacturing process of a semiconductor device according to the first embodiment are completed.

According to the embodiment described above, since the spot diameter $D_s$ of the laser beam L is stabilized by the protection film 35 shaped like a convex lens as illustrated in FIG. 6C, the variation in the shape of the groove 33 formed by the laser beam L can be prevented, so that the contact of the groove 33 with the dicing blade D (see FIG. 6E) can be inhibited.

As a result, it is possible to reduce the chipping in the multilayer film 29 being caused due to the contact of the dicing blade D with the multilayer film 29 on the lateral surfaces of the groove 33, and also to reduce the risk of reduction in moisture resistance of the semiconductor device due to the chipping.

Second Embodiment

In the embodiment, two regions of different hydrophobicities are formed on a surface of the semiconductor substrate 30 as follows. This allows the protection film 35 to be formed selectively only in a predetermined region on the semiconductor substrate 30.

FIGS. 9A to 9E are cross-sectional views of semiconductor devices in the course of manufacturing thereof according to the embodiment. Note that, in these drawings, elements which are the same as those in the first embodiment are denoted by the same reference numerals as those in the first embodiment, and description thereof is omitted below.

Figure 9A:
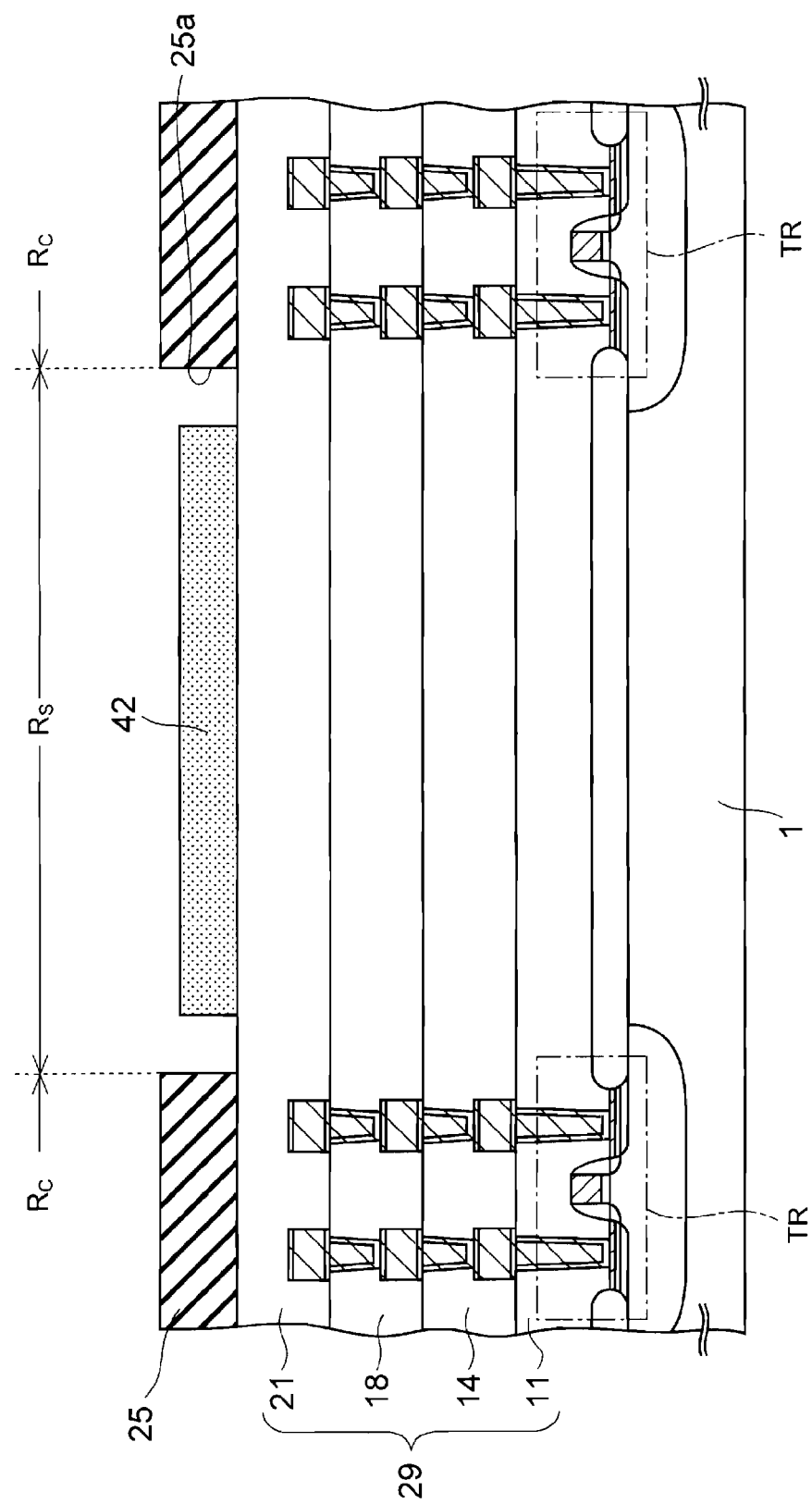
FIGS. 9A to 9E are cross-sectional views of semiconductor devices in the course of manufacturing thereof according to a second embodiment.

First, as illustrated in FIG. 9A, a photoresist is applied onto the entire top surface over the semiconductor substrate 30, and then exposed and developed to thereby form a resist pattern 42 in the window 25a of the passivation film 25.

Figure 9B:
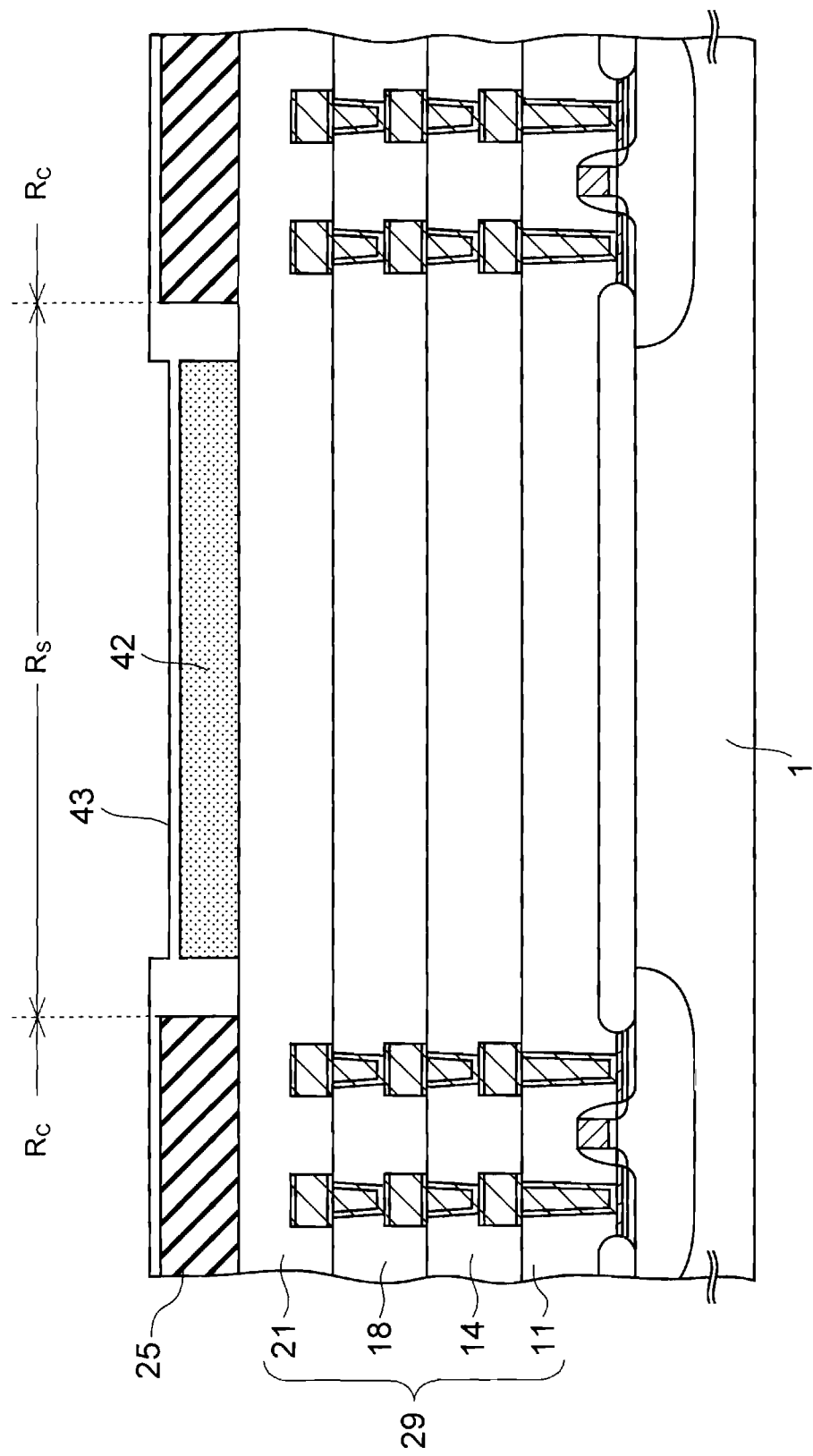

Next, as illustrated in FIG. 9B, a fluorine-based resin thin film with the thickness of about 10 to 50 nm is formed as a hydrophobic thin film 43 on both the resist pattern 42 and the passivation film 25. As a material of the fluorine-based resin thin film, Teflon can be used. Examples of Teflon include polytetrafluoroethylene (PTFE), tetrafluoroethylene•perfluoroalkyl vinyl ether copolymer (PFA), tetrafluoroethylene•hexafluoropropylene copolymer (FEP), tetrafluoroethylene•ethylene copolymer (ETFE), polyvinylidene fluoride (PVDF), polychlorotrifluoroethylene (PCTFE), and chlorotrifluoroethylene•ethylene copolymer (ECTFE), and the like.

Moreover, the method for forming the hydrophobic thin film 43 is not particularly limited. For example, the hydrophobic thin film 43 can be formed by a laser ablation method in which a Teflon target is irradiated with laser to form a Teflon thin film from Teflon thus vaporized.

In addition, the hydrophobic thin film 43 is not limited to a fluorine-based resin thin film, and an aggregate of minute pins may be formed as the hydrophobic thin film 43. Examples of such pins include those obtained by coating the surface of brucite-type pin-shaped cobalt hydroxide (BCH) with sodium laurate. The BCH pins can be formed by immersing the substrate 30 into a solution containing cobalt chloride and urea.

Incidentally, when a Teflon thin film is formed as the hydrophobic thin film 43, the contact angle of water on the surface of the hydrophobic thin film 43 is approximately 110 degrees, which indicates a sufficient water repellency of the hydrophobic thin film 43.

Figure 9C:
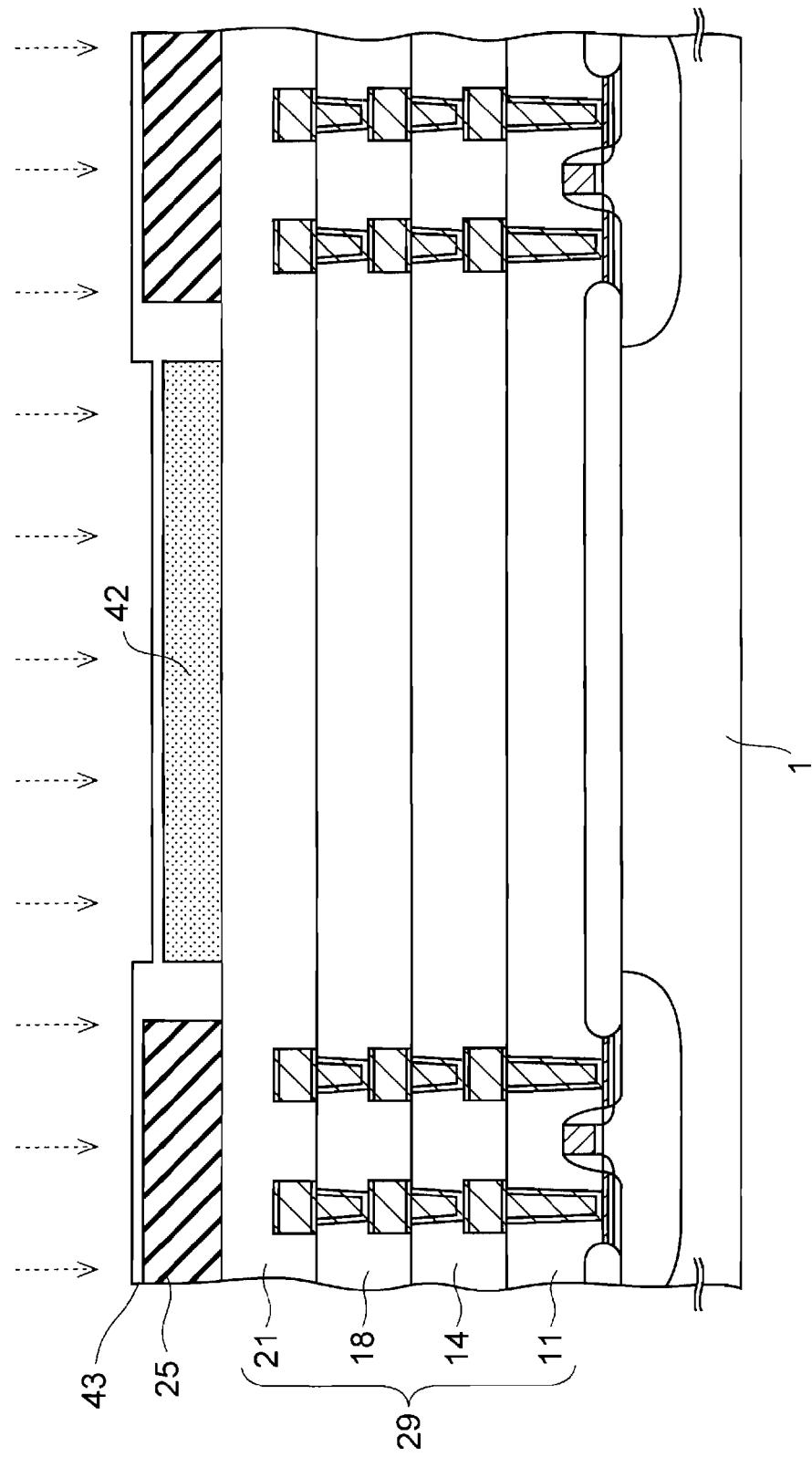

However, to further increase the water repellency, the hydrophobic thin film 43 is preferably subjected to a plasma treatment as will be illustrated in FIG. 9C.

Examples of gases used in the plasma treatment include fluorine-based gases such as $CF_4$. With such a plasma treatment, fluorine atoms are attached onto the surface of the hydrophobic thin film 43 to enhance the water repellency of the surface.

Figure 9D:
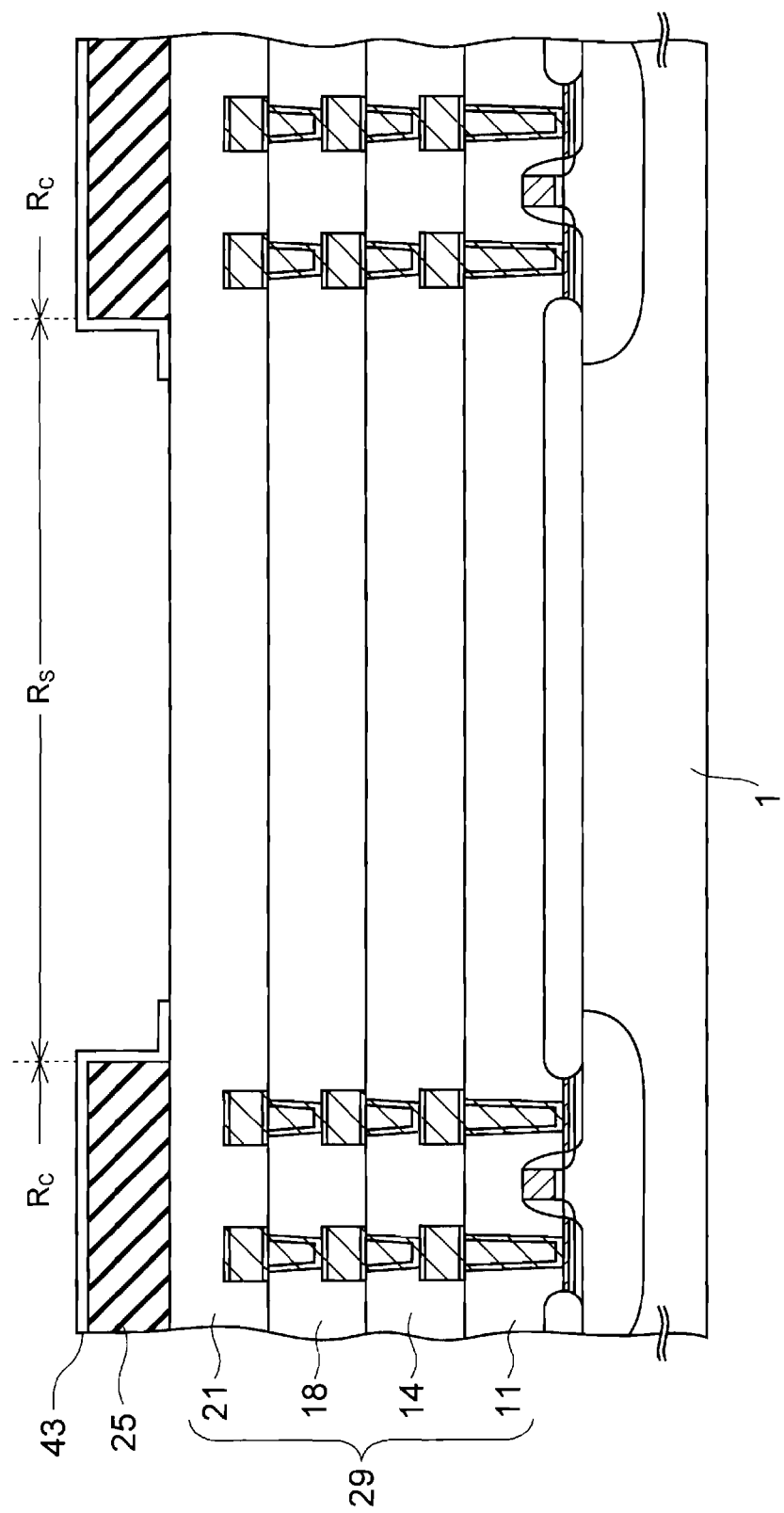

Thereafter, as illustrated in FIG. 9D, the resist pattern 42 is lifted off to thereby remove an unnecessary portion of the hydrophobic thin film 43 in the scribe region $R_s$.

Through these steps, a structure is obtained in which the hydrophobicity of the surface of the semiconductor substrate 30 is higher in each element formation region $R_c$ than in the scribe region $R_s$.

Figure 9E:
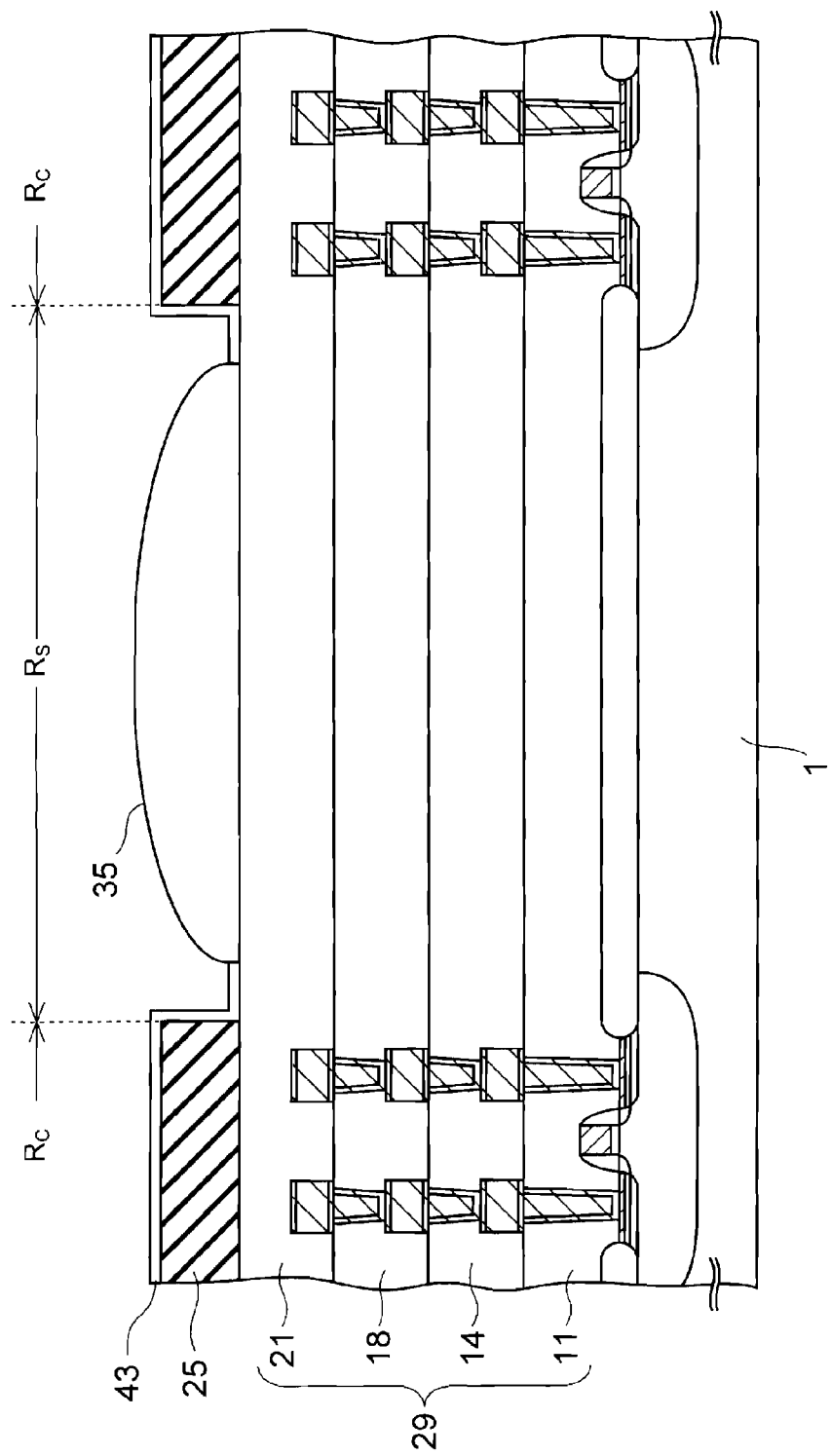

Next, as illustrated in FIG. 9E, PVA is applied into the window 25a by use of an unillustrated dispenser as in the case of the step of the first embodiment illustrated in FIG. 6B, and the PVA is thermally cured to form the protection film 35.

At this time, the hydrophobic thin film 43 having a higher hydrophobicity than the surface of the multilayer film 29 functions to repel the protection film 35. Accordingly, the protection film 35 is formed selectively only on the surface of the multilayer film 29.

After this step, laser ablation and dicing are carried out as in the case of the first embodiment, and detailed description thereof is omitted.

According to the embodiment described above, by the hydrophobic thin film 43, the hydrophobicity of the surface of the semiconductor substrate 30 in each semiconductor element region $R_c$ is made higher than that in the dicing region $R_s$. For this reason, liquid PVA, which is the material of the protection film 35, is excluded from the semiconductor element regions $R_c$, so that the convex lens-shaped protection film 35 can be formed selectively only in the scribe region $R_s$.

Third Embodiment

In the embodiment, a hydrophilic region is provided on the surface of the semiconductor substrate 30, and the protection film 35 is formed in this region as follows.

FIGS. 10A to 10F are cross-sectional views of semiconductor devices in the course of manufacturing thereof according to the embodiment. Note that, in these drawings, elements which are the same as those in the first and second embodiments are denoted by the same reference numerals as those in the first and second embodiments, and description thereof is omitted below.

Figure 10A:
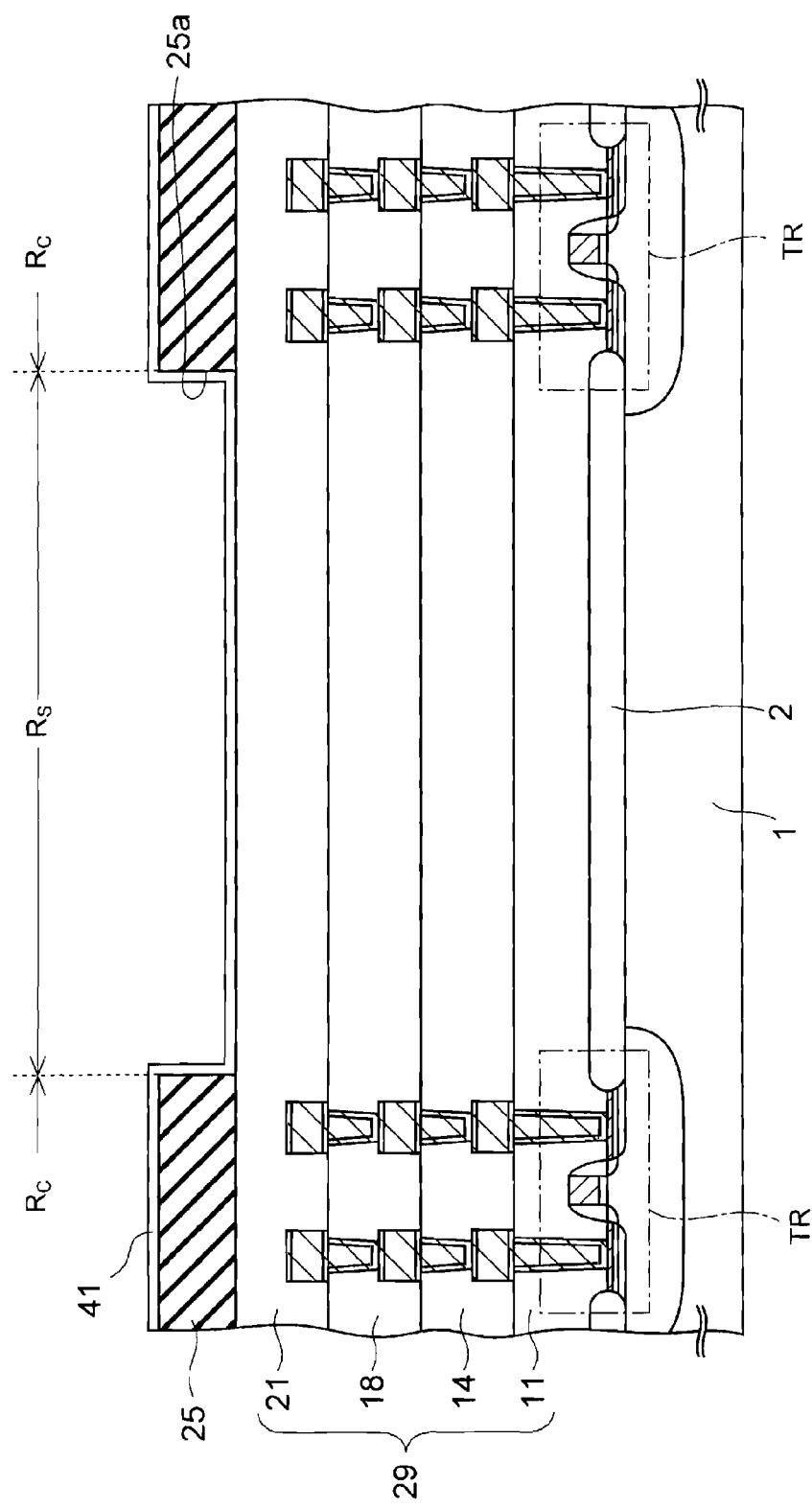

First, as illustrated in FIG. 10A, a nickel layer is formed as a hydrophilic thin film 41 on the passivation film 25 and in the window 25a by a vapor deposition method.

The film thickness of the hydrophilic thin film 41 is not particularly limited, and is preferably, for example, about 10 nm to 50 nm, which is thin enough to transmit the laser used for the laser grooving.

Figure 10B:
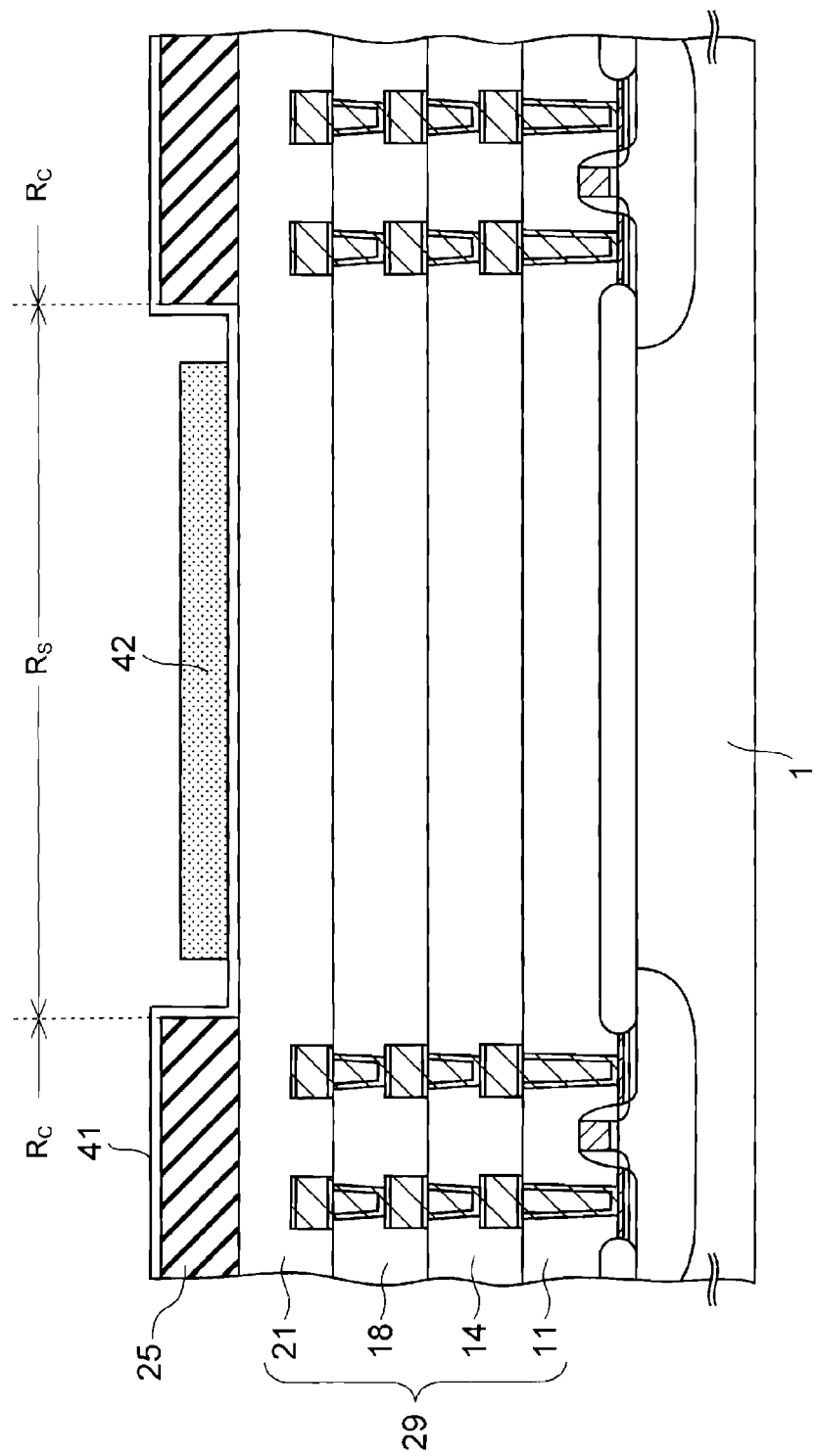

Next, as illustrated in FIG. 10B, a photoresist is applied onto the hydrophilic thin film 41, and exposed and developed to thereby form the resist pattern 42.

Figure 10C:
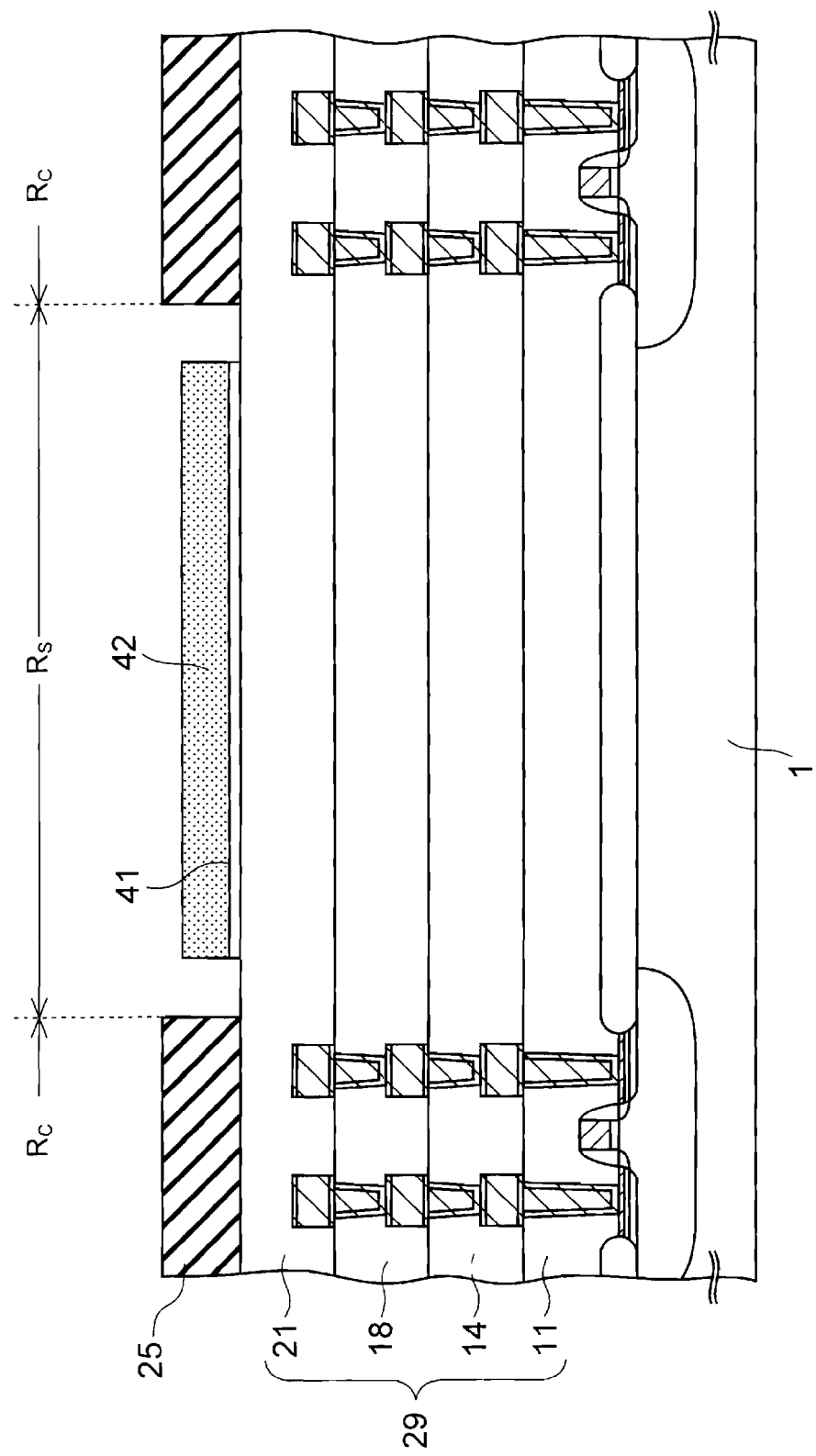

Subsequently, as illustrated in FIG. 10C, the hydrophilic thin film 41 is wet etched by using the resist pattern 42 as a mask, and the hydrophilic thin film 41 is left only within the scribe region $R_s$. An etching solution for the wet etching is not particularly limited, and an etching solution containing a peroxide, nitric acid, and sulfuric acid is used in the third embodiment.

Figure 10D:
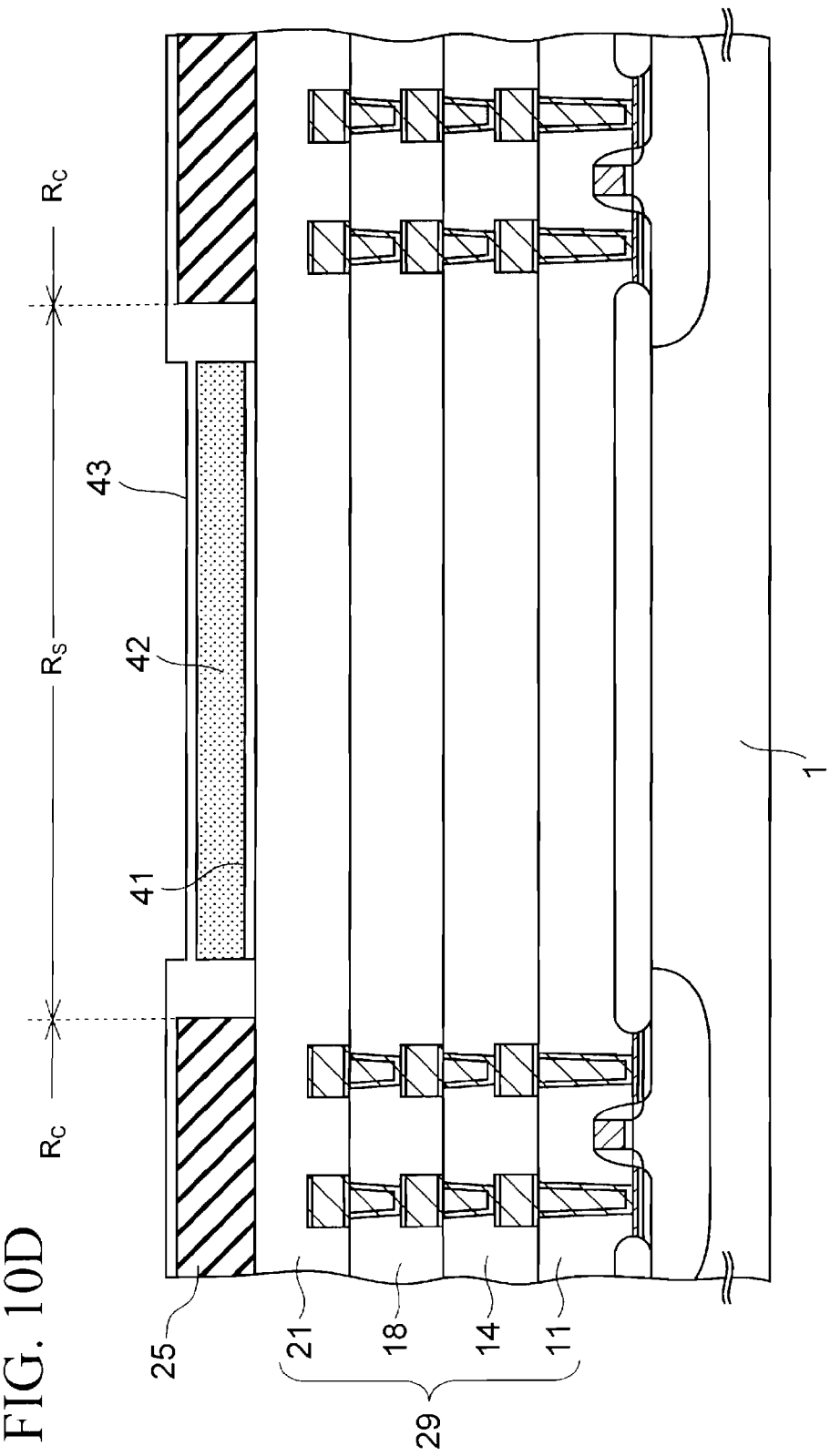

Next, as illustrated in FIG. 10D, a fluorine-based resin thin film with a thickness of about 10 nm to 50 nm is formed as the hydrophobic thin film 43 by a laser ablation method on both the resist pattern 42 and the passivation film 25. As a material of the fluorine-based resin thin film, Teflon can be used as in the case of the second embodiment.

Figure 10E:
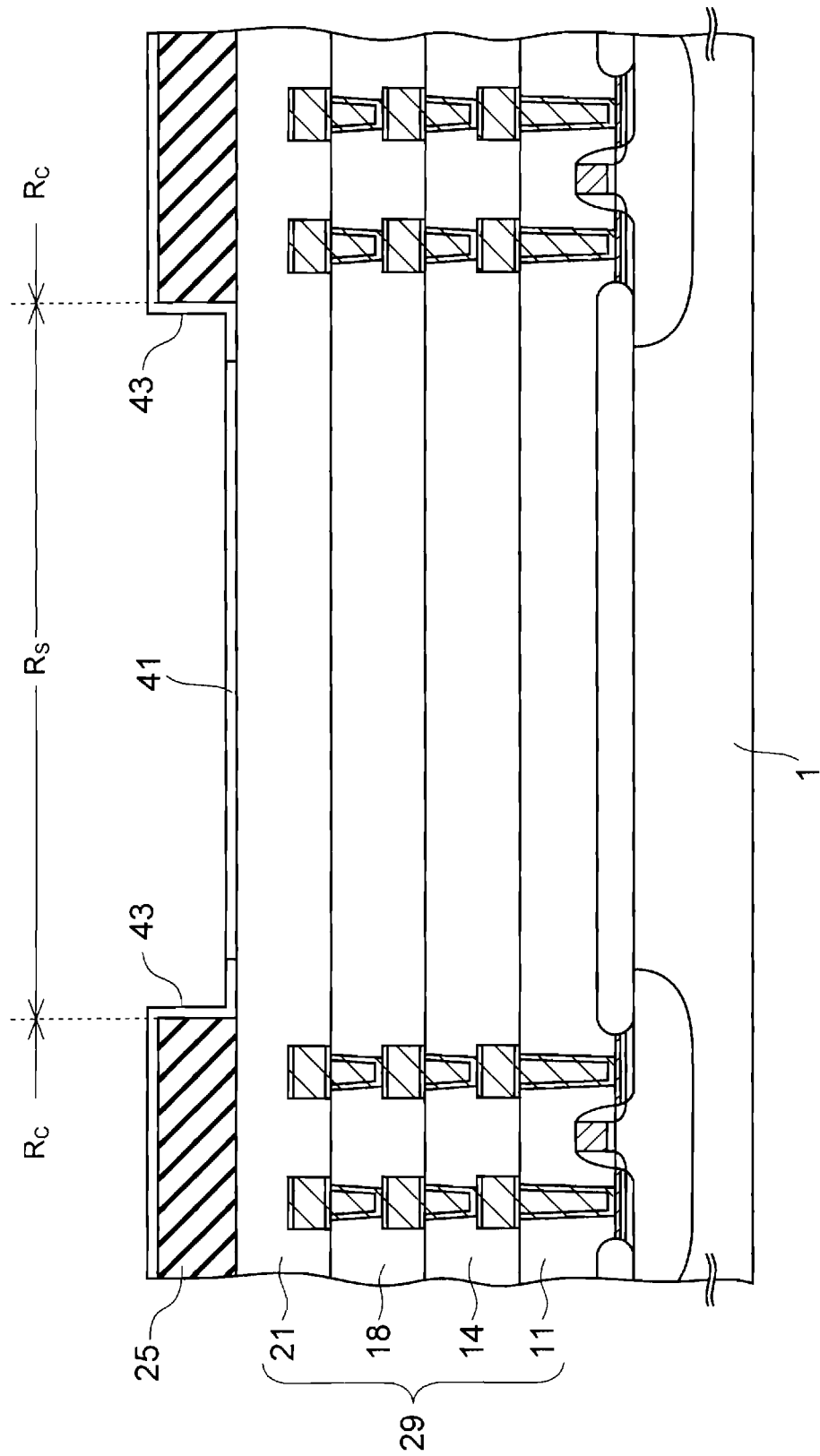

Thereafter, as illustrated in FIG. 10E, the resist pattern 42 is lifted off to thereby remove an unnecessary portion of the hydrophobic thin film 43 on the resist pattern 42. Thus, a structure is obtained in which the surface of the semiconductor substrate 30 is covered with the thin films 41 and 43.

Of these thin films, the contact angle of water on the surface of the hydrophilic thin film 41 containing nickel is approximately 67 degrees, whereas the contact angle of water on the surface of the hydrophobic thin film 43 containing Teflon is approximately 110 degrees. As described above, according to the third embodiment, the regions of different hydrophobicities can be formed on the semiconductor substrate 30.

Subsequently, as illustrated in FIG. 10F, PVA is applied into the window 25a by use of an unillustrated dispenser as in the case of the step of the first embodiment illustrated in FIG. 6B, and the PVA is thermally cured to form the protection film 35.

At this time, since the two regions of different hydrophobicities are formed on the surface of the semiconductor substrate 30 as described above, the applied PVA stays on the hydrophilic thin film 41, and does not wet the hydrophobic thin film 43 and hence is not spread thereto. Accordingly, the protection film 35 like a convex lens can be formed only in the scribe region $R_s$.

After this step, laser ablation and dicing are carried out as in the case of the first embodiment, and detailed description thereof is omitted.

According to the third embodiment described above, the hydrophilic thin film 41 is formed in the scribe region $R_s$, and the hydrophobic thin film 43 is formed in regions other than the scribe region $R_s$. For this reason, the liquid PVA, which is the material of the protection film 35, stays on the hydrophilic thin film 41 having a lower hydrophobicity than the hydrophobic thin film 43. This makes it possible to prevent the formation of the protection film 35 in the semiconductor element regions $R_c$.

Fourth Embodiment

In the second and third embodiments, a fluorine-based resin such as Teflon or the like is used as the material of the hydrophobic thin film 43. Meanwhile, in the embodiment, the hydrophobic thin film 43 is formed by use of anodization in the following manner.

FIGS. 11A to 11D are cross-sectional views of semiconductor devices in the course of manufacturing thereof according to the fourth embodiment. Note that, in FIGS. 11A to 11D, elements which are the same as those in the first to third embodiments are denoted by the same reference numerals as those in the first to third embodiments, and description thereof is omitted below.

Figure 11A:
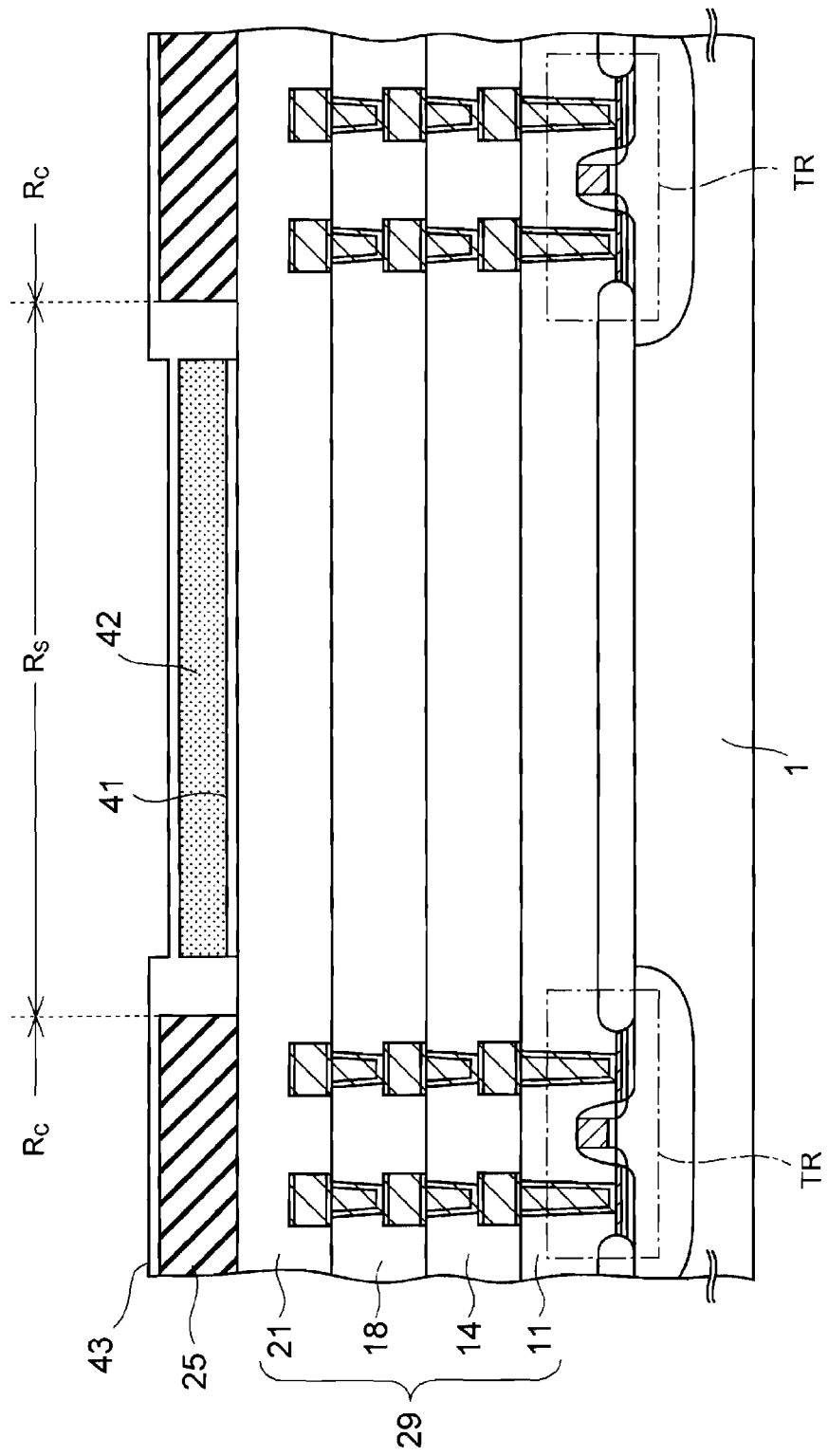
FIGS. 11A to 11D are cross-sectional views of semiconductor devices in the course of manufacturing thereof according to a fourth embodiment.

First, the steps of the third embodiment illustrated in FIGS. 10A to 10C are performed. Then, as illustrated in FIG. 11A, an aluminum film with a thickness of about 10 nm to 50 nm is formed by a vapor deposition method as the hydrophobic thin film on the entire top surface over the silicon substrate 30.

Figure 11B:
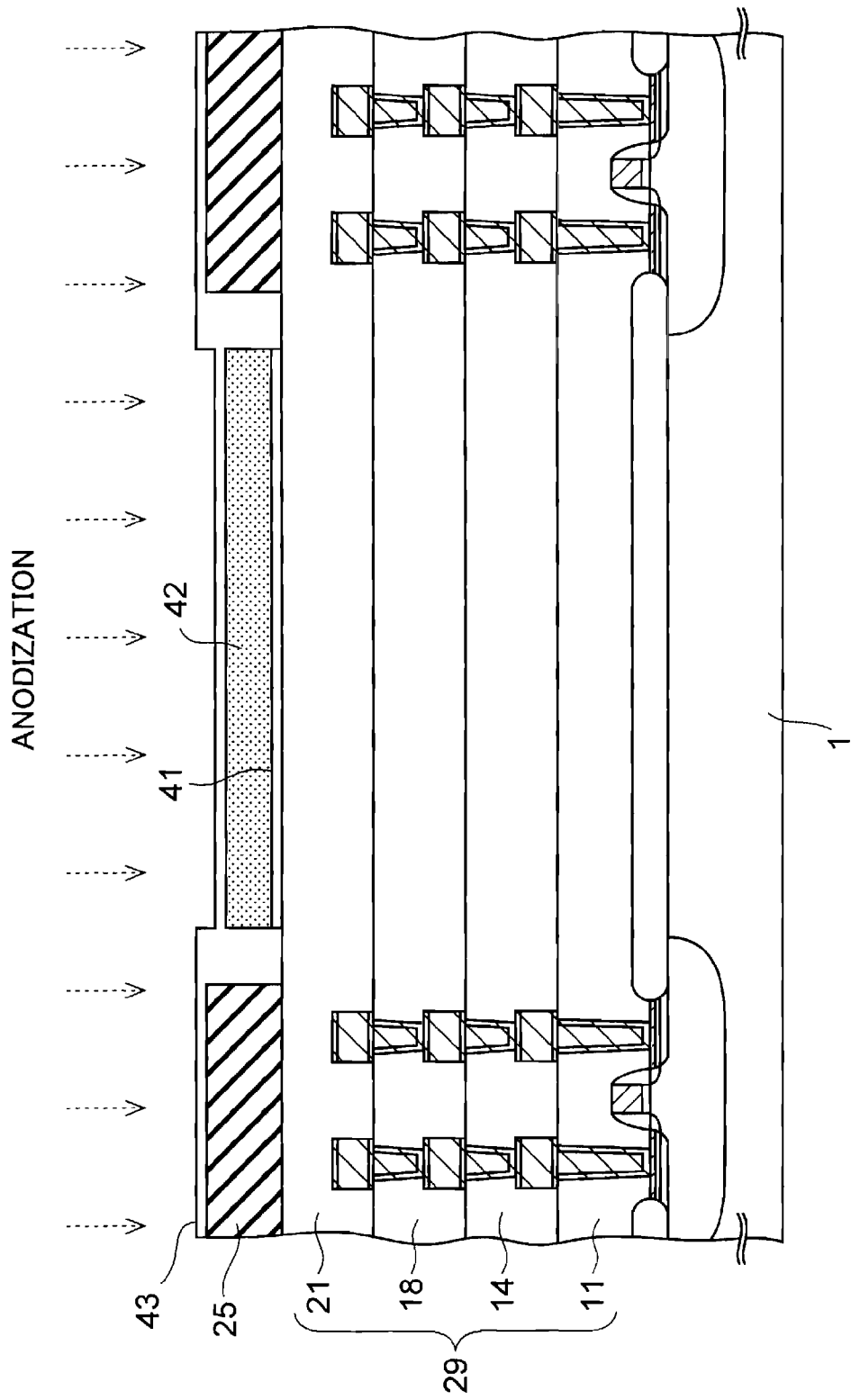

Subsequently, as illustrated in FIG. 11B, a surface of the hydrophobic thin film 43 is anodized to thereby make the surface rougher than before the treatment. Conditions of the anodization are not particularly limited, and the anodization is performed in sulfuric acid ($H_2SO_4$) under a condition of a current density of 10 mA/cm$^2$ for two hours in the fourth embodiment.

The surface of the hydrophobic thin film 43 roughened by anodization is known to have a fractal structure excellent in water repellency. This provides the hydrophobic thin film 43 with a higher repellency against PVA, which is the material of a protection film to be described later, than before the anodization.

Note that, to surely obtain a high repellency, the surface of the hydrophobic thin film may be chemically hydrophobized after the anodization. For the hydrophobization, a solution is prepared by mixing a mixture solvent of hexadecane, chloroform, carbon tetrachloride, which are dried over molecular sieves 3A, with 1H,1H,2H,2H-perfluorooctyltrichlorosilane in an amount of 1 to 0.5 wt %. Then, the hydrophobic thin film 43 is immersed in this solution for approximately 12 hours. As a result, the surface of the hydrophobic thin film 43 is chemically hydrophobized.

Figure 11C:
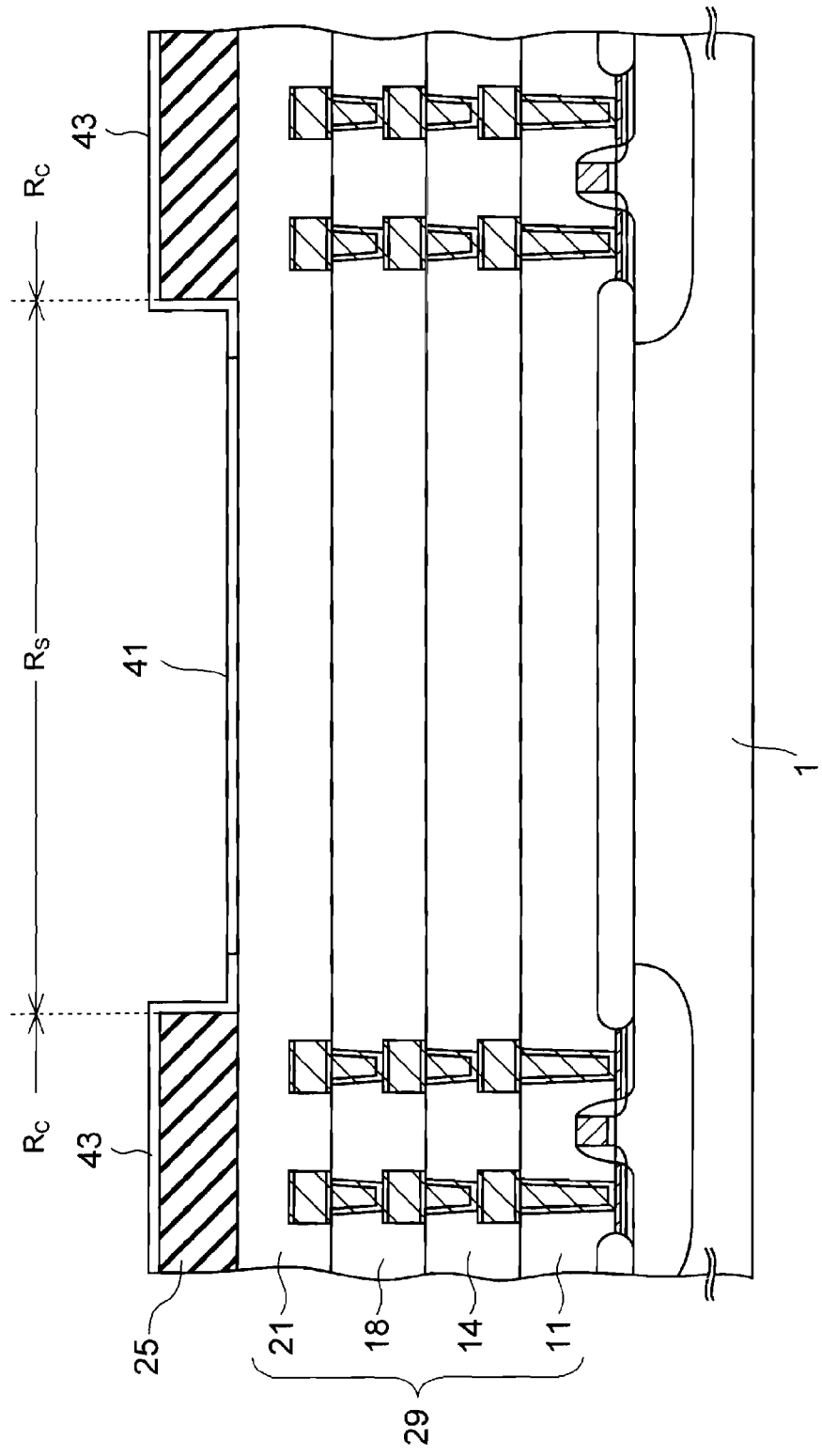

Next, as illustrated in FIG. 11C, the resist pattern 42 is lifted off to thereby remove an unnecessary portion of the hydrophobic thin film 43 on the resist pattern 42.

Figure 11D:
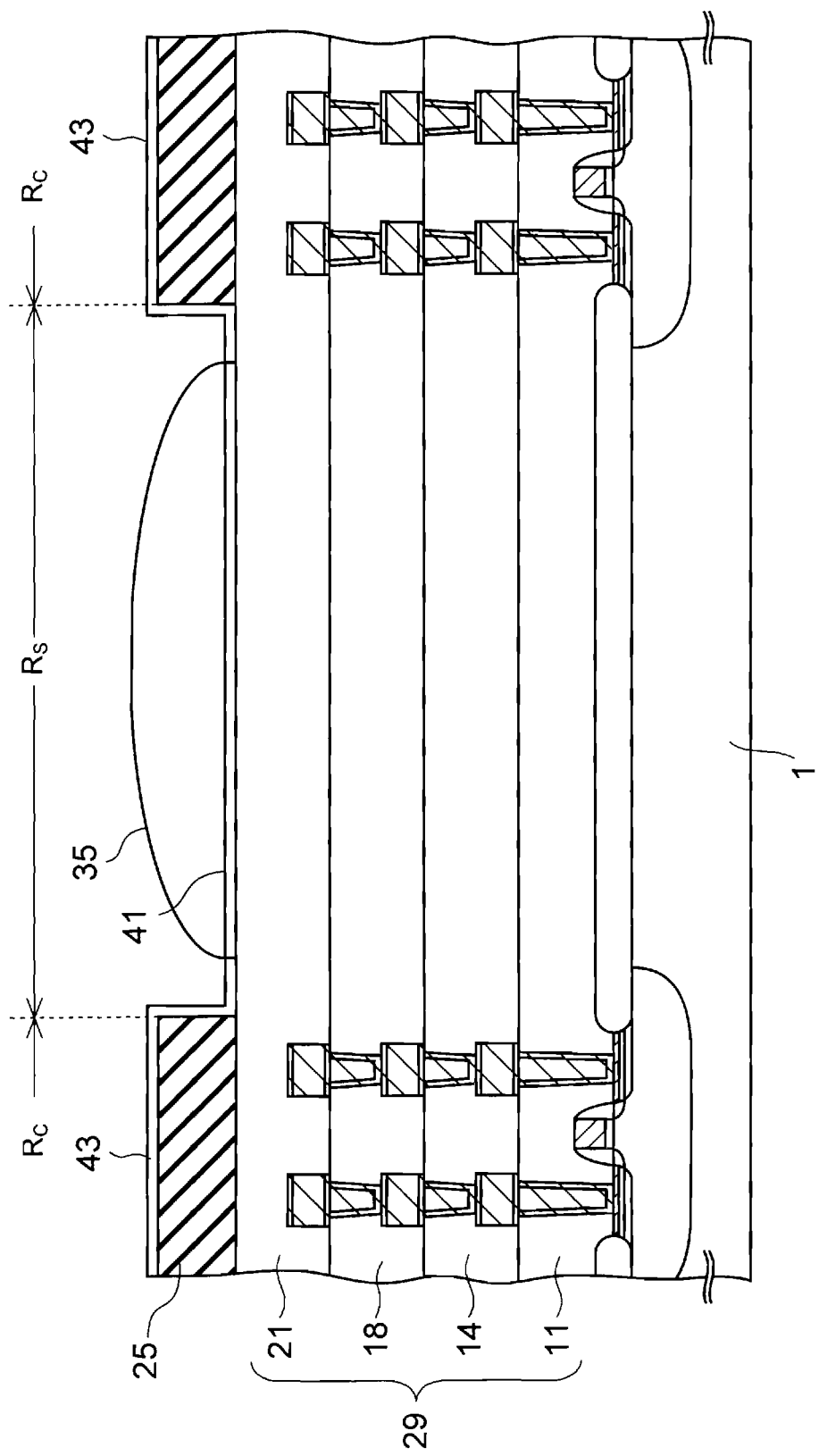

Subsequently, as illustrated in FIG. 11D, PVA is applied into the window 25a by use of an unillustrated dispenser as in the case of the step of the first embodiment illustrated in FIG. 6B, and the PVA is thermally cured to form the protection film 35 shaped like a convex lens.

At this time, by the hydrophobic thin film 43, the hydrophobicity of the semiconductor substrate 30 in each semiconductor element region $R_c$ is made higher than in the scribe region $R_s$. Hence, the applied liquid PVA stays on the hydrophilic thin film 41, and does not wet the semiconductor element region $R_c$, and hence is not spread thereto.

After this step, laser ablation and dicing are carried out as in the case of the first embodiment, and detailed description thereof is omitted.

Also in the fourth embodiment described above, the hydrophobic material film 48 is formed on the semiconductor substrate 30 in each semiconductor element region $R_c$. This makes the hydrophobicity higher in the region $R_c$ than in the scribe region $R_s$. For this reason, the liquid PVA, which is the material of the protection film 35, is repelled by the hydrophobic material film 48, and hence the protection film 35 can easily be formed only in the scribe region $R_s$.

Note that, in the above description, the hydrophilic thin film 41 is formed in the scribe region $R_s$. However, when the hydrophobicity of the surface of the multilayer film 29 is sufficiently low, the hydrophilic thin film 41 may be removed.

Fifth Embodiment

In the embodiment, the hydrophobicity of the semiconductor substrate 30 in the scribe region $R_s$ is reduced by a plasma treatment as follows.

FIGS. 12A to 12D are cross-sectional views of semiconductor devices in the course of manufacturing thereof according to the fifth embodiment. Note that, in these drawings, elements which are the same as those in the first to fourth embodiments are denoted by the same reference numerals as those in the first to fourth embodiments, and description thereof is omitted below.

Figure 12A:
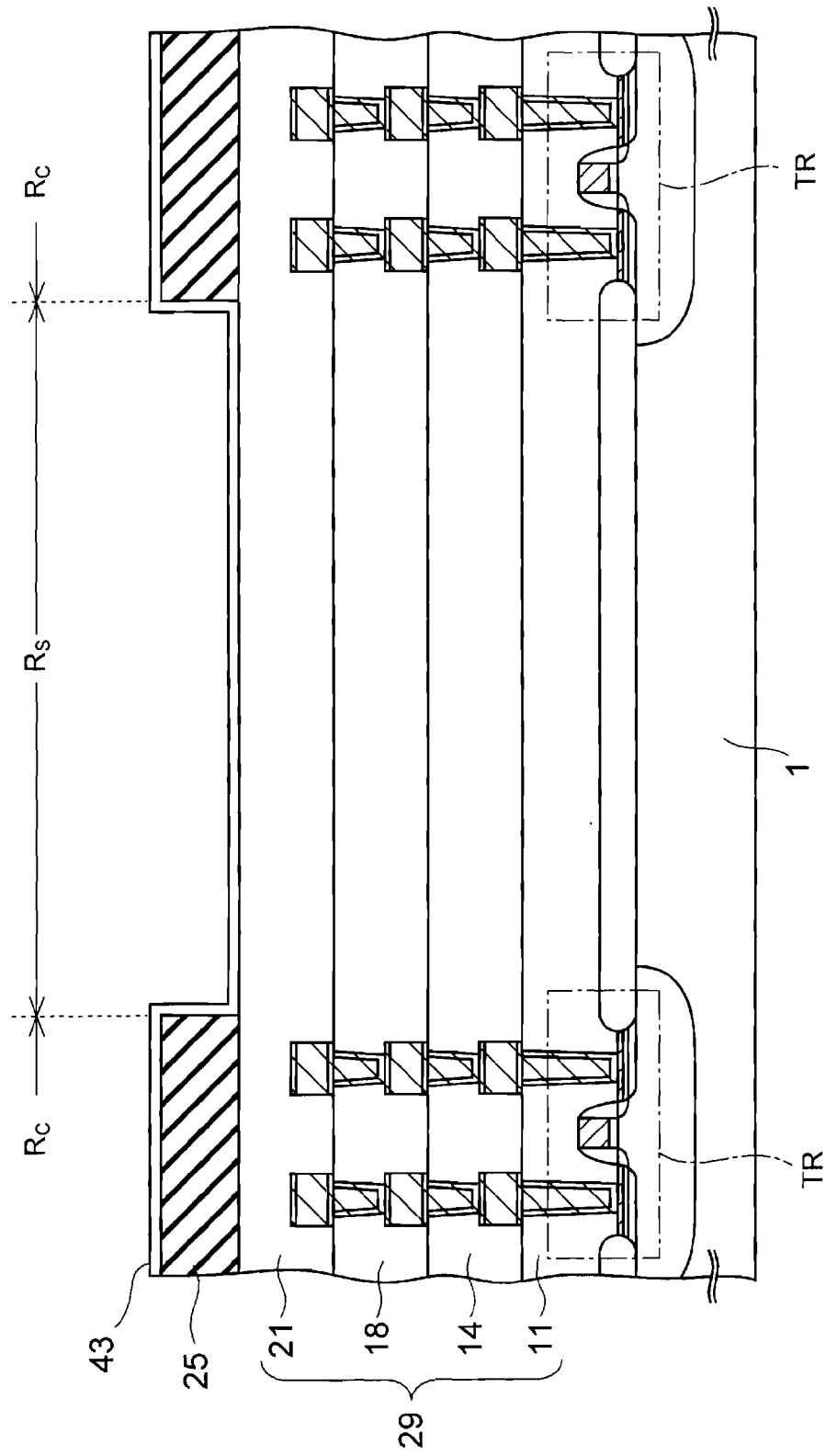

First, as illustrated in FIG. 12A, a fluorine-based resin thin film with a thickness of about 10 nm to 50 nm is formed by a laser ablation method as the hydrophobic thin film 43 on both the passivation film 25 and the multilayer film 29. Teflon can be used as a material of the fluorine resin thin film, as in the case of the first embodiment.

Figure 12B:
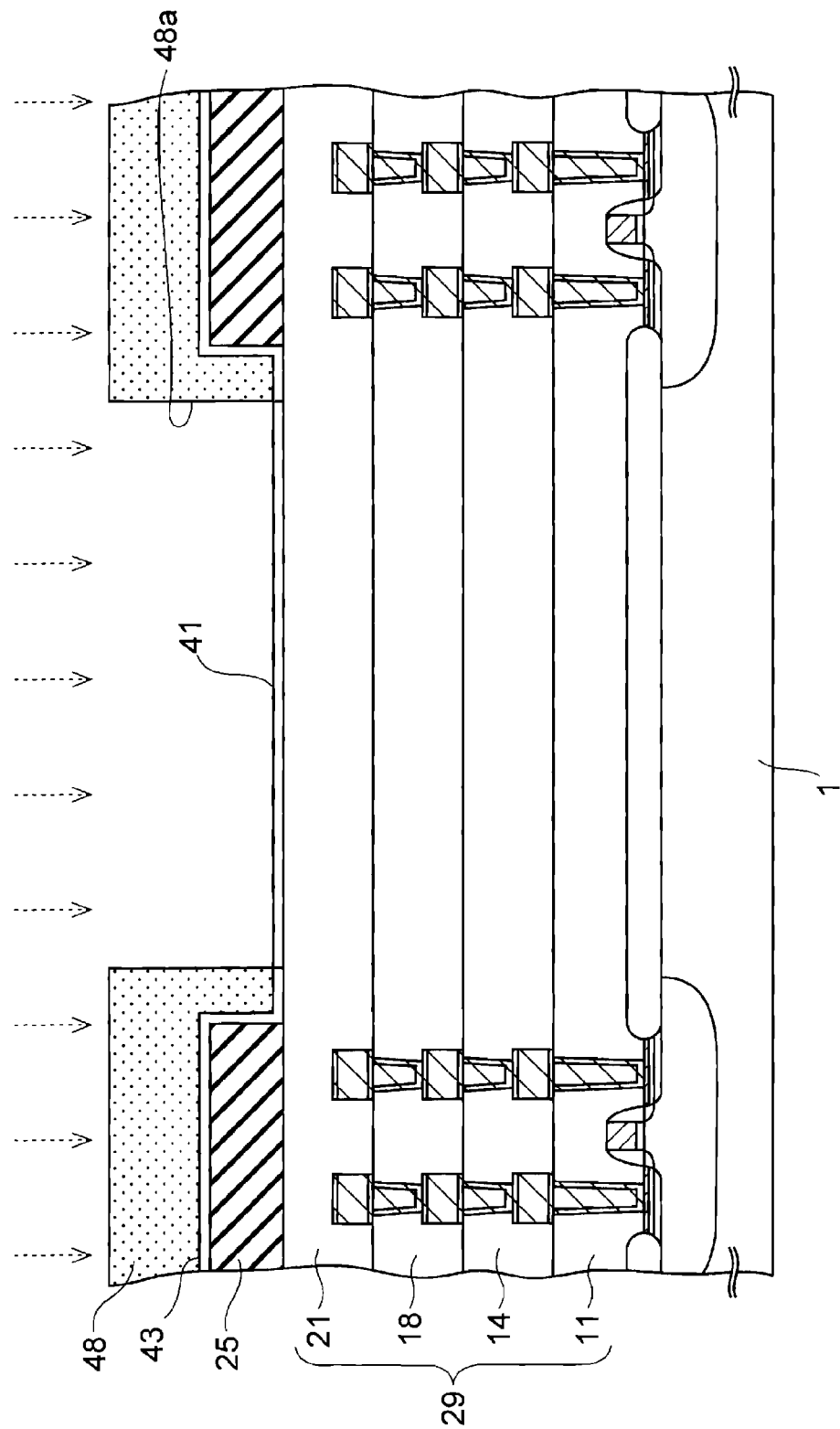

Next, as illustrated in FIG. 12B, a photoresist is applied onto the hydrophobic thin film 43, and exposed to light and developed to thereby form a resist pattern 48.

Thereafter, the hydrophobic thin film 43 is irradiated with a plasma through a window 48a of the resist pattern 48. This makes the hydrophobicity of the surface of the hydrophobic thin film 43 at the position exposed through the window 48a lower than that before the plasma irradiation. The hydrophobic thin film 43 at the position is converted into the hydrophilic thin film 41.

The plasma used in this step is not particularly limited. In the fifth embodiment, the hydrophobic thin film 43 is converted into a hydrophilic film by use of an oxygen plasma in the above-described manner.

Figure 12C:
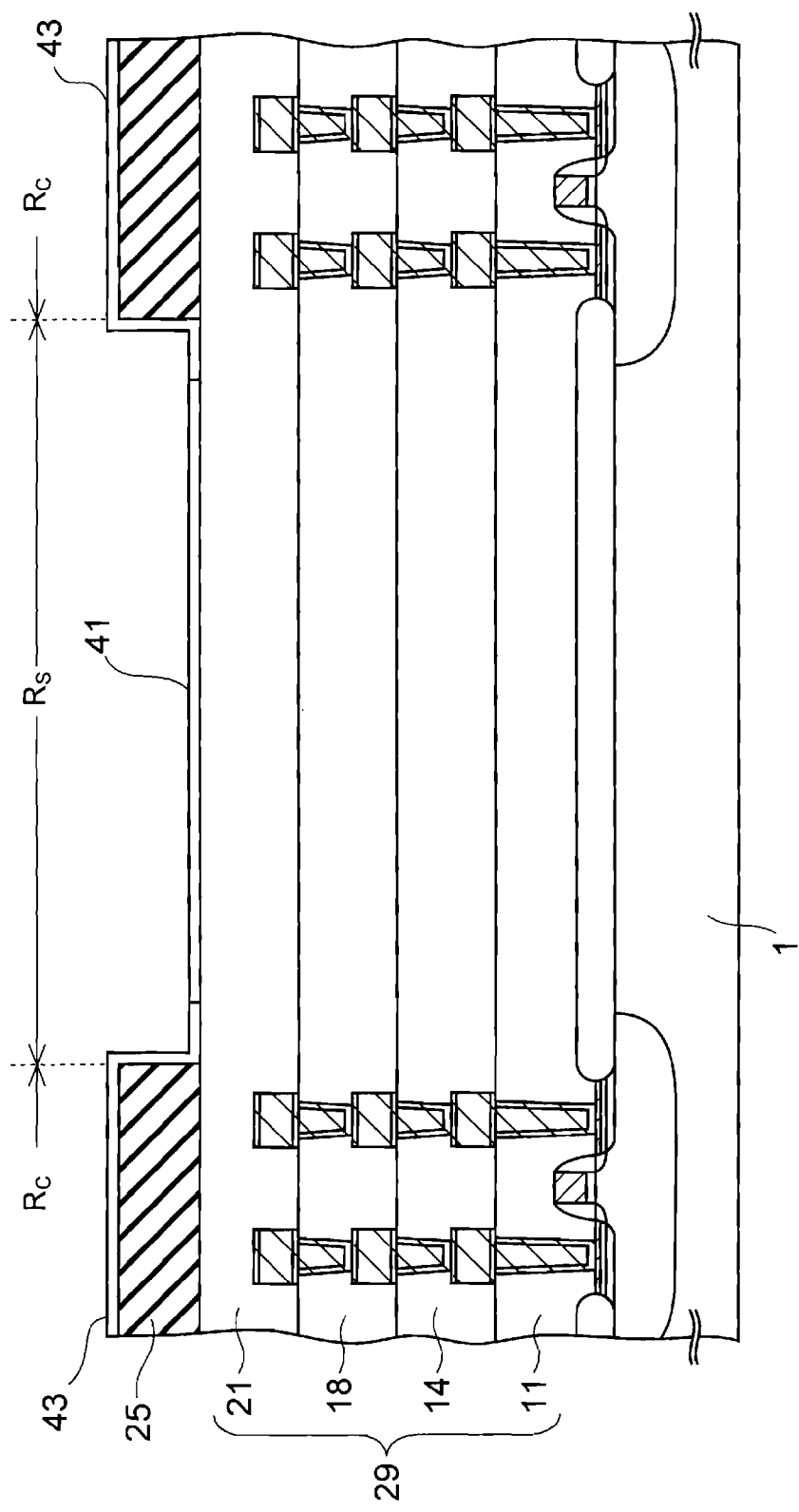

Then, after completion of the plasma treatment as described above, the resist pattern 48 is removed as illustrated in FIG. 12C.

Through these steps, a structure is obtained in which the hydrophobicity of the semiconductor substrate 30 is lower in the scribe region $R_s$ than in the semiconductor element regions $R_c$.

Next, as illustrated in FIG. 12D, PVA is applied into the window 25a by use of an unillustrated dispenser as in the case of the step of the first embodiment illustrated in FIG. 6B, and the PVA is thermally cured to form the protection film 35.

At this time, since the hydrophilic thin film 41 is formed in the scribe region $R_s$ as described above, the liquid PVA wets a surface of the hydrophilic thin film 41 and is spread thereto, but the liquid PVA does not wet the hydrophobic thin film 43 having a higher hydrophobicity than the hydrophilic thin film 41 and is not spread thereto. As a result, the protection film 35 can easily be formed only on the hydrophilic thin film 41 in the scribe region $R_s$.

After this step, laser ablation and dicing are carried out as in the case of the first embodiment, but detailed description thereof is omitted.

According to the fifth embodiment described above, the hydrophobic thin film 43 is converted into the hydrophilic thin film 41 by the plasma treatment. This makes it possible to form the protection film 35 selectively only on the hydrophilic thin film 41.

Sixth Embodiment

In each of the second to fifth embodiments, the protection film 35 shaped like a convex lens is formed only in a portion of the region in the window 25a of the passivation film 25.

Figure 13:
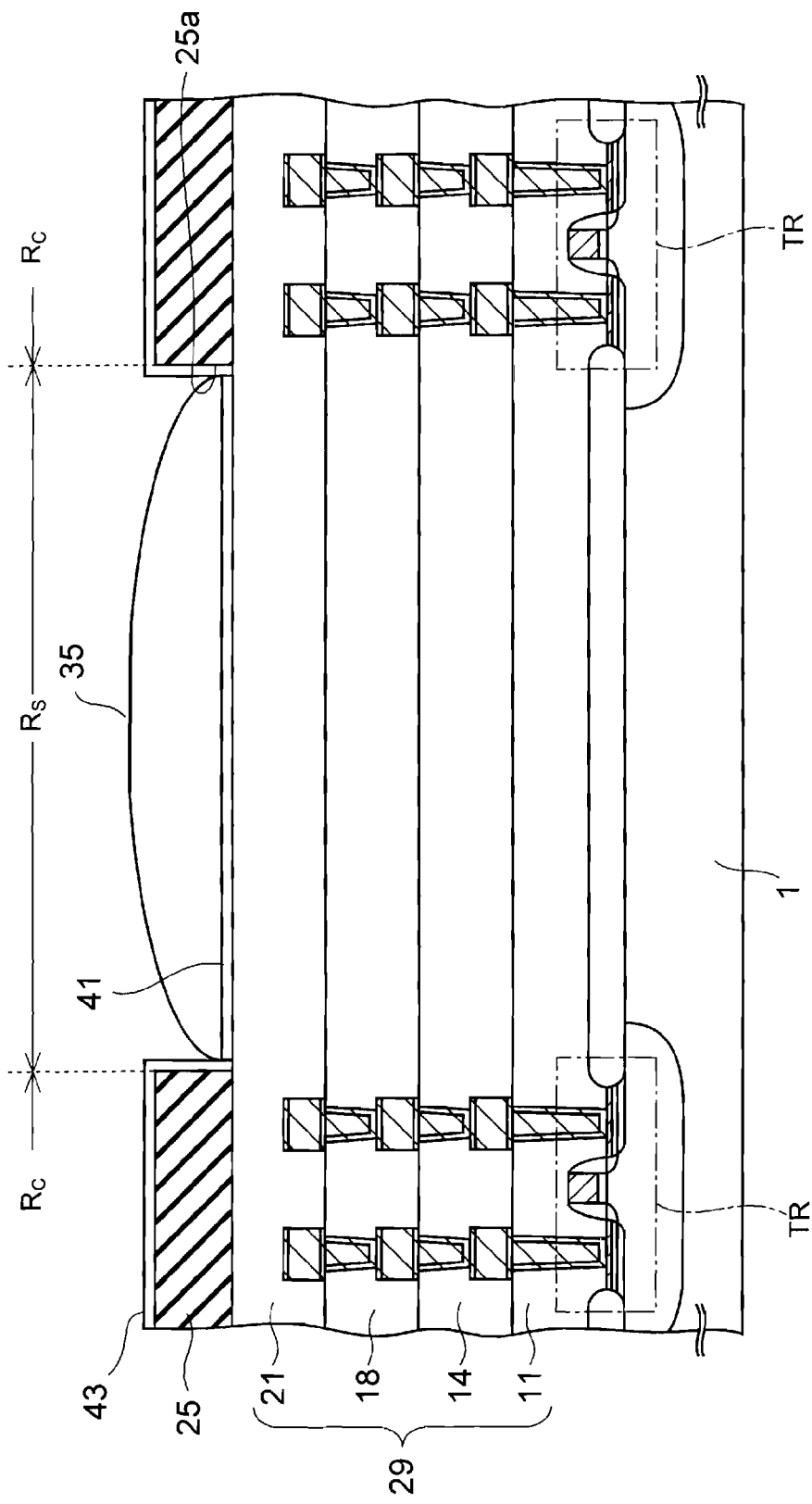
FIG. 13 is a cross-sectional view in case of forming a protection film over the entire region in a window of a passivation film in a sixth embodiment.

In contrast, in a sixth embodiment, as illustrated in the cross-sectional view of FIG. 13, the protection film 35 is formed in the entire region in the window 25a.

Figure 14:
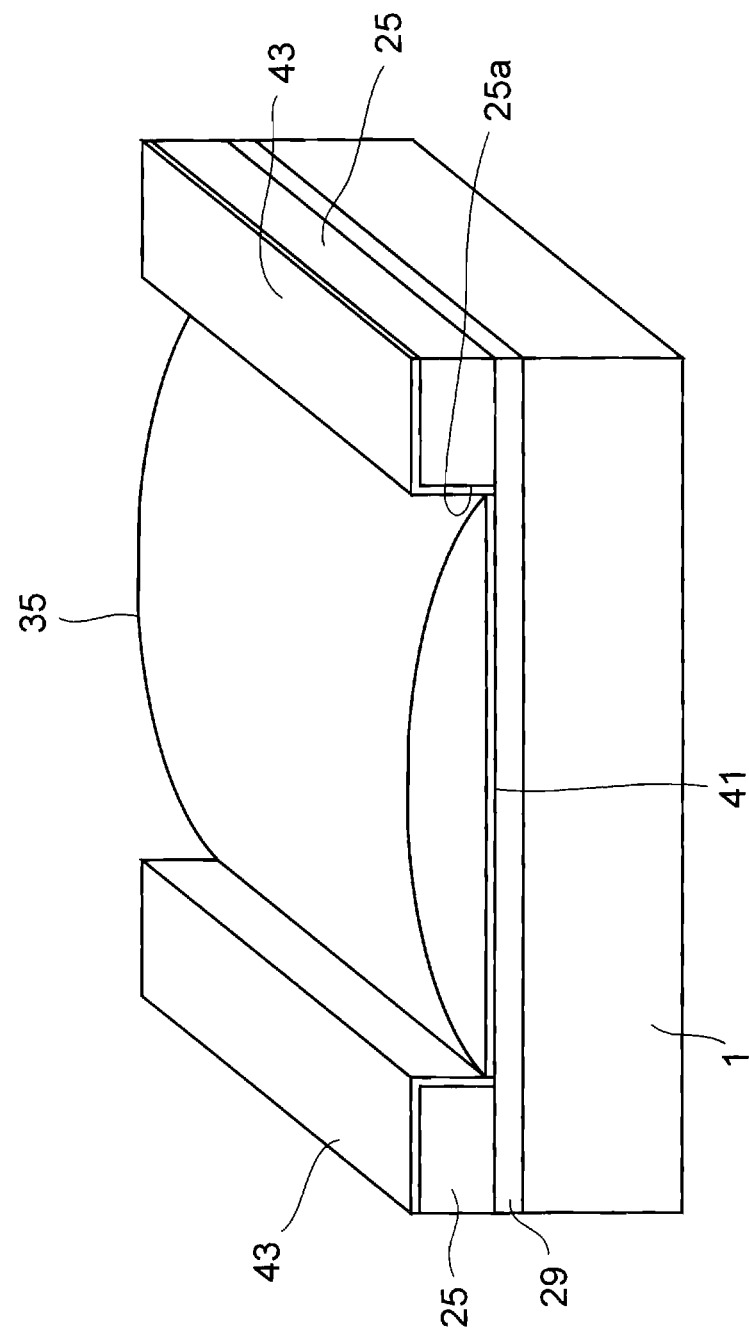
FIG. 14 is a perspective view in case of forming the protection film over the entire region in the window of the passivation film as in FIG. 13.

FIG. 14 is a perspective view of a semiconductor device in such a case.

By forming the protection film 35 in the entire region in the window 25a as in the sixth embodiment, or in only a portion of the region in the window 25a as in the second to fifth embodiments, the radius of curvature of the top surface of the protection film 35 can be changed, and thus the focal length of the protection film 35 can be adjusted.

Meanwhile, as a method for adjusting the focal length of the protection film 35, there is a method in which the thickness of the protection film 35 is changed as follows.

Figure 15:
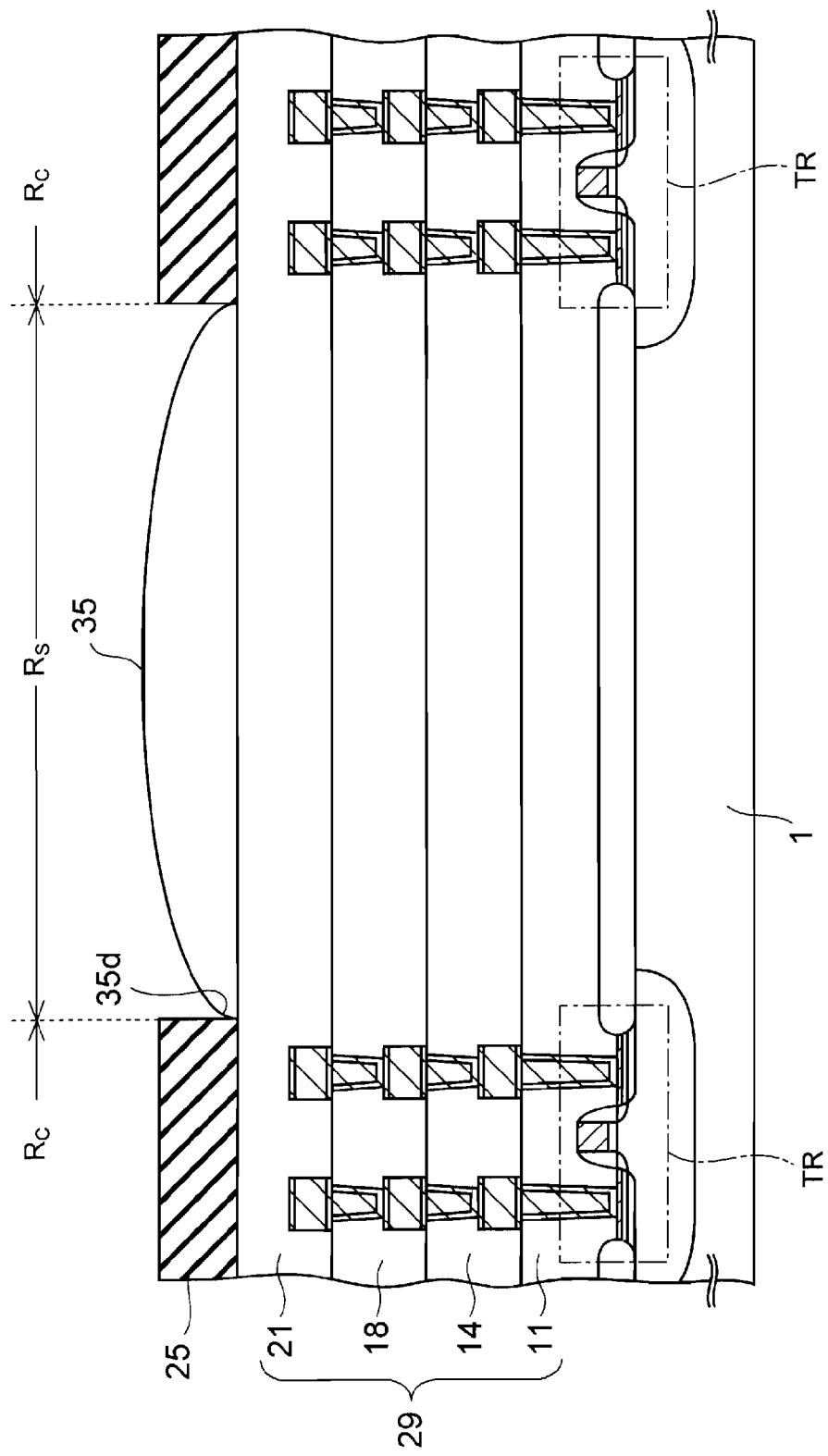
FIG. 15 is a cross-sectional view in case of lowering end portion of a top surface of the protection film rather than that of a top surface of the passivation film in the sixth embodiment.

FIG. 15 is a cross-sectional view in case that the thickness of the protection film 35 is made smaller than that in the first embodiment by making each end portion 35d of the top surface of the protection film 35 formed in the first embodiment lower than the top surface of the passivation film 25. By changing the thickness of the protection film 35 as described above, the focal length of the protection film 35 can be adjusted.

Figure 16:
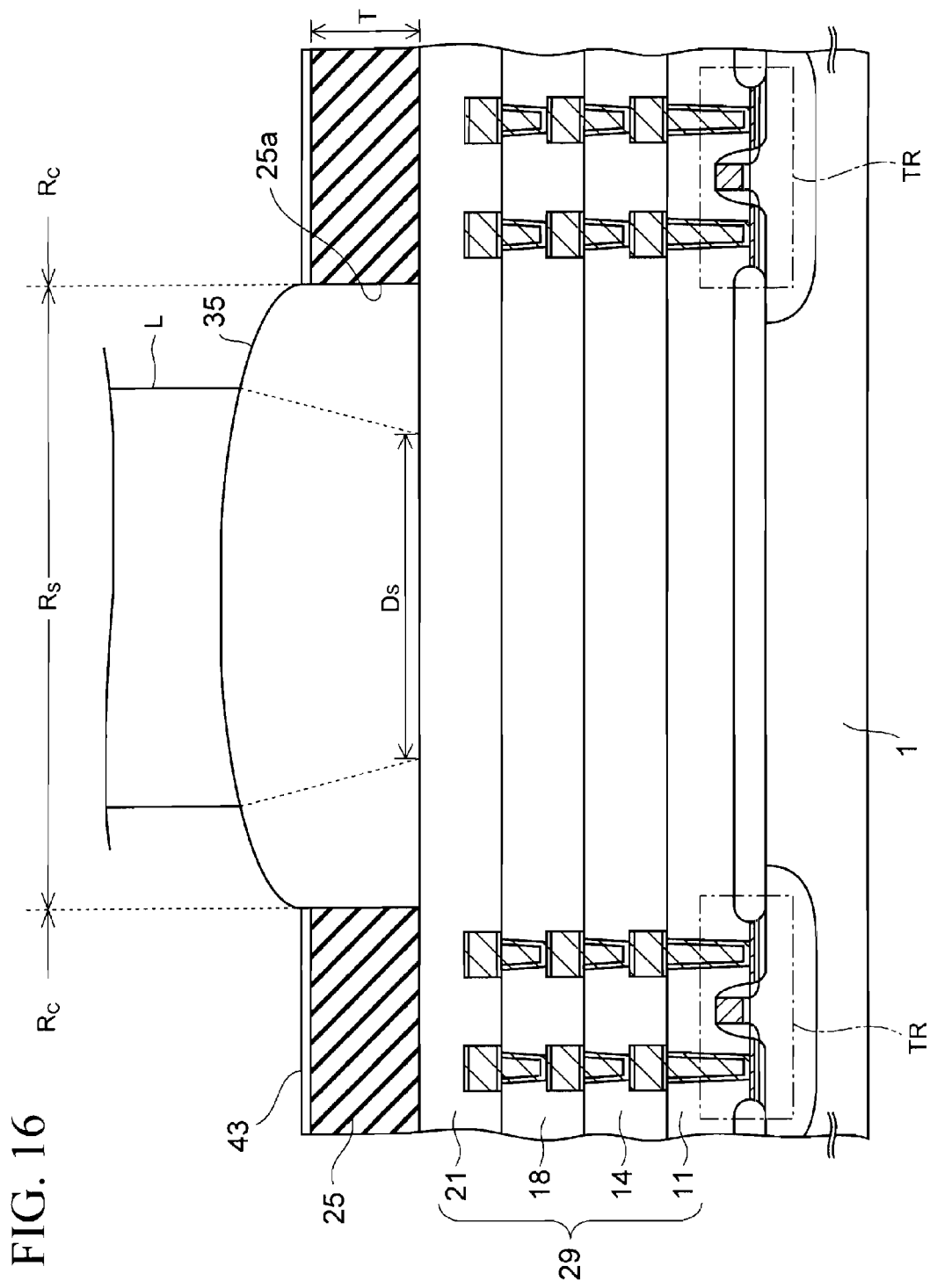
FIG. 16 is a cross-sectional view in case of forming the protection film to have a thickness such that the window of the passivation film is completely filled with the protection film in the sixth embodiment.

Meanwhile, as illustrated in FIG. 16, the protection film 35 may be formed to have a thickness large enough to completely fill the window 25a of the passivation film 25, and the thickness T of the passivation film 25 may be changed to adjust the focal length of the protection film 35.

Suppose a case where the thickness T of the passivation film 25 is 2 μm, the refractive index of the protection film 35 is 1.5, and the radius of curvature of the top surface thereof is 2.5 μm in the example of FIG. 16. In such a case, the protection film 35 functions as a convex lens having a focal length f of approximately 7 μm, and the spot diameter $D_s$ on the surface of the multilayer film 29 is about 1 μm.

Note that, by using the refractive index n and the radius of curvature r of the protection film 35, the focal length f in this case can be approximated by the equation: $f=(n-1)/r$. In addition, for this calculation, the laser beam L is assumed to be parallel light.

In addition, in the example of FIG. 16, the hydrophobic thin film 43 is formed in accordance with the second embodiment in order to prevent the formation of the protection film 35 on the passivation film 25. When, however, the hydrophobicity of the surface of the passivation film 25 is sufficiently high, the hydrophobic thin film 43 may be omitted.

Seventh Embodiment

In the embodiment, lateral surfaces of the window 25a of the passivation film 25 are inclined like a taper in the following manner.

FIGS. 17A to 17E are cross-sectional views of semiconductor devices in the course of manufacturing thereof according to the seventh embodiment. Note that, in these drawings, elements which are the same as those in the first embodiment are denoted by the same reference numerals as those in the first embodiment, and description thereof is omitted below.

Figure 17A:
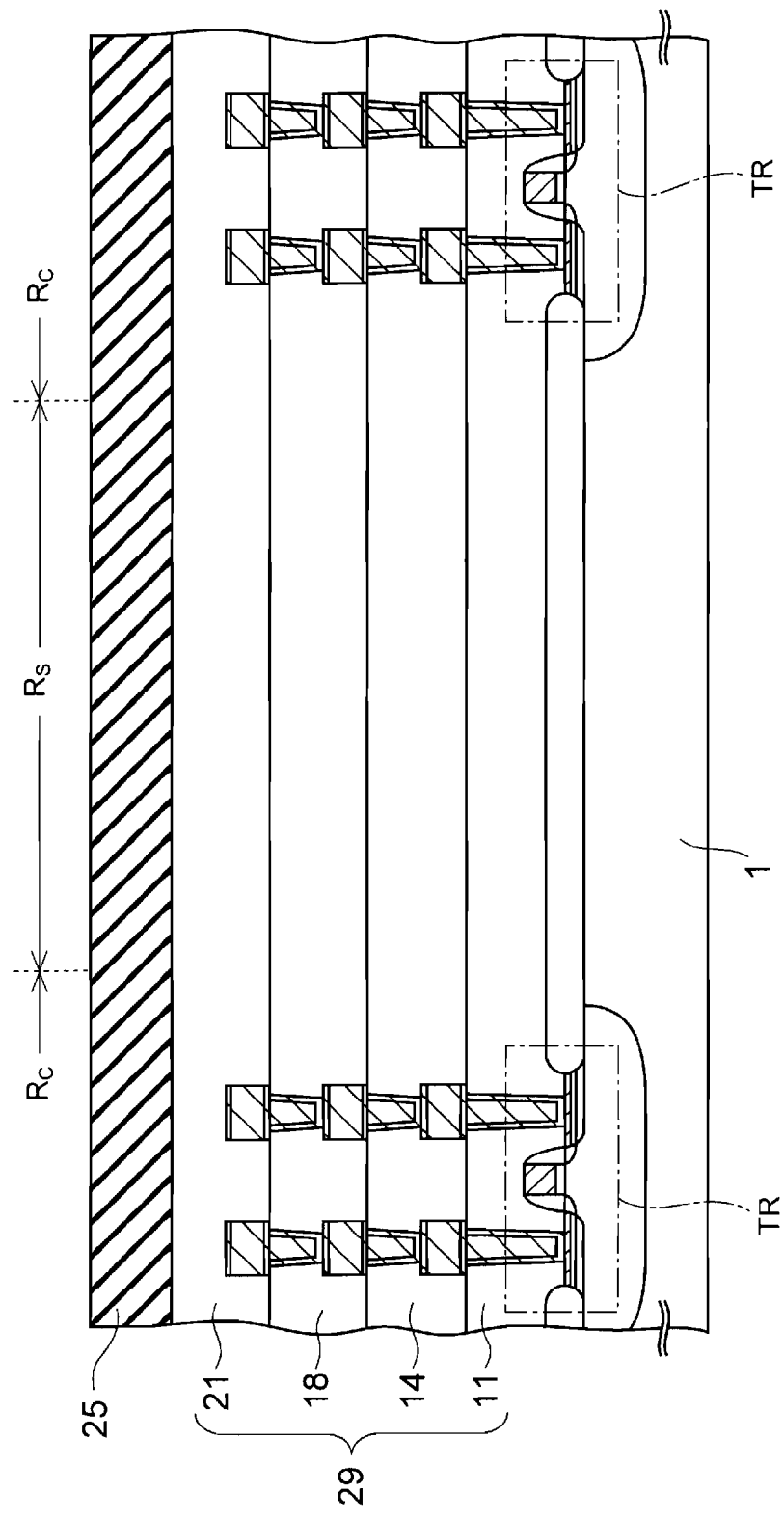
FIGS. 17A to 17E are cross-sectional views of semiconductor devices in the course of manufacturing thereof according to a seventh embodiment.

First, as illustrated in FIG. 17A, a polyimide coating film is formed on the multilayer film 29, and is thermally cured to form the passivation film 25.

Figure 17B:
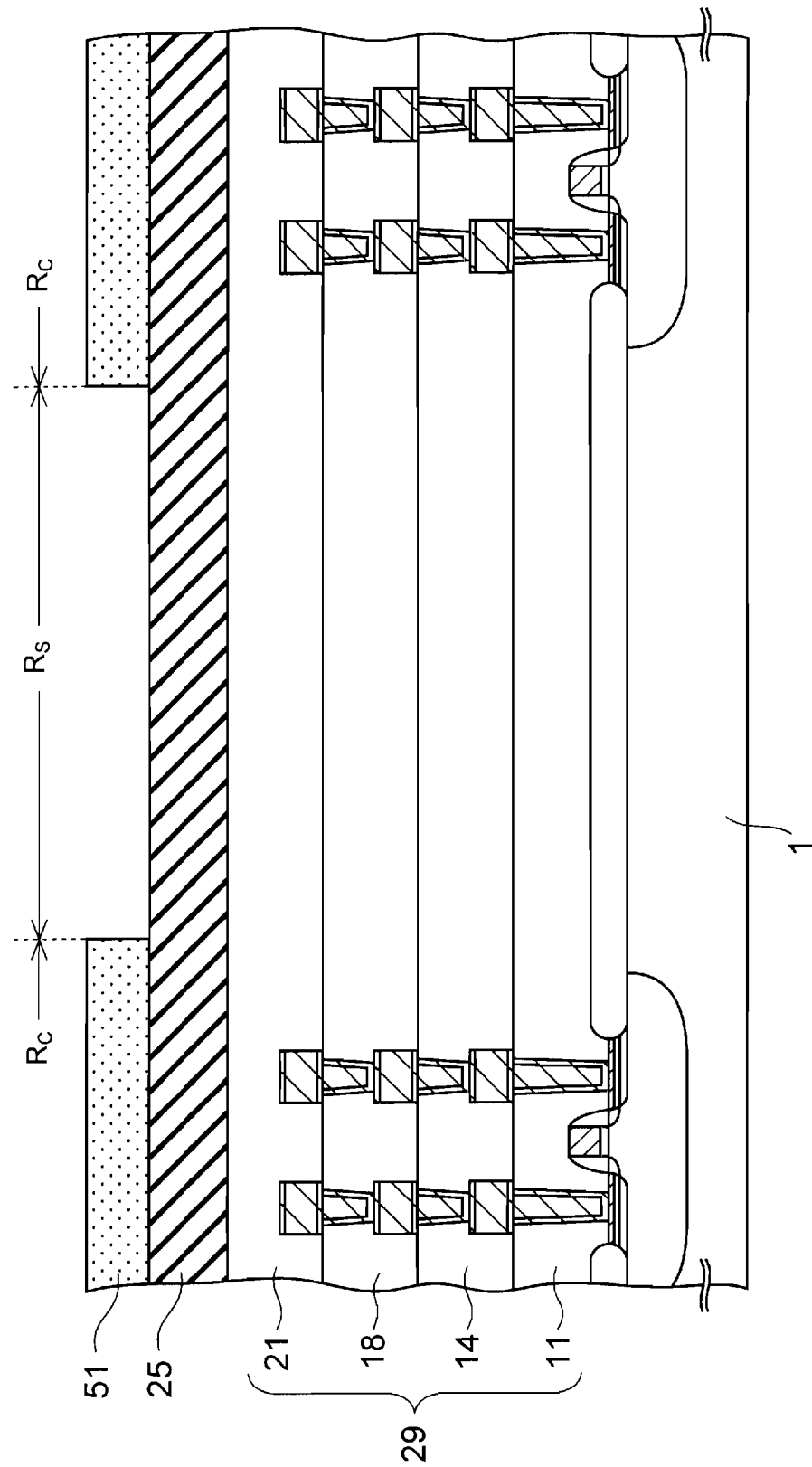

Next, as illustrated in FIG. 17B, a photoresist is applied onto the passivation film 25. Then, the photoresist is exposed to light and developed to form a resist pattern 51.

Figure 17C:
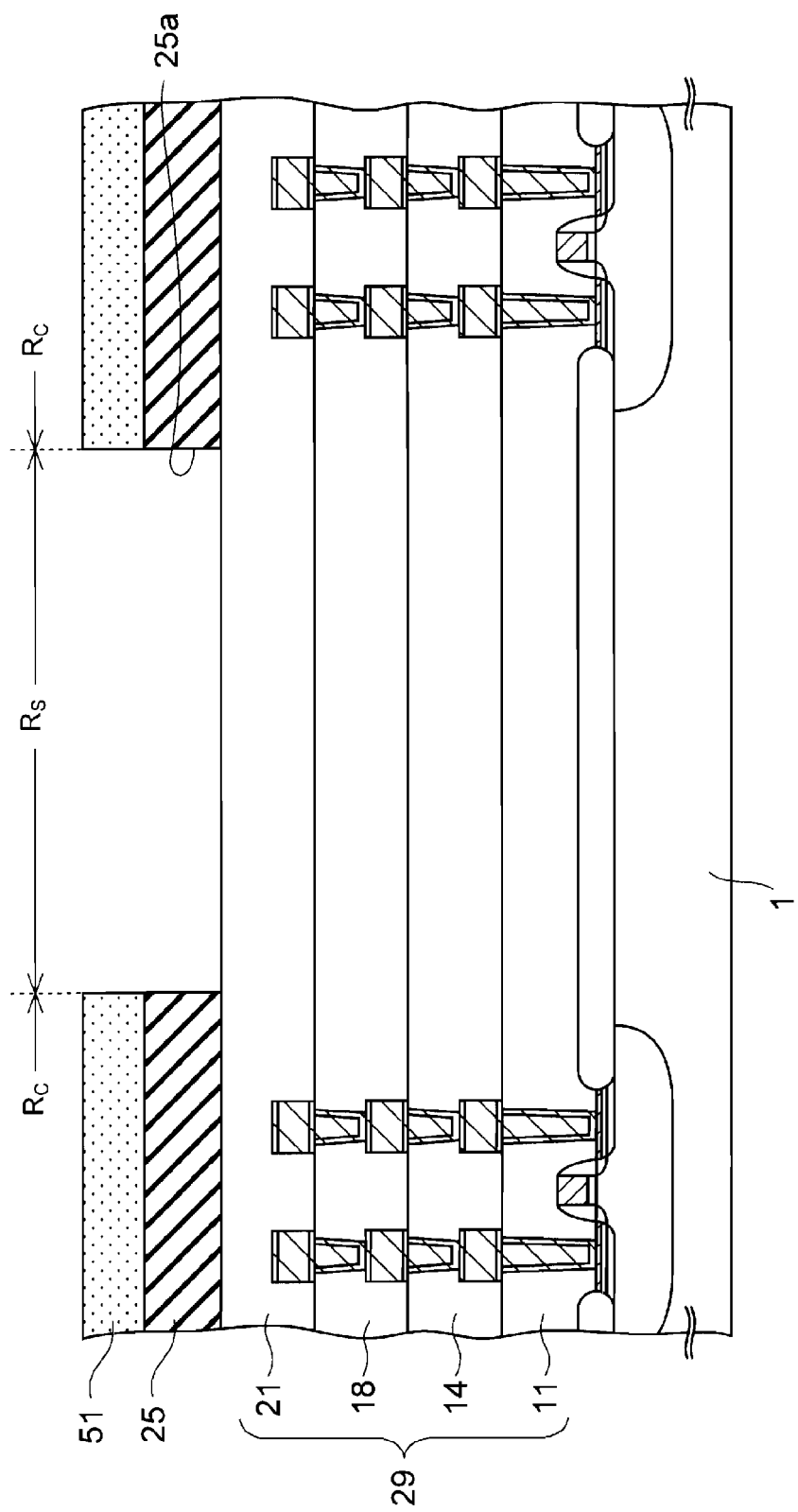

Subsequently, as illustrated in FIG. 17C, by use of the resist pattern 51 as a mask, the passivation film 25 is wet etched with an etchant such as an aqueous solution of tetramethylammonium hydroxide (TMAH), or the like to thereby form the window 25a of the passivation film 25 in the scribe region $R_s$.

Figure 17D:
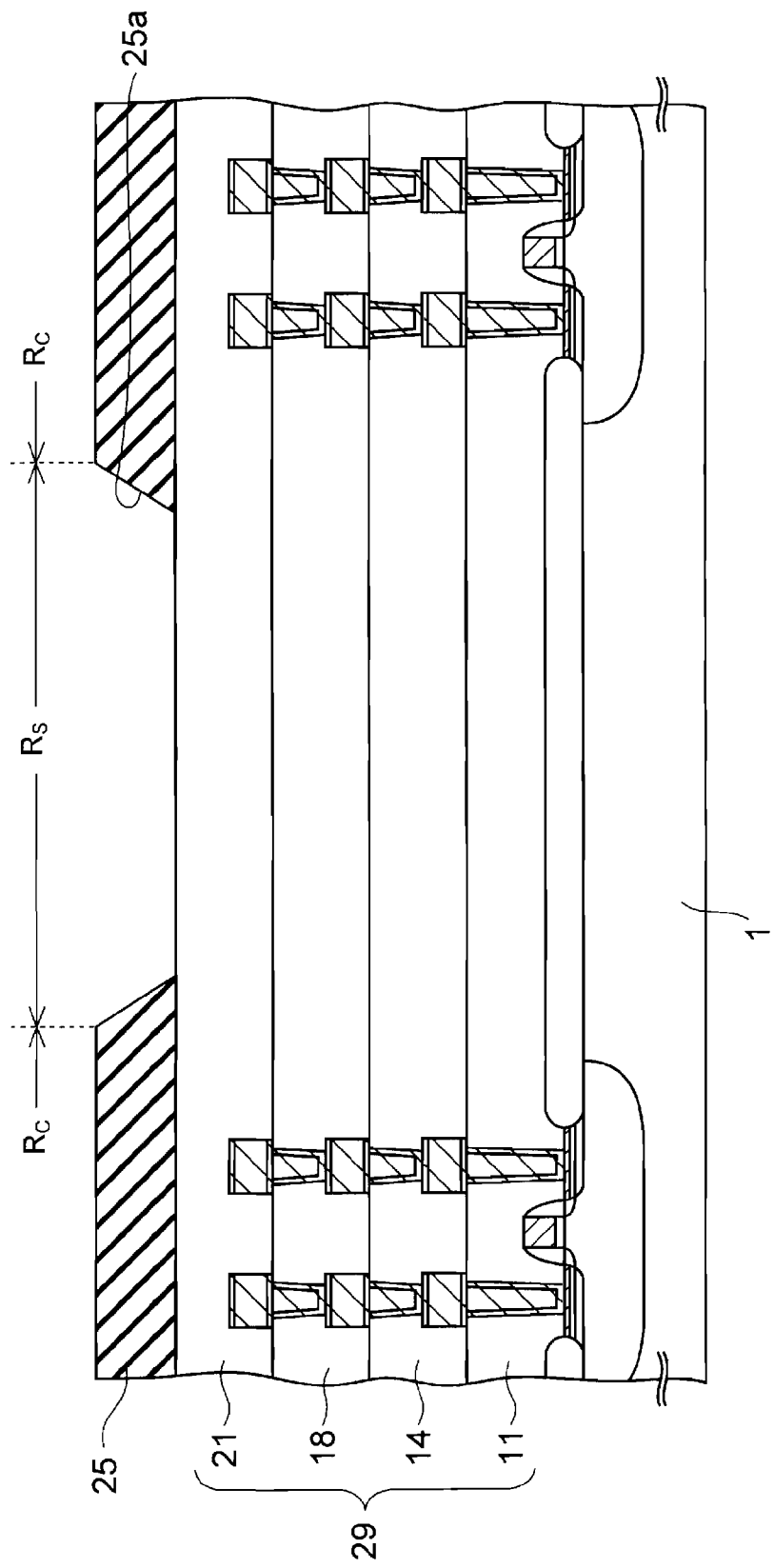

Thereafter, as illustrated in FIG. 17D, the passivation film 25 is heated to a temperature, for example, 300 to 400° C. at which polyimide as the material of the passivation film 25 is softened. As a result, the lateral surfaces of the window 25a sag and incline like a taper, and thereby the open end of the window 25a becomes wider on the upper side than on the lower side.

Figure 17E:
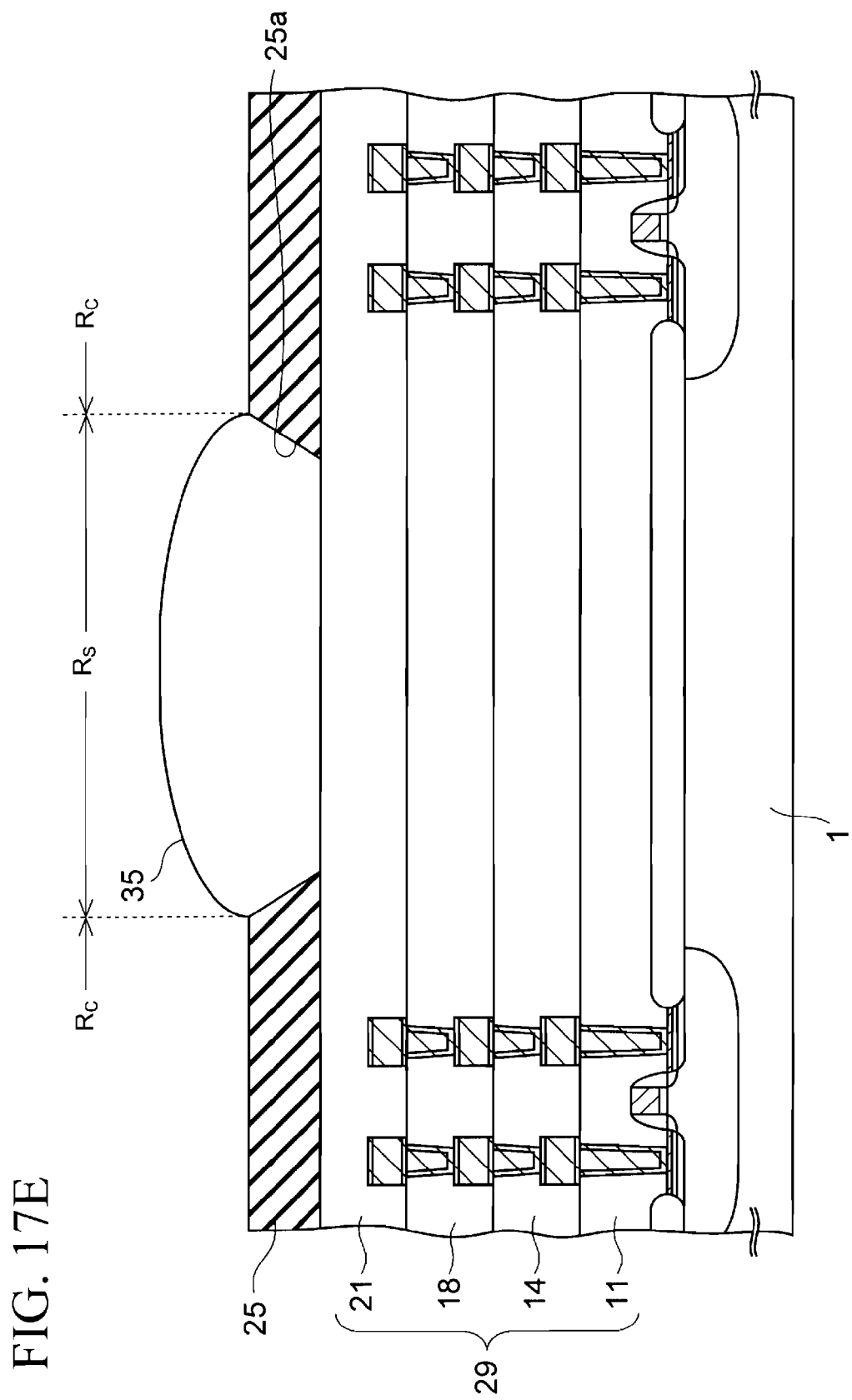

Subsequently, as illustrated in FIG. 17E, PVA is applied into the window 25a by use of an unillustrated dispenser, and the PVA is thermally cured at a temperature of approximately 150 to 160° C. to form the protection film 35.

At this time, since the lateral surfaces of the window 25a are shaped like a taper as described above, the PVA is easily supported by the lateral surfaces from the lower side, so that a surface shape of the liquid PVA before the curing is stabilized.

After this step, laser ablation and dicing are carried out as in the case of the first embodiment, but detailed description thereof is omitted.

According to the seventh embodiment described above, the lateral surfaces of the window 25a of the passivation film 25 are shaped like a taper. Accordingly, the liquid PVA as the material of the protection film 35 is supported by the lateral surfaces from the lower side, so that the lens shape of the top surface of the protection film 35 is stabilized.

Eighth Embodiment

In the embodiment, two protection films 35 are formed in the scribe region $R_s$ as follows.

FIGS. 18A to 18E are cross-sectional views of semiconductor devices in the course of manufacturing thereof according to the eighth embodiment, and FIGS. 19A to 19D are plan views of the semiconductor devices. Note that, in these drawings, elements which are the same as those in the first embodiment are denoted by the same reference numerals as those in the first embodiment, and description thereof is omitted below.

Figure 18A:
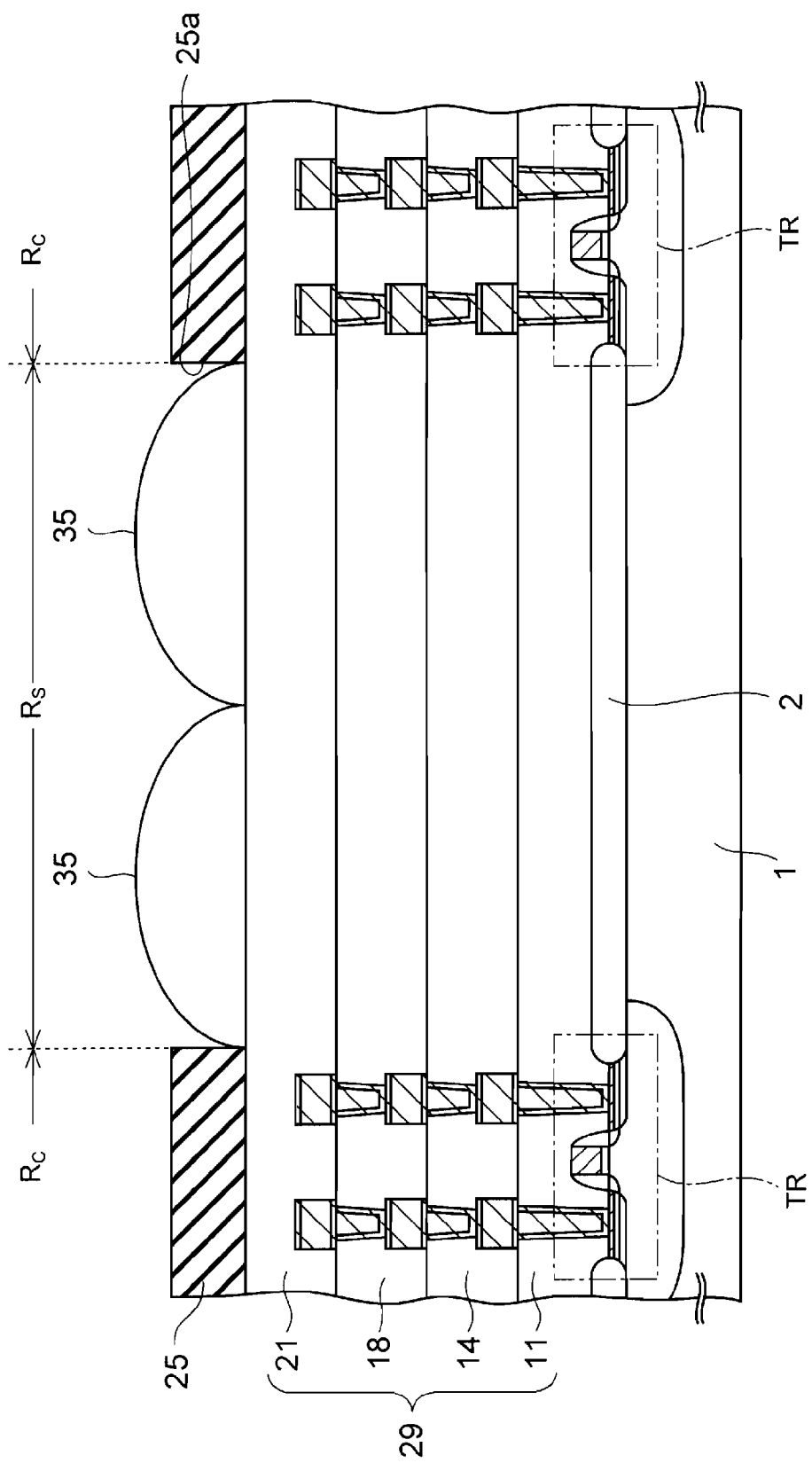
FIGS. 18A to 18E are cross-sectional views of semiconductor devices in the course of manufacturing thereof according to an eighth embodiment.

First, as illustrated in FIG. 18A, PVA is applied onto the multilayer film 29 exposed through the window 25a of the passivation film 25 by use of an unillustrated dispenser, and the PVA is thermally cured to form two protection films 35.

Although the sequence of the formation of the protection films 35 is not particularly limited, for example, it is preferable that PVA be applied in a row and thermally cured to form one of the protection films 35, followed by applying PVA in another row to the other protection film 35. As described above, by thermally curing the one of the protection films 35, followed by forming the other one of the protection films 35, the two protection films 35 can be prevented from being mixed with each other.

Figure 19A:
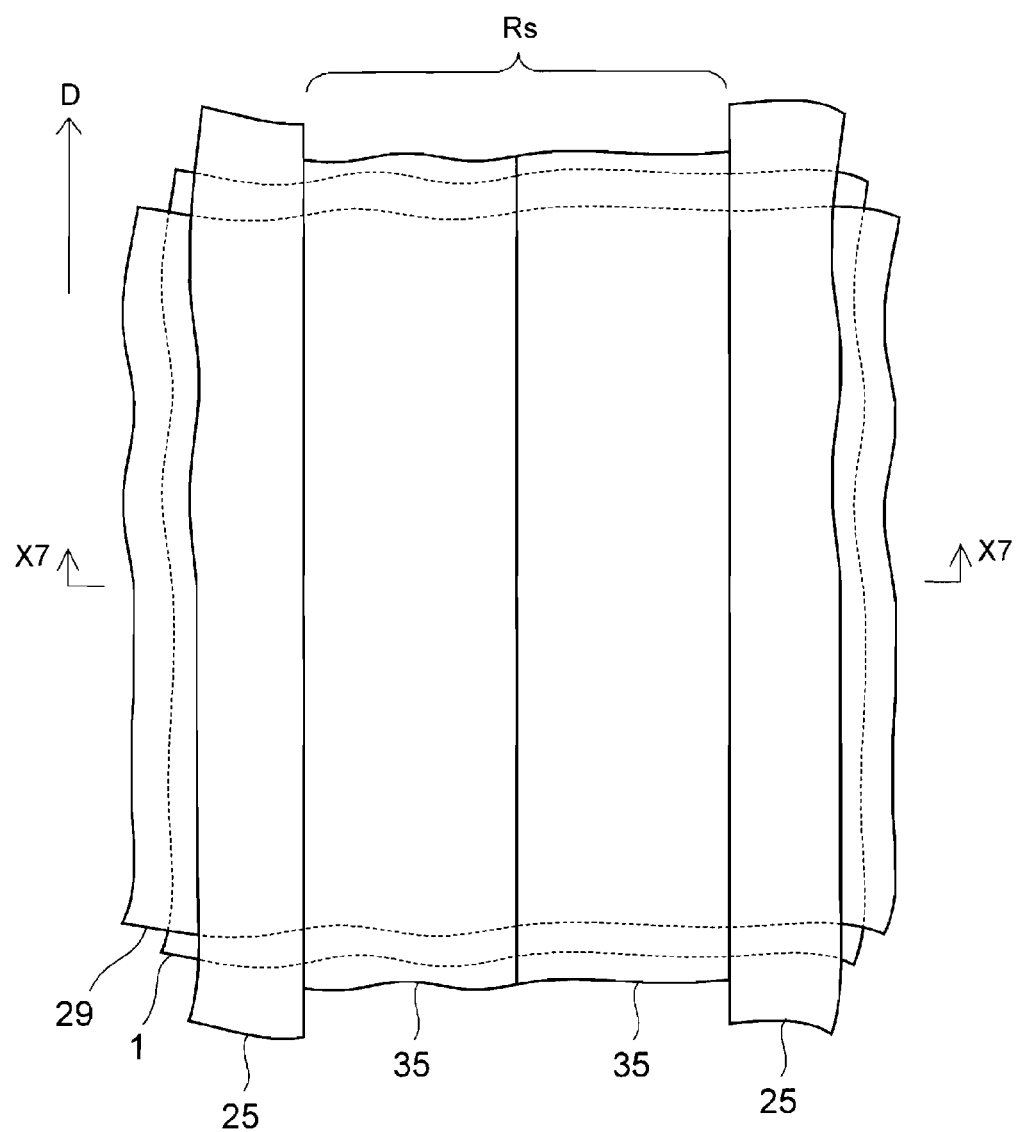
FIGS. 19A to 19D are plan views of the semiconductor devices in the course of manufacturing thereof according to the eighth embodiment.

FIG. 19A is a plan view of the semiconductor substrate 30 after completion of this step, and FIG. 18A mentioned above is a cross-sectional view taken along the line X7-X7 of FIG. 19A.

As illustrated in FIG. 19A, each of the two protection films 35, in a plan view, has a belt-like shape, elongated in the extending direction D of the scribe region $R_s$.

Figure 18B:
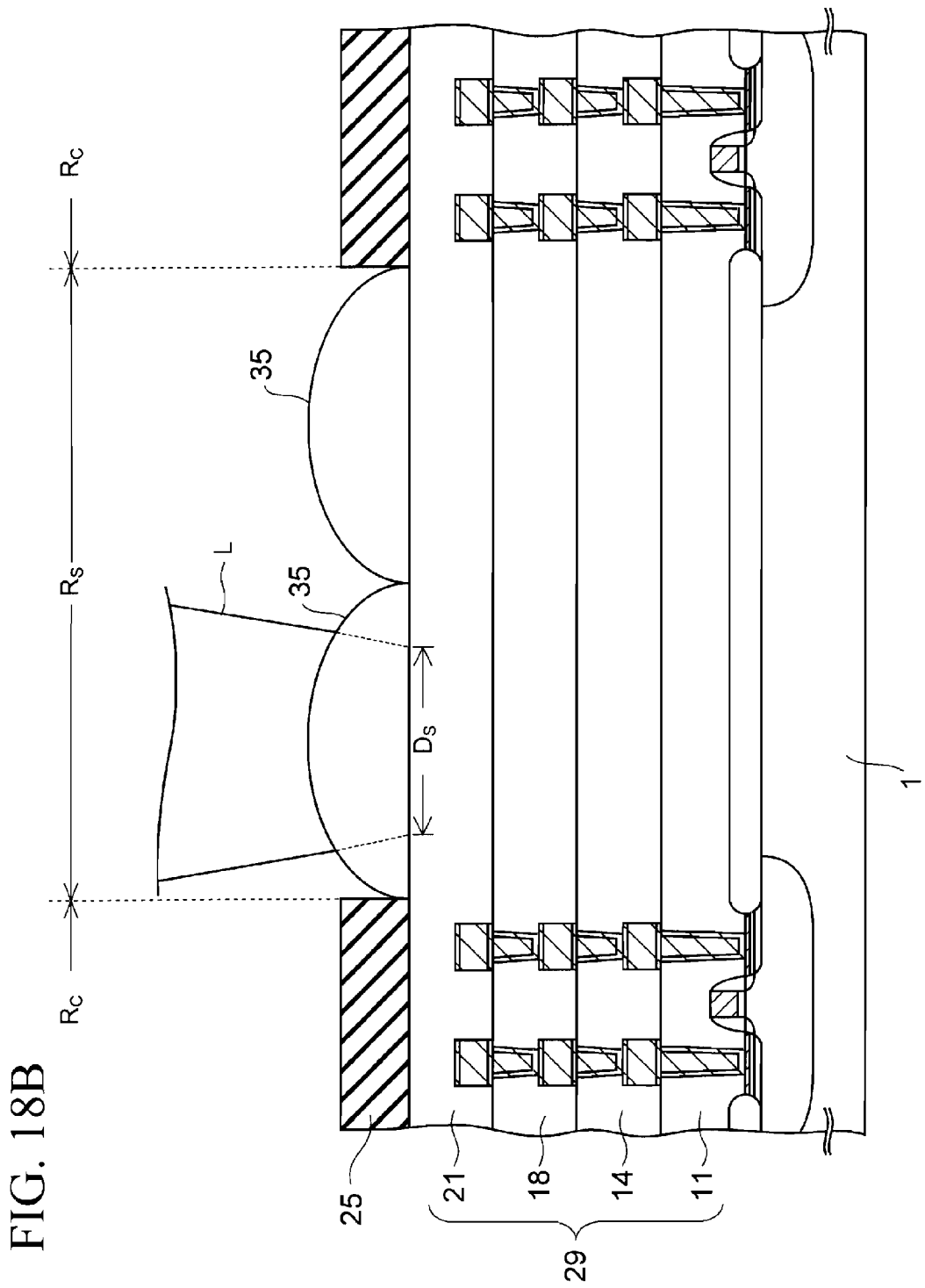

Next, as illustrated in FIG. 18B, the multilayer film 29 is irradiated with a laser beam L through each protection film 35, and thus laser grooving on the multilayer film 29 is started.

At this time, each protection film 35 functions as a lens condensing the laser beam L as in the case of the first embodiment. Accordingly, it is possible to prevent the spot diameter $D_s$ of the laser beam L on the multilayer film 29 from varying due to the position on the multilayer film 29.

Note that, as described in the first embodiment, when the laser beam L is parallel light, the focal length f of each protection film 35 can be approximated by the equation: $f=(n-1)/r$, using the refractive index n and the radius of curvature r of the protection film 35. For example, when the refractive index n is 1.5, and the radius of curvature r is 2.5 μm, the focal length f of each protection film 35 becomes 5 μm, and the spot diameter $D_s$ of the laser beam L becomes about 1 μm.

Figure 19B:
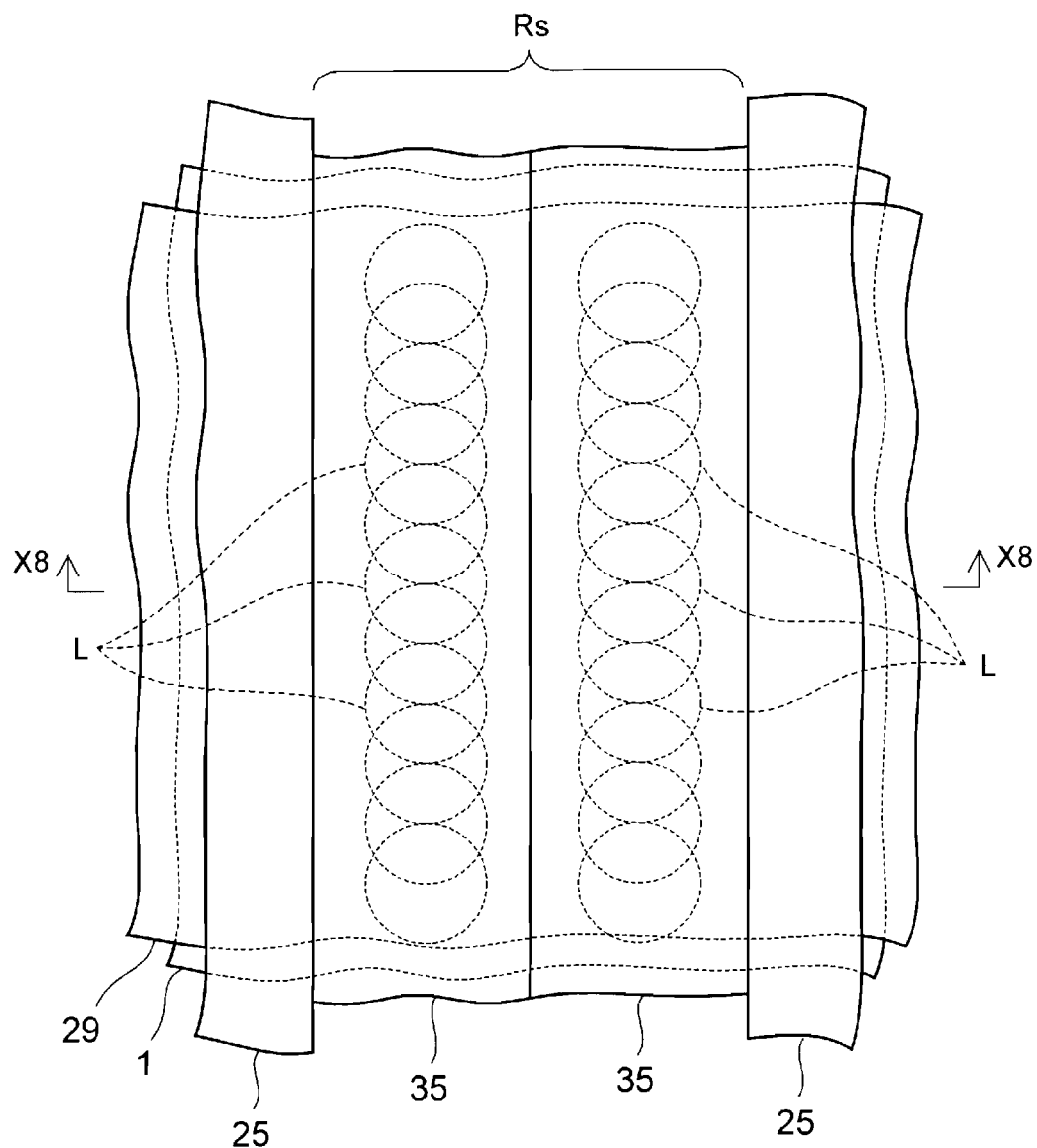

FIG. 19B is a plan view illustrating the positions of the irradiation with the laser beam L in this step, and FIG. 18B mentioned above is a cross-sectional view taken along the line X8-X8 of FIG. 19B.

As illustrated in FIG. 19B, the laser beam L is applied onto each of the two protection films 35 in a pulsed manner. After the protection film 35 in one row is irradiated with the laser beam L, the protection film 35 in the other row is irradiated with the laser beam L.

Figure 18C:
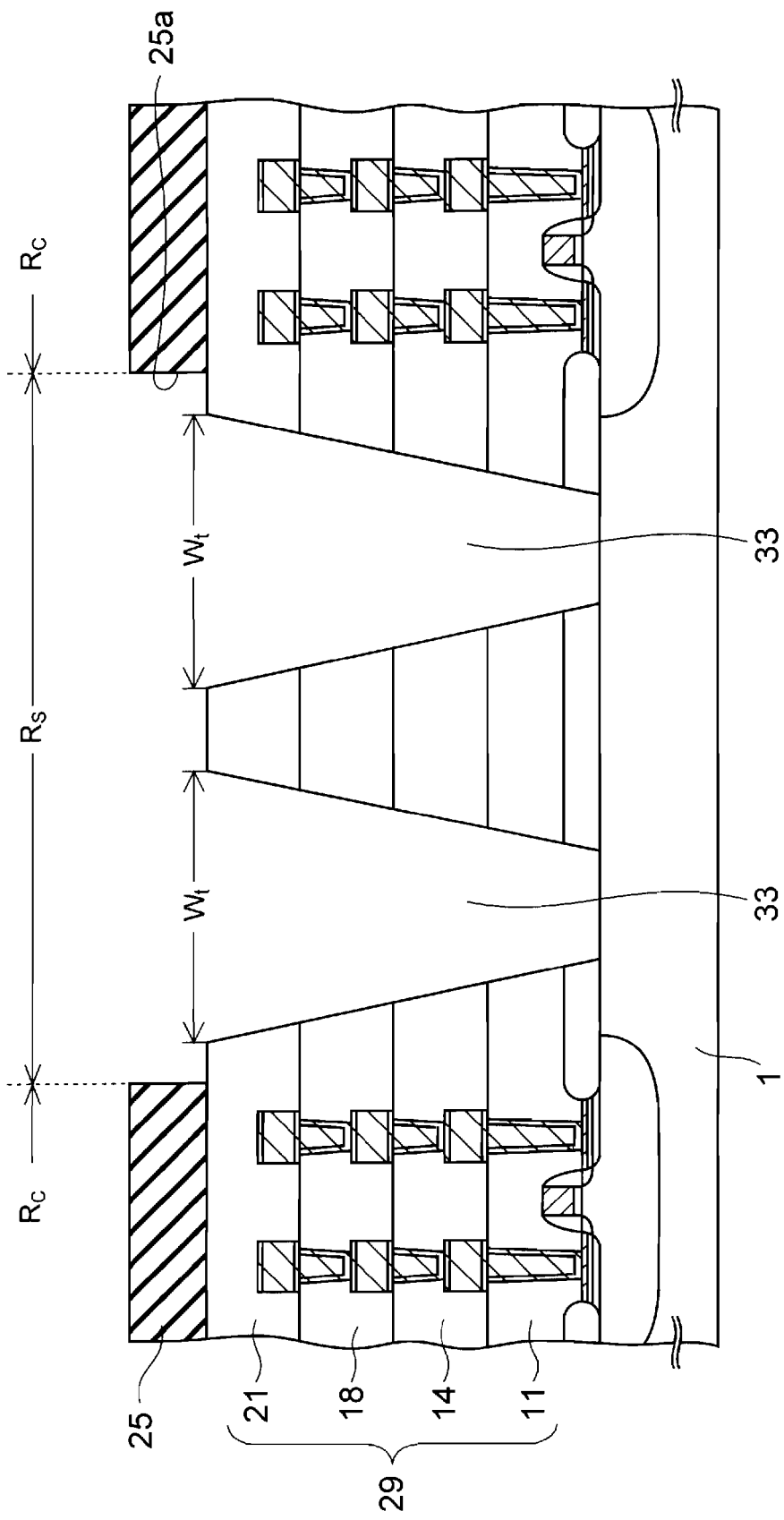

As a result of such laser grooving, as illustrated in FIG. 18C, two grooves 33 are formed in the multilayer film 29 and the underlying element isolation insulating film 2.

Here, the variation in the spot diameter of the laser beam L is suppressed by the lens effect of each of the protection films 35 as described above. Hence, the width $W_L$ of each of the grooves 33 formed by the laser beam L is also stabilized.

Note that the water soluble protection films 35 used for condensing the laser beam L may be removed by washing with water after completion of this step, or removed by use of water supplied during the dicing to be described later.

Figure 19C:
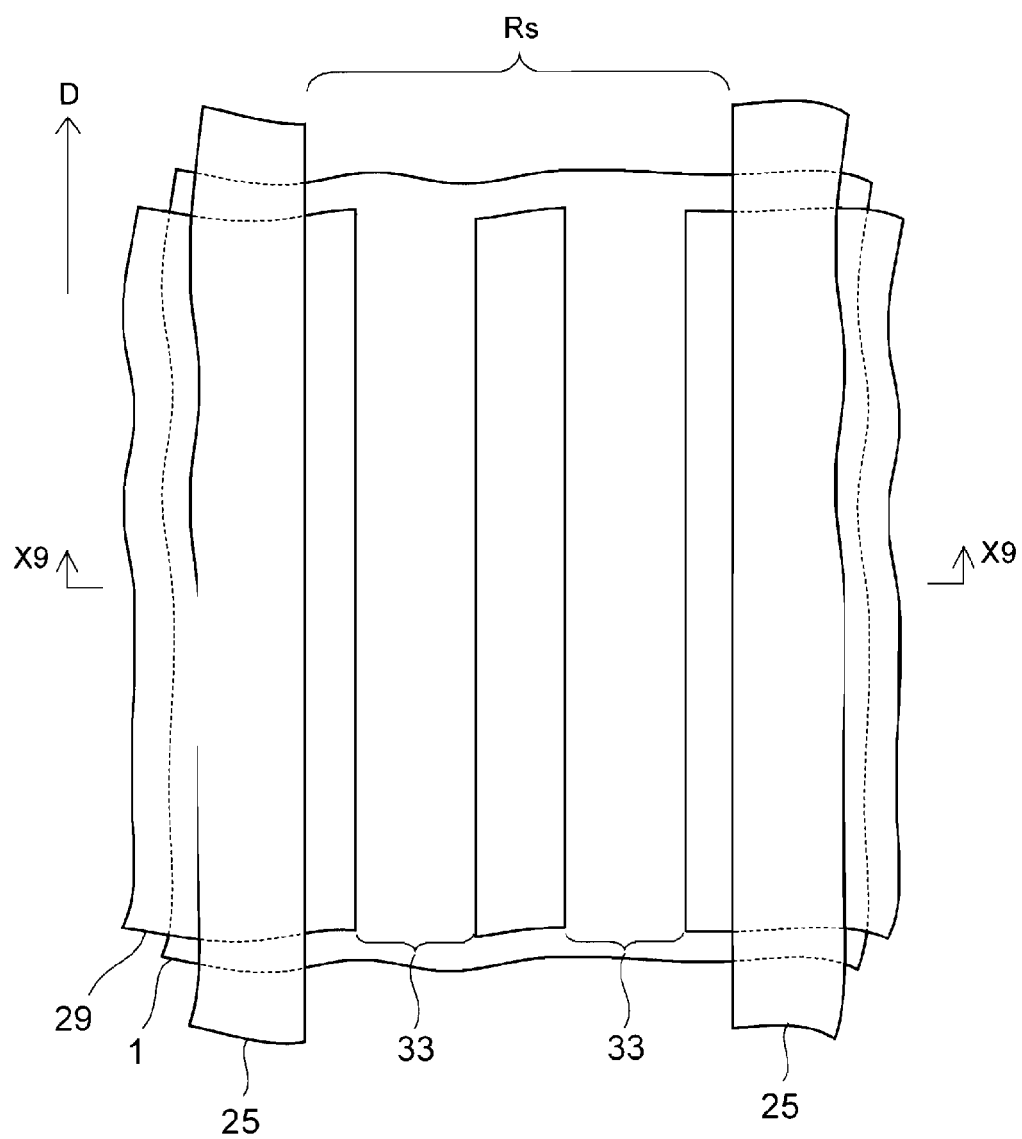

FIG. 19C is a plan view after the grooves are formed, and FIG. 18C mentioned above is a cross-sectional view taken along the line X9-X9 of FIG. 19C.

As illustrated in FIG. 19C, the two grooves 33 are formed in parallel to each other and extend in the extending direction D of the scribe region $R_s$.

Figure 18D:
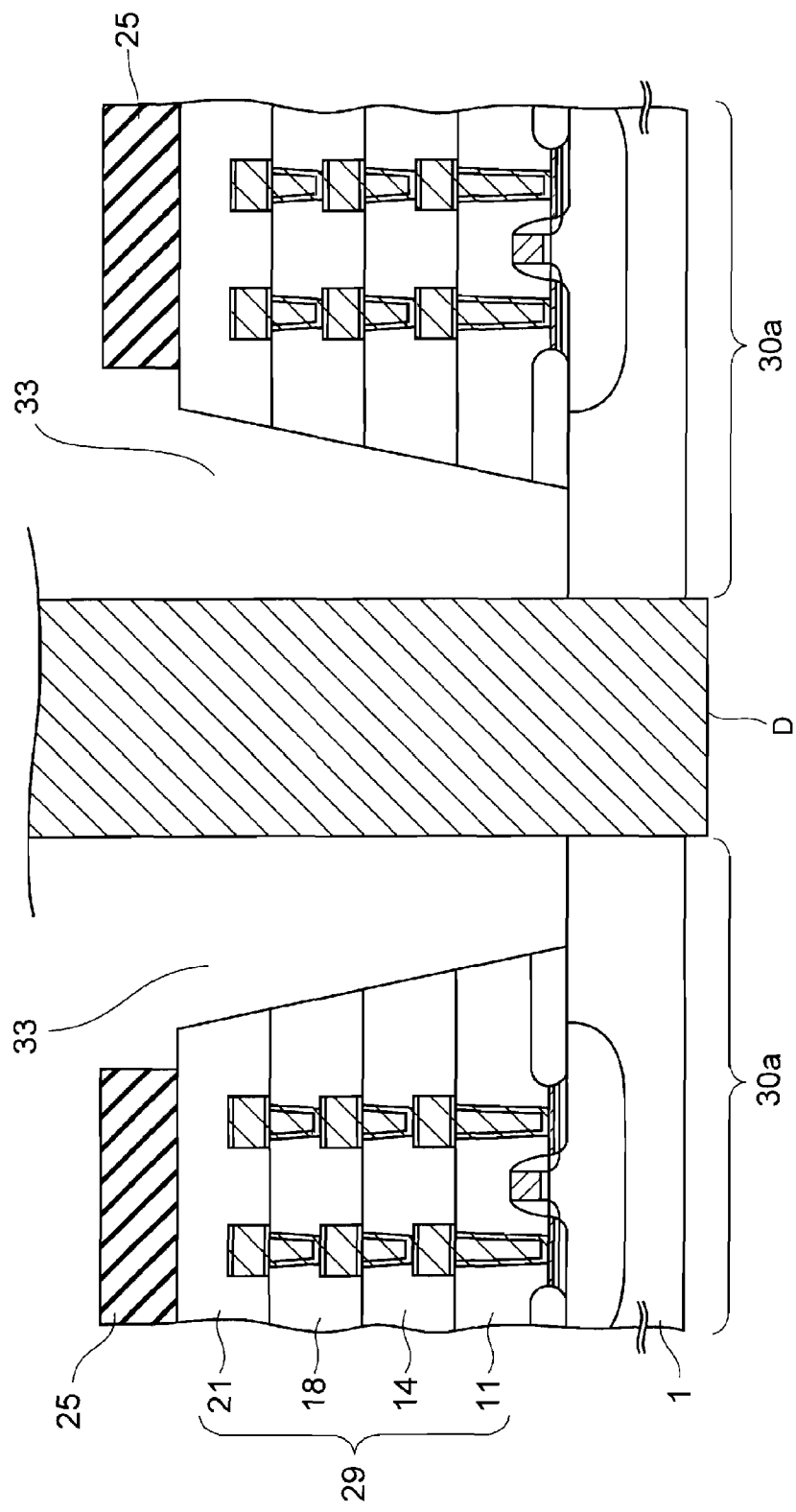

Subsequently, as illustrated in FIG. 18D, a dicing blade D is pressed onto the silicon substrate so as to overlap each of the above-described two grooves 33, and the silicon substrate 1 is divided into individual semiconductor elements 30a.

Here, since the variation in the width $W_t$ of each groove 33 is suppressed as described above, it is possible to reduce the risk such that the dicing blade D contacts the multilayer film 29 on the lateral surfaces of each groove 33 in this step, and to prevent the chipping in the multilayer film 29 from occurring due to the contact with the dicing blade D.

Figure 18E:
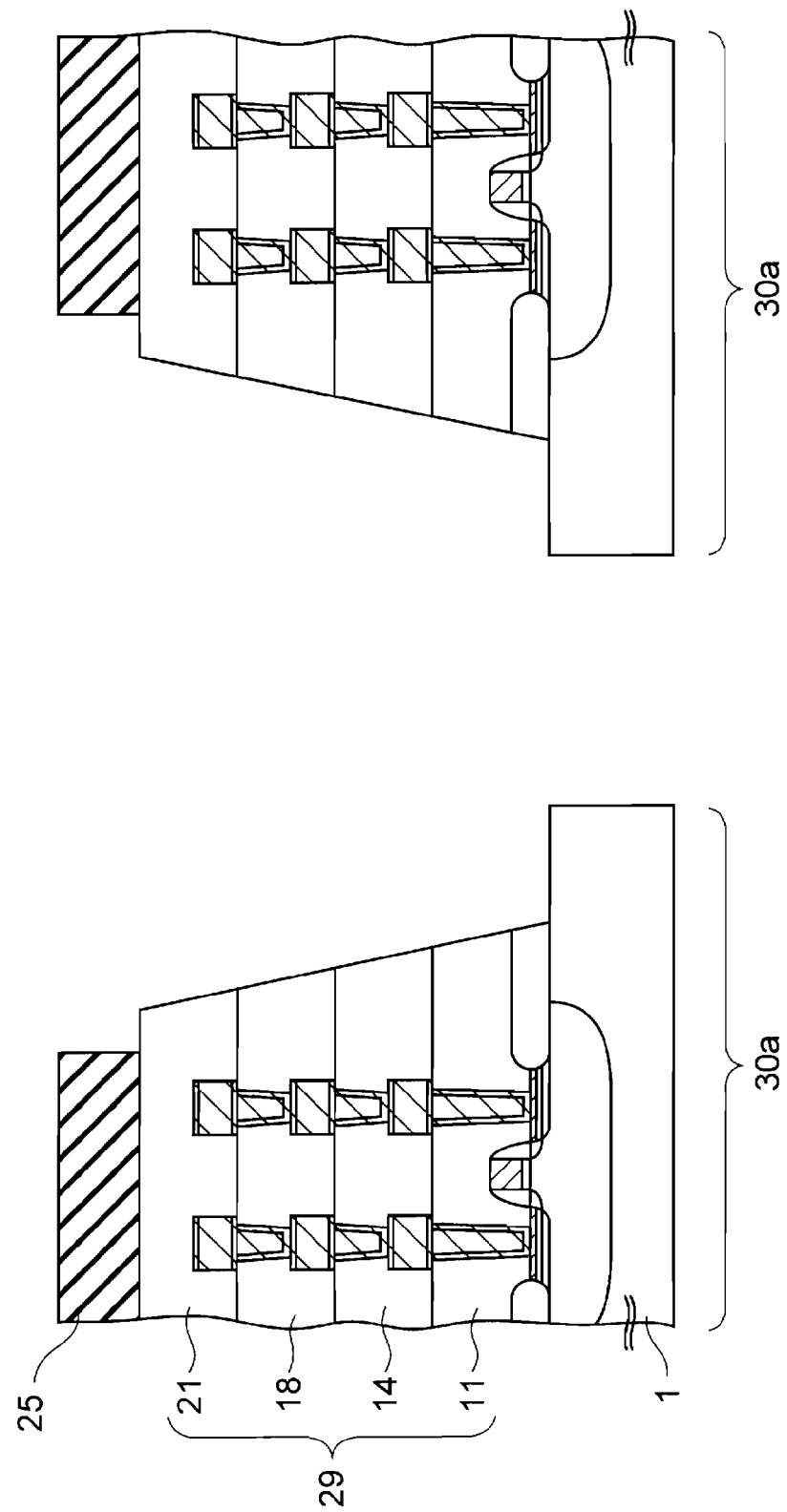
Figure 19D:
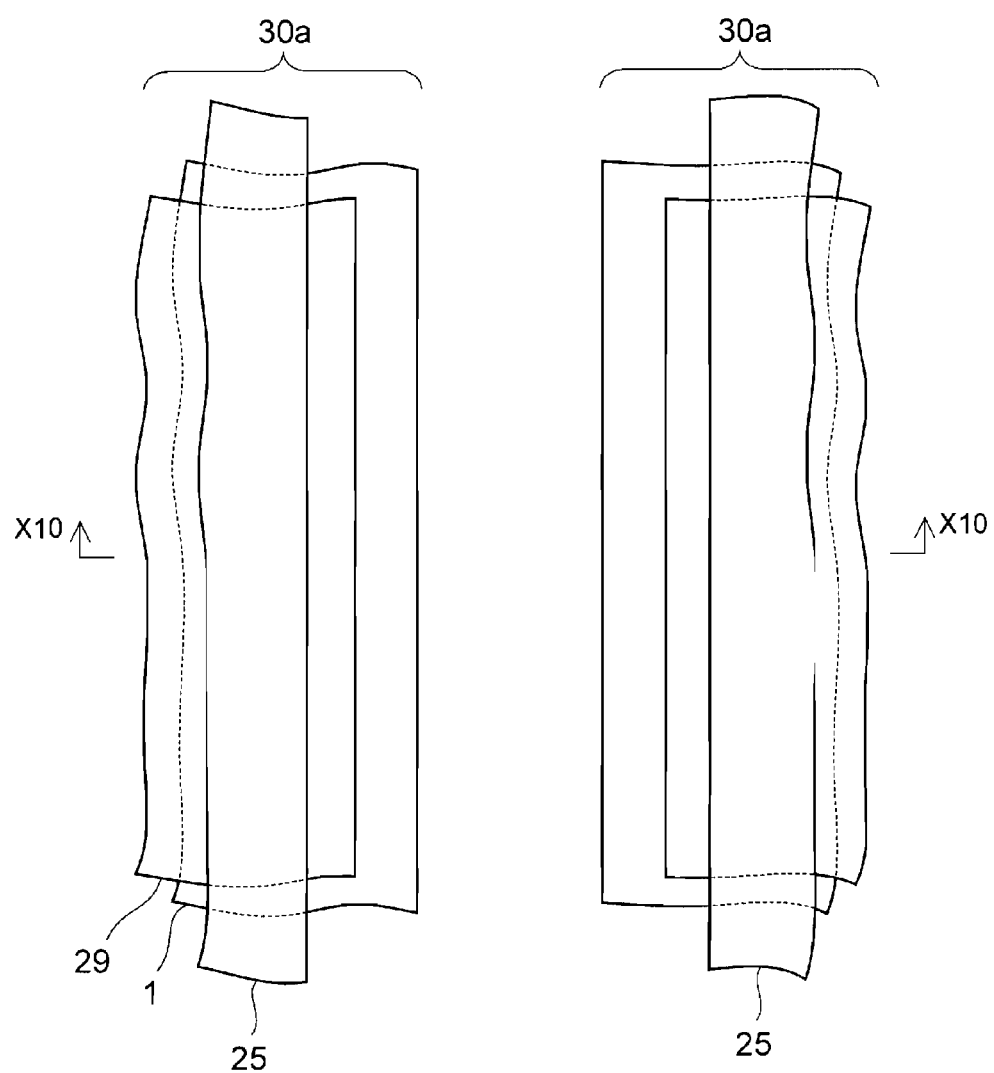

FIG. 18E is a cross-sectional view of the semiconductor elements 30a divided into pieces in such manner, and FIG. 18E mentioned above corresponds to a cross-sectional view taken along the line X10-X10 of FIG. 19D.

Thus, fundamental steps of the manufacturing process of a semiconductor device according to the eighth embodiment are completed.

According to the eighth embodiment, the two protection films 35 are formed in the scribe region $R_s$, and the laser grooving is performed by irradiating each protection film 35 with the laser beam L. This can lead to vaporizing the multilayer film 29 in a wider portion of the scribe region $R_s$ than in the case where only one protection film 35 is formed. Accordingly, the reduction effect of the protection films 35 on the variation in the spot diameter $D_s$ can be provided also to types of semiconductor devices whose scribe region $R_s$ has a large width.

Note that the eighth embodiment is not limited to the above-described configuration. The hydrophilic thin films 41 and the hydrophobic thin films 43 may be formed as illustrated in FIG. 20. The methods of forming these thin films 41 and 43 are the same as those in the second to fifth embodiments, therefore description thereof is omitted below.

Figure 21:
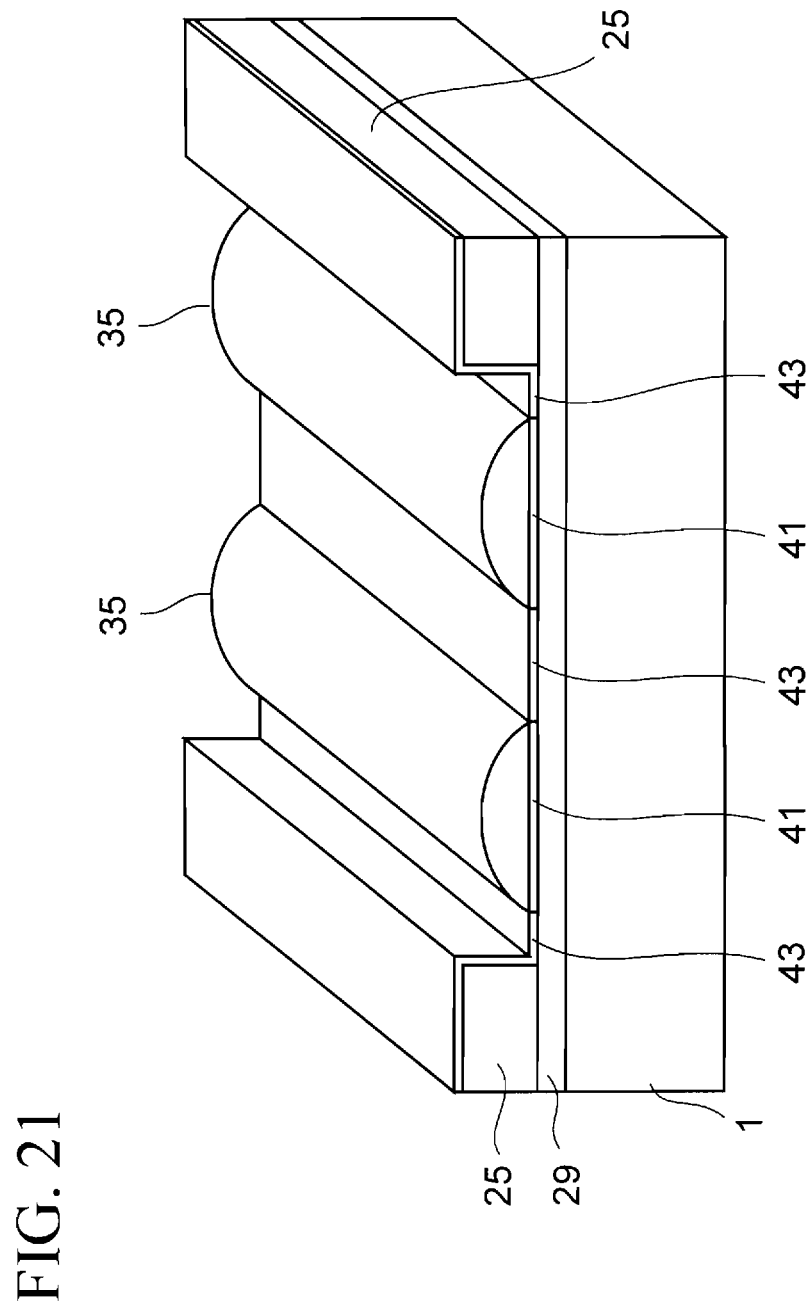
FIG. 21 is a perspective view of the semiconductor device in the course of manufacturing thereof according to the eighth embodiment, in which the hydrophilic thin films and the hydrophobic thin films are formed.

FIG. 21 is a perspective view in the course of manufacturing the semiconductor device according to the eighth embodiment, in the case where the hydrophilic thin films 41 and the hydrophobic thin films 43 are formed.

In this case, it is preferable that the hydrophilic thin film 41 be formed in each of regions where the two protection films 35 are formed, and the hydrophobic thin film 43 be formed in a region between these protection films 35. With this configuration, the liquid PVA as the material of each of the protection films 35 is repelled by the hydrophobic thin film 43 between the two protection films 35. Therefore, it is possible to apply PVA to form one of the protection films 35, and then apply PVA for forming the other one of the protection films 35 without thermally curing the one of the protection films 35, and to thermally cure the two protection films 35 simultaneously. This improves the operating efficiency.

Note that, when the hydrophobicity of the surface of the multilayer film 29 is sufficiently low, the two protection films 35 may be formed directly on the multilayer film 29 without forming the hydrophilic thin films 41.

Ninth Embodiment

In the first to eighth embodiments, PVA is applied onto the semiconductor substrate 30 to form the protection film 35. In the ninth embodiment, description will be given of a method for manufacturing a semiconductor device useful for application of PVA.

Figure 22A:
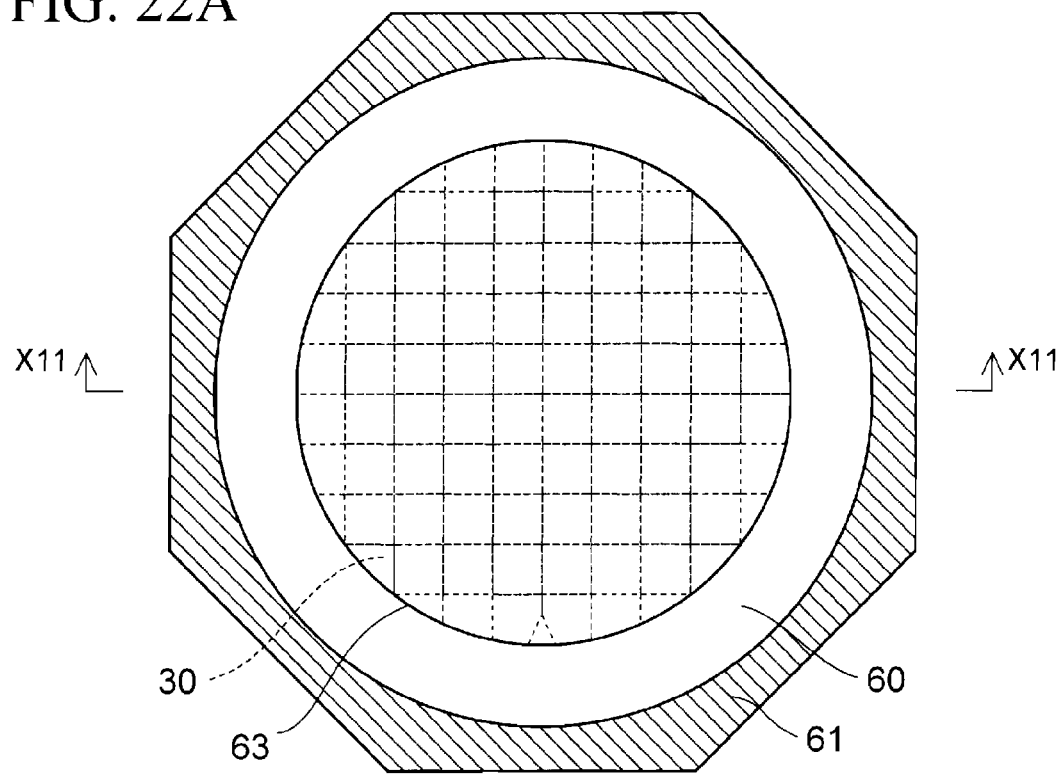
FIG. 22A is an overall plan view of a semiconductor device in the course of manufacturing thereof according to a ninth embodiment.
Figure 22B:
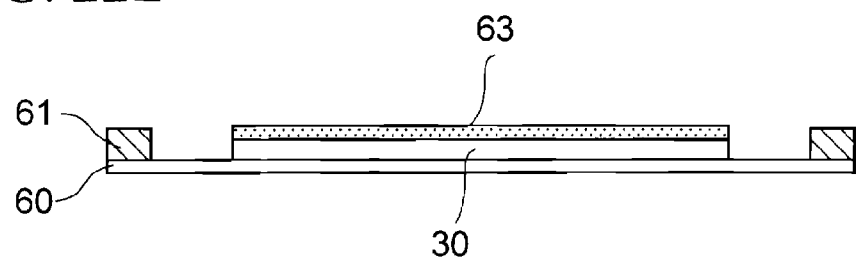
FIG. 22B is a cross-sectional view taken along the line X11-X11 of FIG. 22A.
Figure 23A:
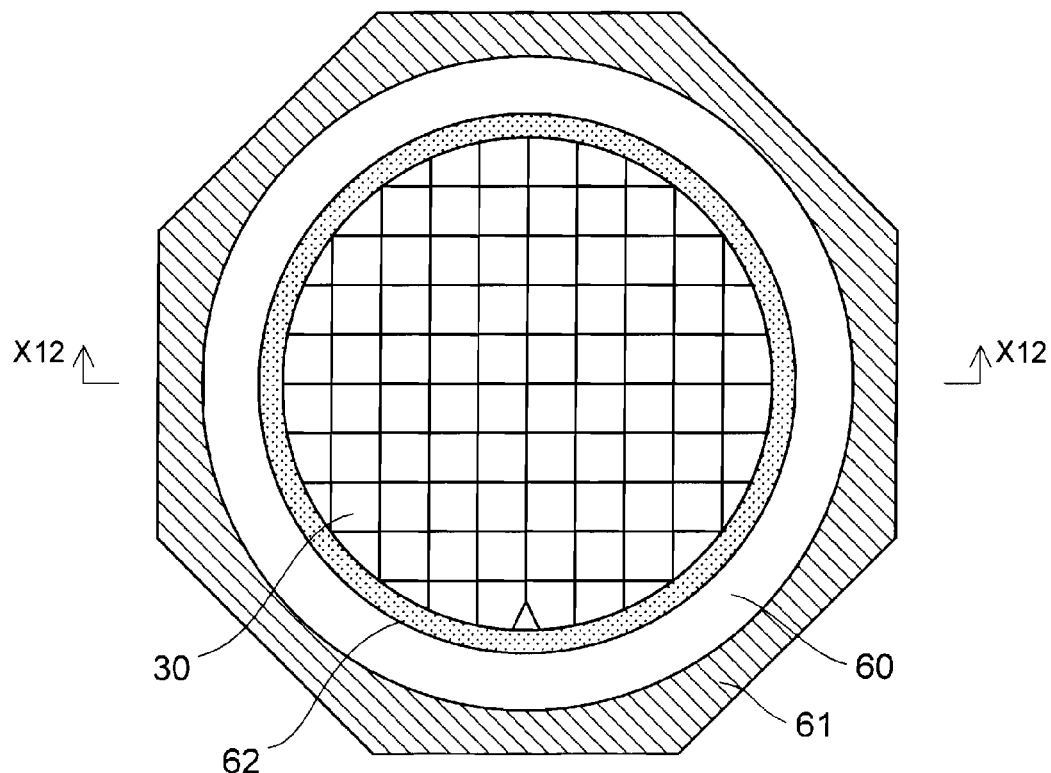
FIG. 23A is an overall plan view of the semiconductor device in the course of manufacturing thereof according to the ninth embodiment.

FIGS. 22A and 23A are overall plan views of semiconductor devices in the course of manufacturing thereof according to the ninth embodiment. FIG. 22B is a cross-sectional view taken along the line X11-X11 of FIG. 22A, and FIG. 23B is a cross-sectional view taken along the line X12-X12 of FIG. 23A.

First, as illustrated in FIGS. 22A and 22B, the semiconductor substrate 30 which has been subjected to back grinding is prepared. Onto a circuit formation surface of both the major surfaces of the semiconductor substrate 30, pasted is a protection tape 63 for protecting circuits on the semiconductor substrate 30 from being damaged during the back grinding.

Then, the back surface of the semiconductor substrate 30 is pasted onto an adhesive surface of a dicing tape 60. Note that a wafer ring 61 made of a stainless steel is also pasted onto the periphery of the dicing tape 60 in order to facilitate the handling of the semiconductor substrate 30.

Figure 23B:
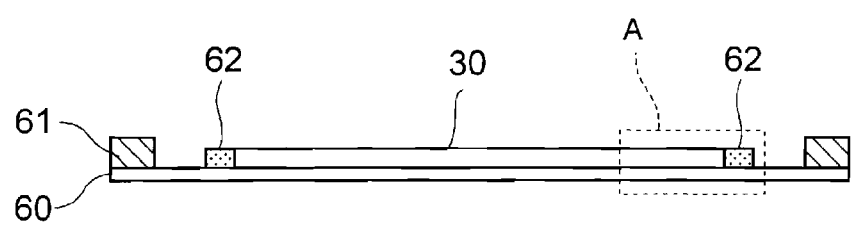
FIG. 23B is a cross-sectional view taken along the line X12-X12 of FIG. 23A.

Subsequently, as illustrated in FIGS. 23A and 23B, the protection tape 63 is peeled from the surface of the semiconductor substrate 30.

Then, a ring-shaped dam 62 encompassing the semiconductor substrate 30 is pasted onto an adhesive surface of the dicing tape 60. A material of the dam 62 is not particularly limited, and a metal such as stainless steel or the like, or a resin such as a fluororesin or the like may be used as the material of the dam 62.

Steps after this will be described by referring to an enlarged view of a region A of FIG. 23B.

Figure 24:
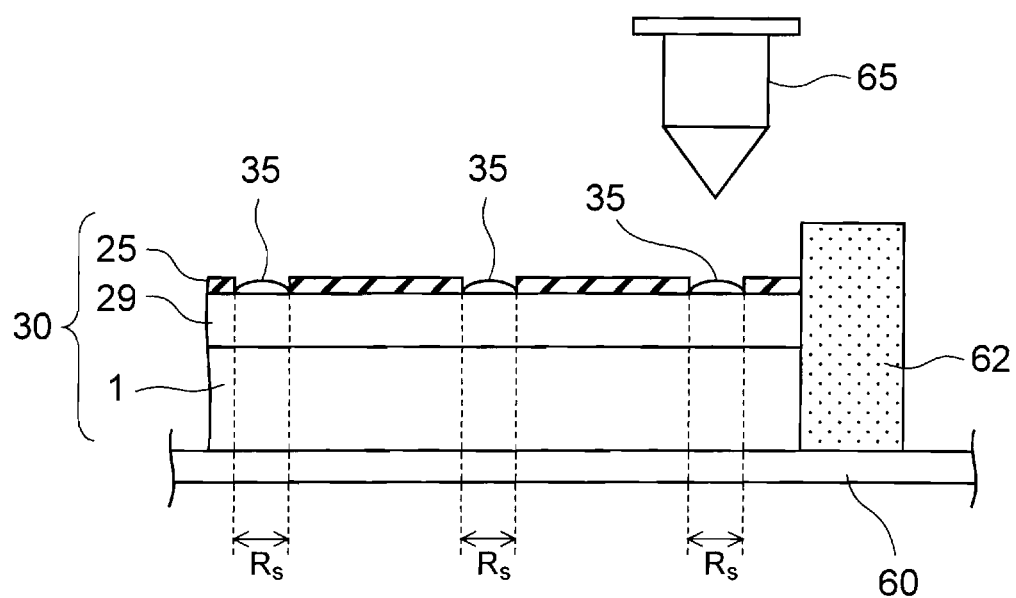
FIG. 24 is an enlarged cross-sectional view of a region A of a semiconductor substrate in FIG. 23B according to the ninth embodiment.

FIG. 24 is an enlarged cross-sectional view of the region A in FIG. 23B of the semiconductor substrate 30.

As illustrated in FIG. 24, the height of the dam 62 is larger than the thickness of the semiconductor substrate 30. In addition, it is preferable that the inner diameter of the ring-shaped dam 62 be made equal to or slightly larger than the diameter of the semiconductor substrate 30, and an outer peripheral side surface of the semiconductor substrate 30 be covered with an inner wall of the dam 62.

Then, in this state, PVA is applied onto the semiconductor substrate 30 in the scribe region $R_s$ by using the dispenser 65.

In the ninth embodiment, by providing the dam 62 as described above, it is possible to prevent the uncured liquid PVA from overflowing from the scribe region $R_s$ to the outer periphery of the semiconductor substrate 30.

After that, the PVA is thermally cured under the same conditions as those in the first embodiment, and the protection film 35 shaped like a convex lens is formed in each scribe region $R_s$.

Figure 25:
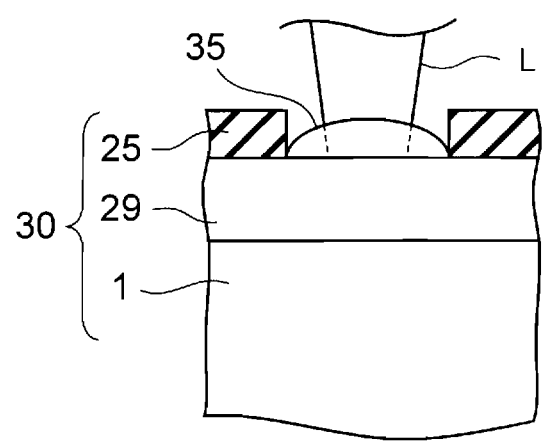
FIG. 25 is an enlarged cross-sectional view of a protection film and the vicinity thereof in the ninth embodiment.

FIG. 25 is an enlarged cross-sectional view of a protection film 25 and the vicinity thereof.

As illustrated in FIG. 25, after the protection film 35 is formed, the protection film 35 is irradiated with the laser beam L as in the case of the first embodiment to carry out the laser grooving on the multilayer film 29.

Figure 26:
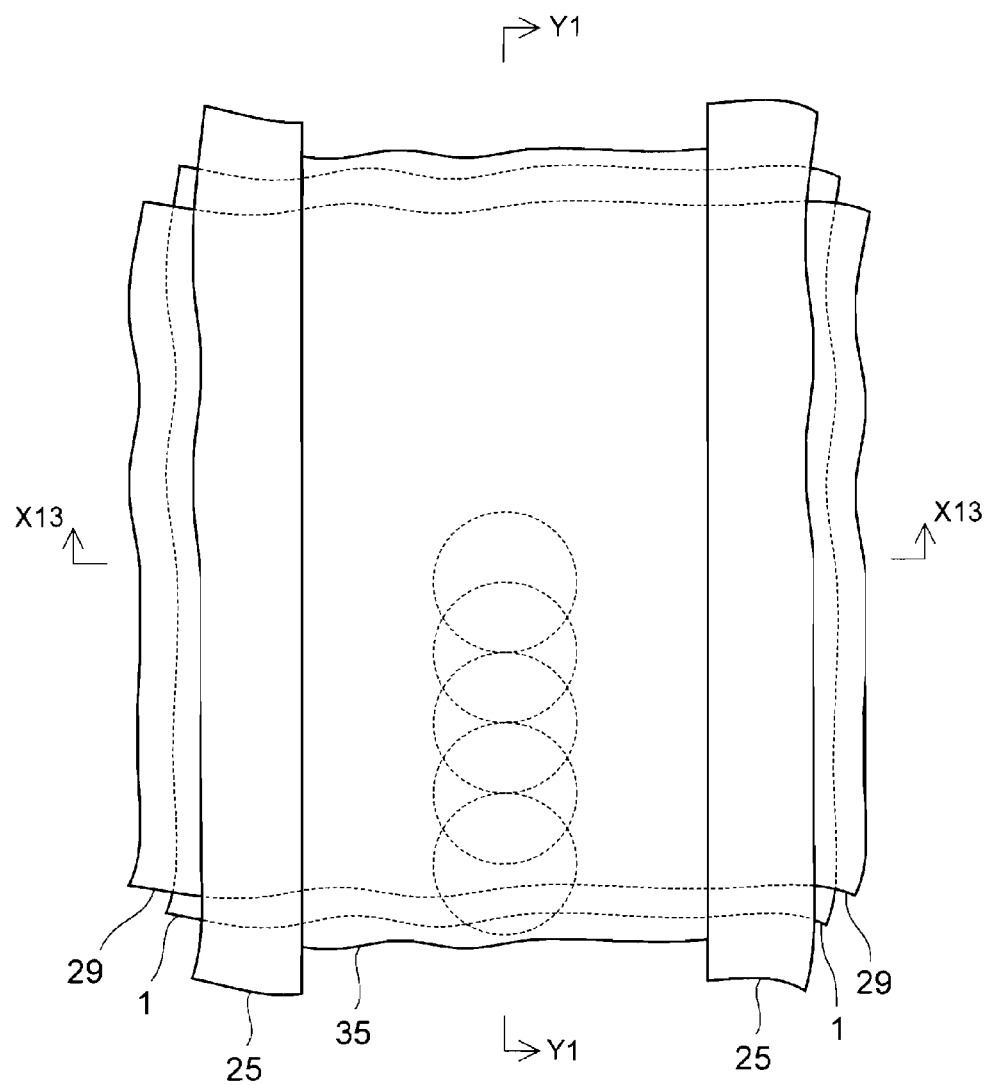
FIG. 26 is an enlarged plan view of the semiconductor substrate during irradiation with laser in the ninth embodiment.

FIG. 26 is an enlarged plan view of the semiconductor substrate 30 during being irradiated with the laser beam L.

As illustrated in FIG. 26, the laser beam L is applied in the form of spots to arrange in the extending direction D of the scribe region $R_s$.

Figure 27:
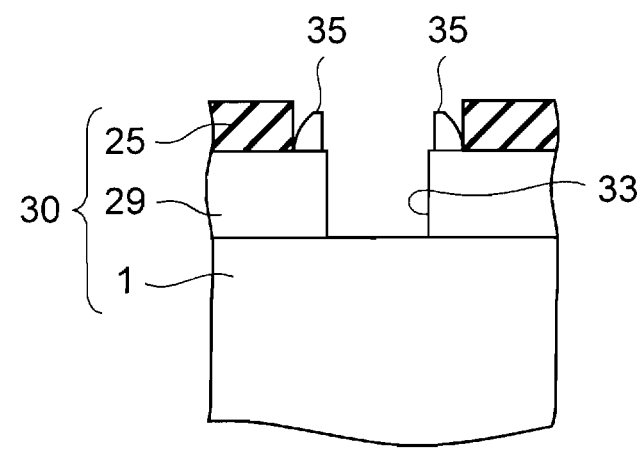
FIG. 27 is a cross-sectional view taken along the line X13-X13 of FIG. 26 after the irradiation with laser.

FIG. 27 is a cross-sectional view taken along the line X13-X13 of FIG. 26 after the irradiation with the laser beam L.

Figure 28:
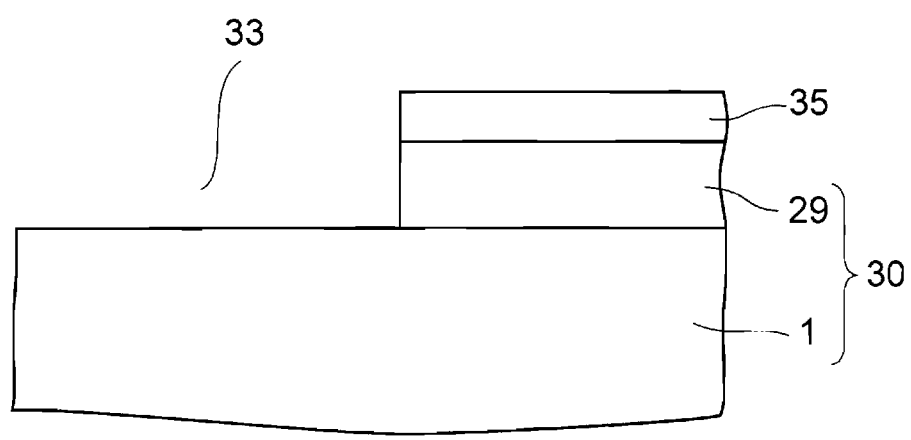
FIG. 28 is a cross-sectional view taken along the line Y1-Y1 of FIG. 26 after the irradiation with laser.

FIG. 28 is a cross-sectional view taken along the line Y1-Y1 of FIG. 26 after the irradiation with the laser beam L.

As illustrated in FIGS. 27 and 28, at a portion which is irradiated with the laser beam L, the protection film 35 and the underling multilayer film 29 are vaporized, and the groove 33 is formed in the multilayer film 29.

Figure 29:
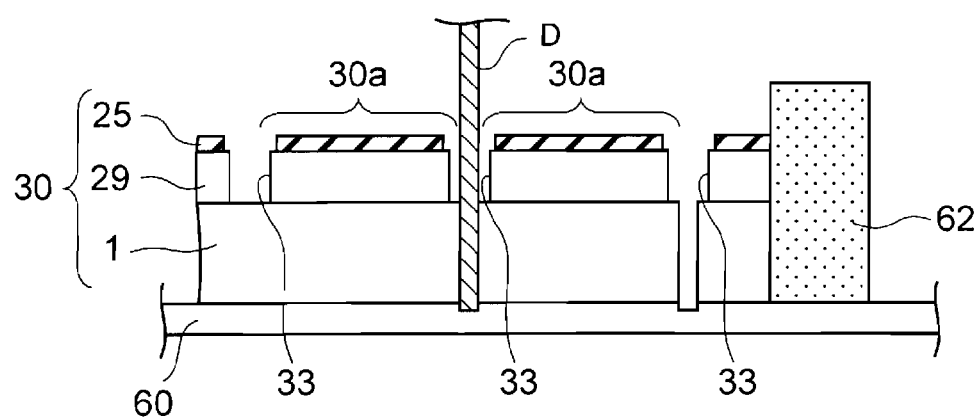
FIG. 29 is a cross-sectional view of the semiconductor substrate during dicing in the ninth embodiment.

Next, the silicon substrate 1 is diced along each groove 33 by using the dicing blade D as illustrated in FIG. 29 to thereby divide the semiconductor substrate 30 into individual semiconductor elements 30a. At this time, since the individual semiconductor elements 30a thus divided remain fixed on the dicing tape 60, the semiconductor elements 30a can be prevented from scattering.

Thus, fundamental steps of the ninth embodiment are completed.

According to the ninth embodiment described above, since the dam 62 is provided to the outer peripheral side surface of the semiconductor substrate 30 as described by referring to FIG. 24, the liquid PVA applied by the dispenser 65 can be prevented from flowing to the outer peripheral side surface of the semiconductor substrate 30.

Tenth Embodiment

In the first to ninth embodiments, the protection film 35 is formed by curing PVA.

In contrast, in the tenth embodiment, uncured PVA is used as the protection film 35.

Figure 30A:
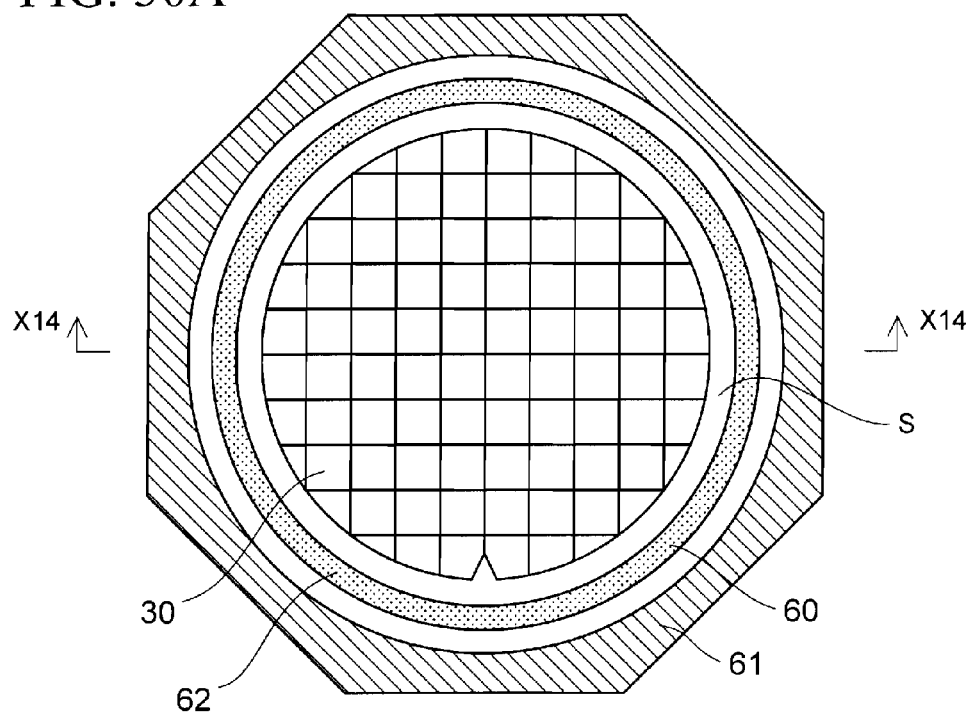
FIG. 30A is an overall plan view of a semiconductor device in the course of manufacturing thereof according to a tenth embodiment.
Figure 30B:
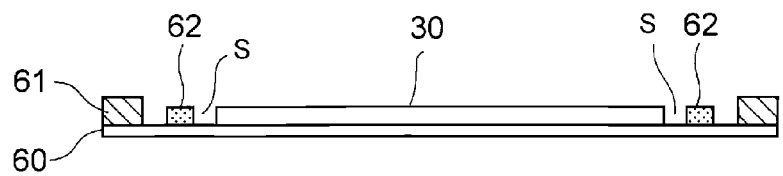
FIG. 30B is a cross-sectional view taken along the line X14-X14 of FIG. 30A.

FIG. 30A is an overall plan view of a semiconductor device in the course of manufacturing thereof according to the tenth embodiment. FIG. 30B is a cross-sectional view taken along the line X14-X14 of FIG. 30A. Note that, in FIGS. 30A and 30B, elements which are the same as those described in the first embodiment are denoted by the same reference numerals as those in the first embodiment, and description thereof is omitted below.

In the tenth embodiment, as illustrated in FIGS. 30A and 30B, the inner diameter of the ring-shaped dam 62 is made larger than the diameter of the semiconductor substrate 30, so that a space S is provided between the inner wall of the dam 62a and the outer peripheral side surface of the semiconductor substrate 30.

Figure 31:
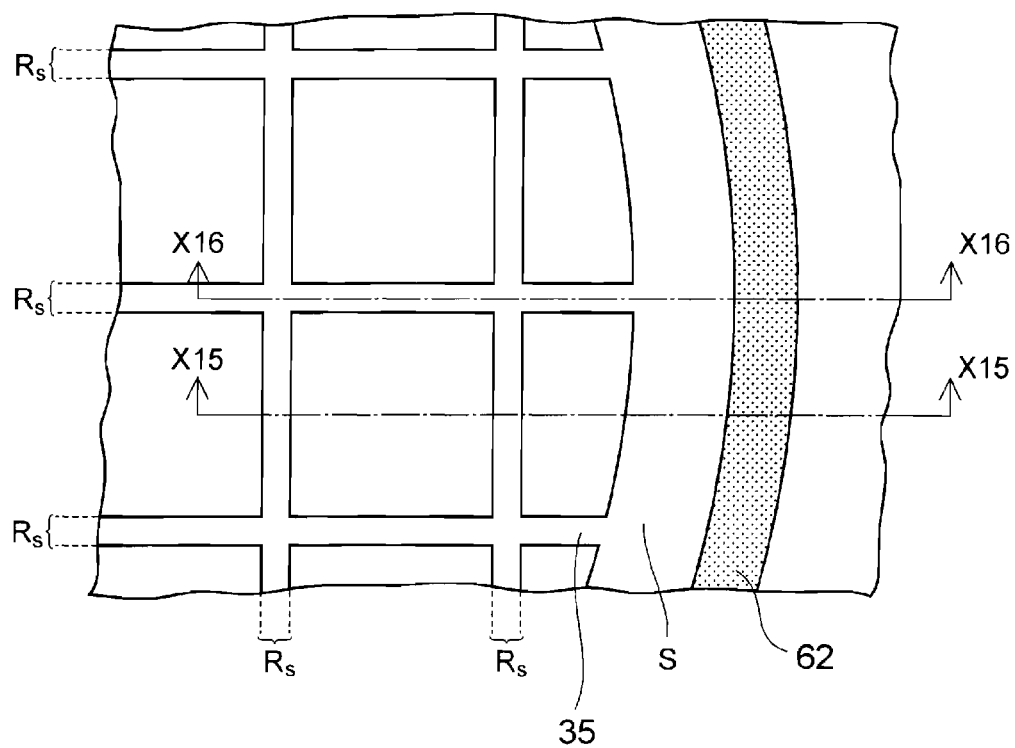
FIG. 31 is an enlarged plan view around the outer periphery of the semiconductor substrate in the tenth embodiment.

FIG. 31 is an enlarged plan view around the outer periphery of the semiconductor substrate 30.

The space S described above is filled with liquid PVA as the material of each protection film 35, and the PVA flows into each scribe region $R_s$ communicating with the space S.

Figure 32A:
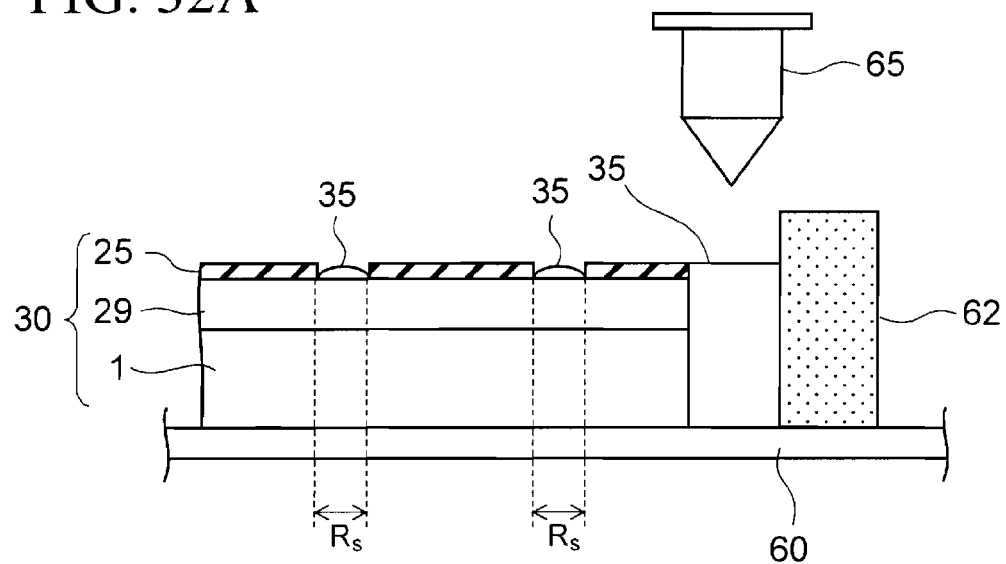
FIG. 32A is a cross-sectional view taken along the line X15-X15 of FIG. 31.
Figure 32B:
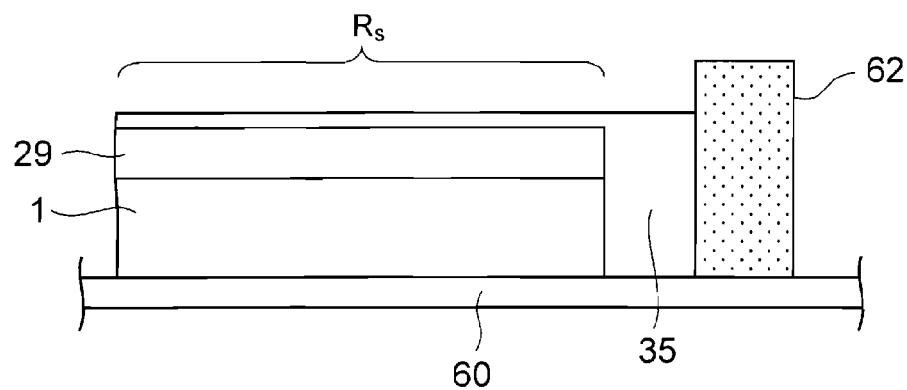
FIG. 32B is a cross-sectional view taken along the line X16-X16 of FIG. 31.

FIG. 32A is a cross-sectional view taken along the line X15-X15 of FIG. 31, and FIG. 32B is a cross-sectional view taken along the line X16-X16 of FIG. 31.

As illustrated in FIG. 32A, the dispenser 65 is used for application of PVA as the material of each protection film 35, and the top surface of each protection film 35 in liquid form is shaped like a convex lens because of the surface tension.

In addition, as illustrated in FIG. 32B, the protection film 35 is formed on the top surface of the multilayer film 29 in a portion of the scribe region $R_s$ having no passivation film 25.

In the tenth embodiment, without thermally curing the protection film 35 in liquid form, laser ablation is carried out as follows.

Figure 33:
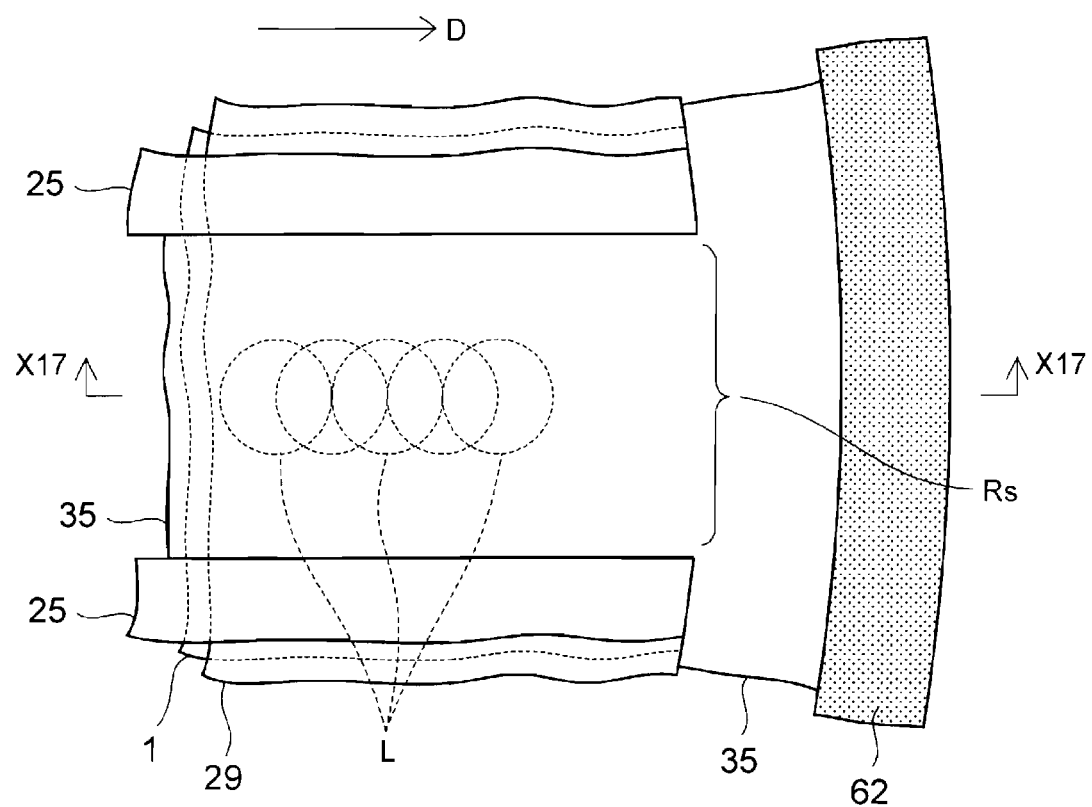
FIG. 33 is an enlarged plan view of a peripheral portion of a semiconductor substrate in the course of laser ablation in the tenth embodiment.

FIG. 33 is an enlarged plan view of a peripheral portion of the semiconductor substrate 30 in the course of the laser ablation.

For the laser ablation, as illustrated in FIG. 33, the laser beam L is applied in the form of spots to be arranged in the extending direction D of in the scribe region $R_s$ to vaporize the multilayer film 29 by the heat of the laser beam L.

Figure 34:
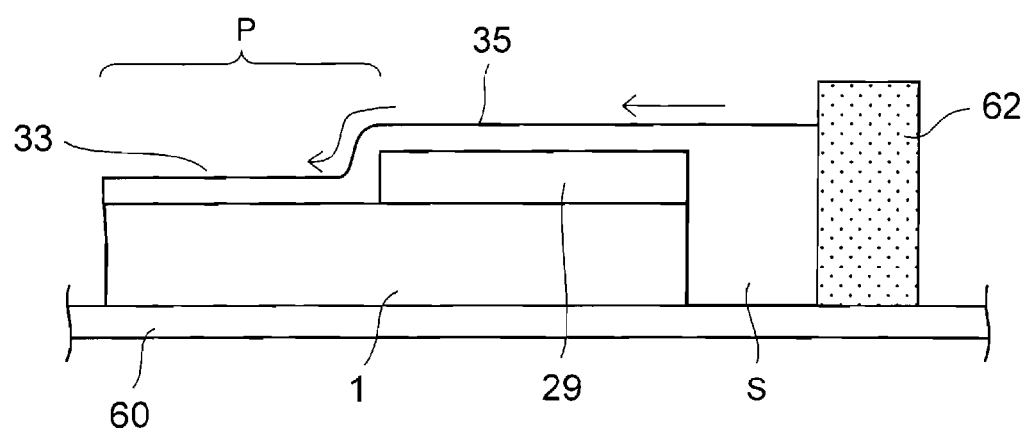
FIG. 34 is a cross-sectional view taken along the line X17-X17 of FIG. 33.

FIG. 34 is a cross-sectional view taken along the line X17-X17 of FIG. 33.

As illustrated in FIG. 34, the multilayer film 29 is removed in the portion P irradiated with the laser beam L to form the groove 33 therein. The protection film 35 in liquid form flows into the groove 33.

At this time, the space S between the outer peripheral side surface of the silicon substrate 1 and the inner wall of the dam 62 functions as a reservoir for the protection film 35, so that the protection film 35 in liquid form is supplied from the space S to the scribe region $R_s$ in a portion to be irradiated with the laser beam L.

As a result, the convex lens shape of the protection film 35 on the multilayer film 29 is maintained. Accordingly, it is possible to prevent the light condensing effect of the protection film 35 at the portion to be irradiated with the laser beam L from varying depending on its position.

Figure 35:
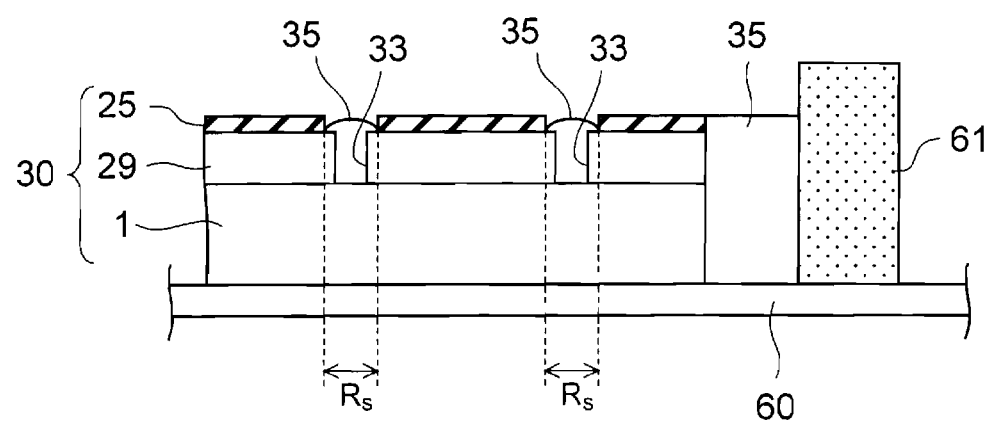
FIG. 35 is a cross-sectional view taken along the line X15-X15 of FIG. 31 after completion of the laser ablation.

FIG. 35 is a cross-sectional view taken along the line X15-X15 of FIG. 31 after completion of the laser ablation.

As illustrated in FIG. 35, even after the completion of the laser ablation, the protection film 35 is accumulated in the groove 33, and the top surface of the protection film 35 is shaped like a convex lens.

After this step, dicing is carried out as in the case of the ninth embodiment, and description thereof is omitted below.

Thus, fundamental steps of the manufacturing process of a semiconductor device according to the tenth embodiment are completed.

According to the tenth embodiment described above, the space S is used as a reservoir for the protection film 35 as illustrated in FIG. 34. Accordingly, PVA as the material of the protection film 35 can be always supplied onto the multilayer film 29 in the scribe region $R_s$, and the convex lens shape of the protection film 35 can be maintained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for manufacturing a semiconductor device, the method comprising:

forming at least one stripe-shaped protection film over a multilayer film in a scribe region of a semiconductor substrate having a plurality of semiconductor element regions formed therein, the protection film including a first portion which is located at a center of the protection film and a second portion which is located at an edge of the protection film, a thickness of the first portion being larger a thickness of the second portion, the protection film being made of a member which transmits a laser beam, and an upper surface of the first portion being higher than an upper surface of the second portion from the semiconductor substrate; and removing the multilayer film in the scribe region by irradiating the protection film with a laser beam.

2. The method for manufacturing a semiconductor device according to claim 1, wherein the at least one stripe-shaped protection film is formed of two stripe-shaped protection films which are formed so as to extend in parallel to each other over the multilayer film in the scribe region, and the multilayer film in the scribe region is removed by irradiating each of the two protection films with a laser beam.

3. The method for manufacturing a semiconductor device according to claim 1, wherein
in the removing of the multilayer film in the scribe region by irradiating the protection film with a laser beam, the laser beam is applied in a form of spots to be arranged at predetermined intervals in an extending direction of the protection film.

4. The method for manufacturing a semiconductor device according to claim 1, the method further comprising
cutting the scribe region with a dicing blade to divide the semiconductor substrate into individual semiconductor elements.

5. The method for manufacturing a semiconductor device according to claim 1, wherein
in the forming of the protection film, the protection film is formed by applying the member in the scribe region by use of a dispenser.

6. The method for manufacturing a semiconductor device according to claim 5, wherein
before the member is applied, an outer peripheral side surface of the semiconductor substrate is covered with a dam having a height greater than a thickness of the semiconductor substrate.

7. The method for manufacturing a semiconductor device according to claim 1, wherein
in the forming of the protection film, the protection film is formed by
providing a dam at a side of the semiconductor substrate,
accumulating the member between the dam and an outer peripheral side surface of the semiconductor substrate, and
allowing the member to flow into the scribe region.

8. The method for manufacturing a semiconductor device according to claim 5, the method further comprising before the forming of the protection film, applying a fluorine-based coating treatment or a surface roughening treatment in a region other than the scribe region.

9. The method for manufacturing a semiconductor device according to claim 8, the method further comprising
before the forming of the protection film, forming, in the scribe region, a film having a lower hydrophobicity than the fluorine-based coating.

10. The method for manufacturing a semiconductor device according to claim 5, the method further comprising
before the forming of the protection film, forming an aluminum film in a region other than the scribe region, followed by anodizing a surface of the aluminum film.

11. The method for manufacturing a semiconductor device according to claim 5, wherein
before the forming of the protection film, the scribe region is selectively irradiated with a plasma to thereby make a hydrophobicity in the scribe region lower than that before the irradiation with the plasma.

12. The method for manufacturing a semiconductor device according to claim 5, the method further comprising, before the forming of the protection film:
forming a passivation film provided with a window in the scribe region; and
heating and thus softening the passivation film to thereby cause lateral surfaces of the window to sag and thus incline, wherein
in the forming of the protection film, a liquid material of the protection film is applied into the window.

13. The method for manufacturing a semiconductor device according to claim 1, wherein a shape of the protection film in cross section is a convex lens shape.

14. The method for manufacturing a semiconductor device according to claim 1, further comprising:
forming a passivation film on the multilayer film before forming the protection film, the passivation film including an opening which exposes a surface of the multilayer film in the scribe region,
wherein the protection film is formed in the opening.

* * * * *